United States Patent
Nishimura

(10) Patent No.: US 8,198,728 B2
(45) Date of Patent: Jun. 12, 2012

(54) SEMICONDUCTOR DEVICE AND PLURAL SEMICONDUCTOR ELEMENTS WITH SUPPRESSED BENDING

(75) Inventor: Takao Nishimura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 86 days.

(21) Appl. No.: 12/195,653

(22) Filed: Aug. 21, 2008

(65) Prior Publication Data

US 2009/0057891 A1 Mar. 5, 2009

(30) Foreign Application Priority Data

Aug. 27, 2007 (JP) ................................ 2007-219278

(51) Int. Cl.
- *H01L 23/48* (2006.01)
- *H01L 23/52* (2006.01)
- *H01L 29/40* (2006.01)
- *H01L 23/02* (2006.01)
- *H01L 23/34* (2006.01)

(52) U.S. Cl. ........ 257/737; 257/678; 257/686; 257/777; 257/780; 257/784; 257/E23.068

(58) Field of Classification Search .................. 257/686, 257/777, 678, 723, 724, 780, 781, 784, 737, 257/738, 778, E23.021, E23.033, E23.068
See application file for complete search history.

(56) References Cited

U.S. PATENT DOCUMENTS

| | | | |
|---|---|---|---|
| 6,258,626 B1 * | 7/2001 | Wang et al. | 438/107 |
| 6,339,254 B1 * | 1/2002 | Venkateshwaran et al. | 257/686 |
| 6,621,156 B2 * | 9/2003 | Kimura | 257/686 |
| 6,998,292 B2 * | 2/2006 | McDonough et al. | 438/107 |
| 7,002,255 B2 * | 2/2006 | Wang | 257/777 |
| 7,161,249 B2 | 1/2007 | Shim et al. | |
| 7,166,924 B2 * | 1/2007 | Lu et al. | 257/777 |
| 7,256,501 B2 * | 8/2007 | Okamoto et al. | 257/772 |
| 7,285,864 B2 | 10/2007 | Takyu et al. | |
| 7,482,695 B2 | 1/2009 | Takyu et al. | |
| 7,906,852 B2 * | 3/2011 | Nishimura et al. | 257/777 |
| 2002/0171136 A1 * | 11/2002 | Hiraoka et al. | 257/684 |
| 2003/0045029 A1 | 3/2003 | Emoto | |
| 2003/0057539 A1 * | 3/2003 | Koopmans | 257/686 |
| 2003/0228084 A1 * | 12/2003 | Kanda et al. | 385/14 |

(Continued)

FOREIGN PATENT DOCUMENTS

CN 1655353 A 8/2005

(Continued)

OTHER PUBLICATIONS

Chinese Office Action dated Dec. 18, 2009, issued in corresponding Chinese Application No. 2008102126441.

(Continued)

*Primary Examiner* — Teresa M Arroyo
(74) *Attorney, Agent, or Firm* — Westerman, Hattori, Daniels & Adrian, LLP

(57) ABSTRACT

A semiconductor device includes a supporting base whereupon an electrode terminal is placed; an intermediate member mounted on said supporting base; a semiconductor element, a portion thereof being supported with said intermediate member, and placed on said supporting base; and a convex-shaped member which corresponds to the electrode terminal of said semiconductor element and placed on said supporting base or said intermediate member; wherein the electrode terminal of said semiconductor element and the electrode terminal of said supporting base are connected with a bonding wire.

7 Claims, 31 Drawing Sheets

U.S. PATENT DOCUMENTS

| | | | |
|---|---|---|---|
| 2004/0063247 A1 | 4/2004 | Emoto | |
| 2004/0124539 A1* | 7/2004 | Yang et al. | 257/777 |
| 2004/0164385 A1* | 8/2004 | Kado et al. | 257/678 |
| 2004/0227223 A1* | 11/2004 | Sawamoto | 257/686 |
| 2004/0262774 A1* | 12/2004 | Kang et al. | 257/777 |
| 2005/0045378 A1* | 3/2005 | Heng et al. | 174/260 |
| 2005/0156323 A1* | 7/2005 | Tokunaga | 257/778 |
| 2005/0179127 A1* | 8/2005 | Takyu et al. | 257/724 |
| 2005/0205982 A1* | 9/2005 | Kawano | 257/686 |
| 2006/0043559 A1* | 3/2006 | Chow et al. | 257/686 |
| 2006/0071317 A1* | 4/2006 | Kang et al. | 257/686 |
| 2007/0035004 A1* | 2/2007 | Konishi et al. | 257/686 |
| 2007/0075435 A1* | 4/2007 | Suminoe et al. | 257/777 |
| 2007/0096282 A1* | 5/2007 | Shim et al. | 257/686 |
| 2007/0152313 A1* | 7/2007 | Periaman et al. | 257/686 |
| 2007/0181990 A1* | 8/2007 | Huang et al. | 257/686 |
| 2007/0194424 A1* | 8/2007 | Camacho et al. | 257/686 |

FOREIGN PATENT DOCUMENTS

| | | |
|---|---|---|
| JP | 2001-320014 A | 11/2001 |
| JP | 2005-197491 A | 7/2005 |
| KR | 10-2003-0018204 A | 3/2003 |
| KR | 10-2006-0029925 A | 4/2006 |
| KR | 10-2007-0019798 A | 2/2007 |

OTHER PUBLICATIONS

Korean Office Action dated Aug. 16, 2010, issued in corresponding Korean Patent Application No. 10-2008-0083747.

Korean Office Action dated Feb. 24, 2011, issued in corresponding Korean Patent Application No. 10-2008-0083747.

Chinese Office Action Dated Mar. 22, 2011, issued in corresponding Chinese Patent Application No. 200810212644.1.

* cited by examiner

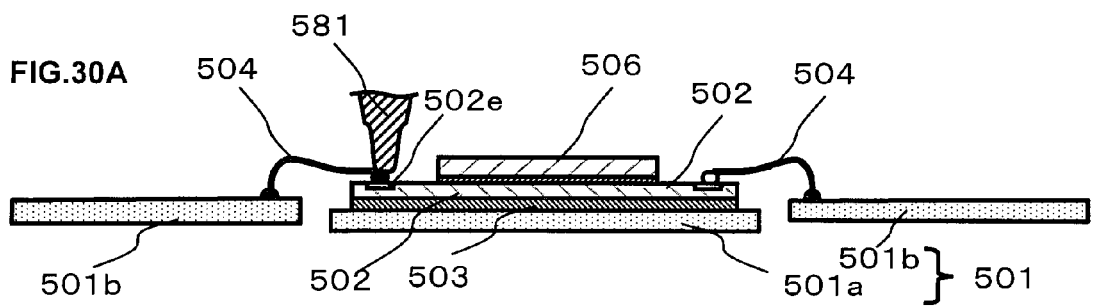
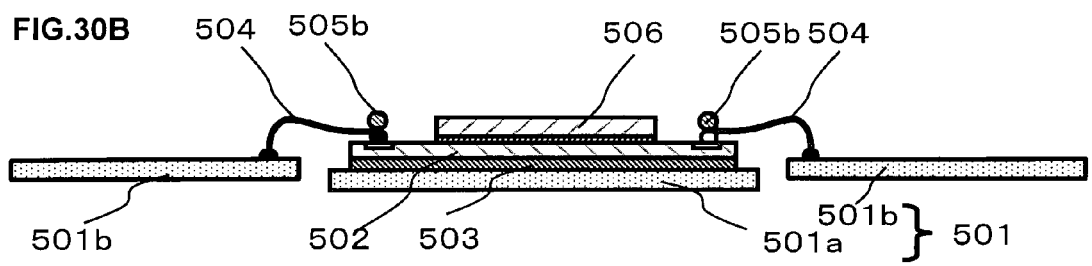
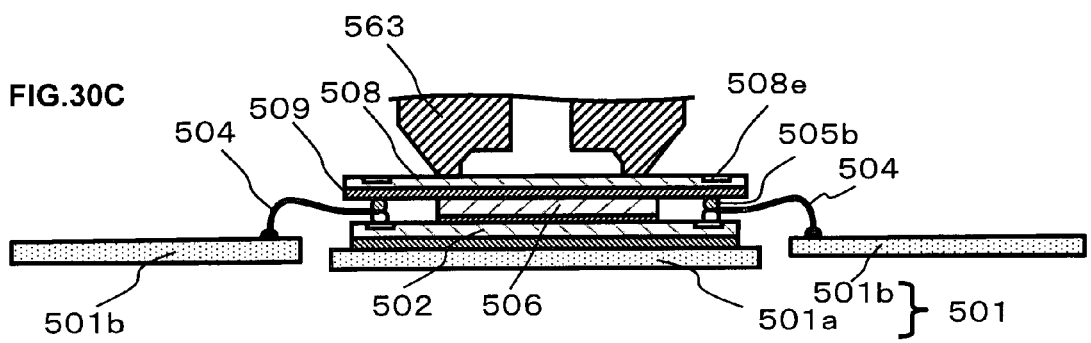
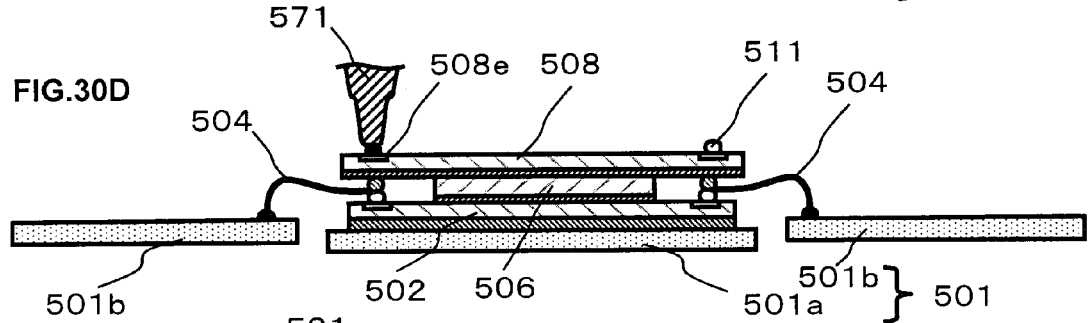
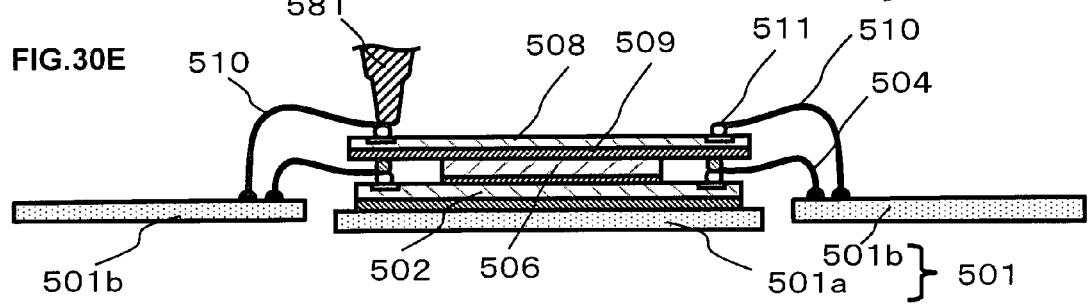

SEMICONDUCTOR DEVICE AND PLURAL SEMICONDUCTOR ELEMENTS WITH SUPPRESSED BENDING

CROSS REFERENCE TO RELATED APPLICATIONS

This application is based upon and claims the benefit of priority from the prior Japanese Patent Application No. 2007-219278 filed on Aug. 27, 2007, the entire contents of which are incorporated herein by reference.

BACKGROUND

1. Technical Field

The embodiments relate to a semiconductor device including plural semiconductor elements and a manufacturing method thereof.

2. Description of the related art

As electronic equipment has increased in functionality and decreased in size, semiconductor devices such as the semiconductor integrated circuit device installed in such electronic equipment are also desired to have higher functionality, higher operating speed, and further, smaller size and lighter weight.

Therefore, with the semiconductor device, plural semiconductor elements are mounted so as to be layered on a supporting base (supporting board) such as a circuit board.

Thus, a configuration having plural semiconductor elements may occur to make semiconductor device having desired function by combining a logic function element such as a microprocessor and a semiconductor storage element such as non-volatile memory.

In such a case, the circuit function and circuit size of the logic function element and semiconductor storage element are completely different, whereby the external dimensions thereof generally differ.

Also, the semiconductor elements normally have a rectangular planar shape.

Accordingly, in a layered state, there may be cases wherein at least one edge of a semiconductor element positioned on the upper side extends (protrudes) in wing form to the outer side of a semiconductor element positioned on the lower side (supporting base side).

The connection with the supporting base is used for connecting the supporting base to electrode terminals of the semiconductor elements, and connecting the supporting base to the electronic equipment. There may be a case wherein a disposal configuration of connection with the supporting base cause the leading direction and/or leading locations of the bonding wire led from the plural semiconductor elements to be restricted.

In such a case, the layered semiconductor elements are layered in a direction whereby the center lines thereof intersect in different directions (rotationally disposed), and freedom of the lead such as the bonding wire from the electrode terminals of the semiconductor elements can be increased.

At this time, there may be cases wherein both edges or at least one edge of the semiconductor elements placed on the upper side, extend (protrude) in wing form in a different direction from the electrode terminal placing unit (placing edge) of the semiconductor element placed on the lower side (supporting base side).

Note that modes of mounting the semiconductor element onto the supporting base may include a mode for mounting on the supporting base with a so-called flip-chip (face-down) mode, or a mode for mounting on the supporting base in a face-up state whereby the electrode terminal pads are connected to the electrode terminals on the supporting base with a wire bonding method.

These mounting modes are appropriately selected and combined to mount the plural semiconductor elements in a layered manner on the supporting base, but as described above, a state wherein a portion of the semiconductor element positioned on the upper side is extended (protruded) in wing form on the outer side of the semiconductor element positioned on the lower side (supporting base side) so as to extend past the edge portion of the semiconductor element positioned on the lower side may occur depending on the dimensional relation between the mutual semiconductor elements and/or the direction of mounting.

Further, in the event of placing plural semiconductor elements in a layered manner, there may be cases wherein a so-called spacer (gap holding member) is placed between the mutual semiconductor elements, and a space is provided between the semiconductor elements.

At this time, there may be cases wherein at least one edge of the semiconductor element positioned on the upper side extends (protrudes) in wing form past the spacer which is the supporting base.

Also, with the semiconductor device, even if a layered configuration of semiconductor elements is included as describe above, reducing the thickness (height) thereof is demanded.

On the other hand, various demands continue to be made regarding the combination of layered semiconductor elements as well.

Therefore, reducing the thickness of the semiconductor elements is also necessary.

In the case that semiconductor elements thus having the thickness thereof reduced are employed in the event of configuring the layered configuration and the semiconductor elements are positioned on the upper side, as described above, the electrode terminal units on the semiconductor elements positioned on the upper side can result in being positioned in such an extended portion.

In such a case, if wire bonding is attempted to the electrode terminal of the semiconductor element positioned on the upper side, the extended portion of the semiconductor element warps (bends toward the bottom side, supporting base side), and since sufficient pressure is not applied, normal wire bonding is not performed.

Also, if a greater pressure is applied, there may be cases wherein the extended portion of the semiconductor elements positioned on the upper side is damaged.

Thus, with a semiconductor element employing a configuration of layering semiconductor elements, in the event of performing wire bonding of the semiconductor element positioned on the upper side to the electrode terminal, in order to prevent deformity of the extended portion of the semiconductor elements, various proposals have been made.

A configuration has been proposed wherein a first semiconductor chip, and a second semiconductor chip which is larger than the first semiconductor chip and which is disposed in a layered manner on the first semiconductor chip, are disposed on a board, and a mount member is placed between the second semiconductor chip and the board (e.g. see Japanese Laid-open Patent Publication No. 2001-320014).

Also, a configuration has been proposed wherein a first semiconductor chip, and a second semiconductor chip which is larger than the first semiconductor chip and which is disposed in a layered manner on the first semiconductor chip, are disposed on a board, and plural column-shaped supporting units are placed between the second semiconductor chip and the board (e.g. see Japanese Laid-open Patent Publication No. 2005-197491).

SUMMARY OF THE INVENTION

According to one aspect of embodiments, a semiconductor device includes a supporting base, an intermediate member, a semiconductor element, and a convex-shaped member, whereby the electrode terminal of the semiconductor element and the electrode terminal on the supporting base are connected with a bonding wire.

BRIEF DESCRIPTION OF THE DRAWINGS

FIG. 1A illustrates a plan view of the semiconductor device;
FIG. 1B illustrates an X-X' cross-section of FIG. 1A;
FIG. 8A illustrates a plan view of the semiconductor device;
FIG. 8B illustrates an X-X' cross-section of FIG. 1A;
FIG. 9A illustrates a plan view of the semiconductor device;
FIG. 9B illustrates an X-X' cross-section of FIG. 9A.

FIG. 14A illustrates a plan view of the semiconductor device;
FIG. 14B illustrates an X-X' cross-section of FIG. 14A;
FIG. 19A illustrates a plan view of the semiconductor device;
FIG. 19B illustrates an X-X' cross-section of FIG. 19A;
FIG. 19C illustrates an X-X' cross-section of FIG. 19A;
FIG. 20A illustrates a plan view of the semiconductor device;
FIG. 20B illustrates an X-X' cross-section of FIG. 20A;
FIG. 20C illustrates an X-X' cross-section of FIG. 20A;
FIG. 21B illustrates an X-X' cross-section of FIG. 21A;
FIG. 21C illustrates an X-X' cross-section of FIG. 21A;
FIG. 22A illustrates a plan view of the semiconductor device;
FIG. 22B illustrates an X-X' cross-section of FIG. 22A;
FIG. 23A illustrates a plan view of the semiconductor device;
FIG. 23B illustrates an X-X' cross-section of FIG. 23A;
FIG. 24A illustrates a plan view of the semiconductor device;
FIG. 24B illustrates an X-X' cross-section of FIG. 24A;
FIG. 25A illustrates a plan view of the semiconductor device;
FIG. 25B illustrates an X-X' cross-section of FIG. 25A.

FIG. 26A illustrates a plan view of the semiconductor device;

FIG. 26B illustrates an X-X' cross-section of FIG. 26A;

FIG. 27A illustrates a plan view of the semiconductor device;

FIG. 27B illustrates a cross-section thereof;

FIG. 28A illustrates a plan view of the semiconductor device;

FIG. 28B illustrates a cross-section thereof;

FIGS. 30A to 30E are a cross-sectional diagram illustrating a manufacturing process of the semiconductor device according to the fifth embodiment, and illustrates a manufacturing process which follows the manufacturing process illustrated in FIGS. 29A to 29E.

DESCRIPTION OF THE PREFERRED EMBODIMENTS

Embodiments of a semiconductor device will be described in detail below, along with the manufacturing method thereof. The semiconductor device according includes multiple embodiments, as described below.

(First Embodiment)

A first embodiment of the semiconductor device accord will be described with reference to FIGS. 1A through 9B.

The semiconductor device according to the present embodiment comprises a first semiconductor element which is mounted on a wiring board serving as a supporting base in a face-up state, with an external connection electrode terminal of the first semiconductor element being connected to an electrode terminal on the wiring board with a wire bonding method; and a second semiconductor element which is mounted on the first semiconductor element in a face-up state, with an external connection electrode terminal of the second semiconductor element being connected to an electrode terminal on the wiring board with a wire bonding method.

Figure 1A:
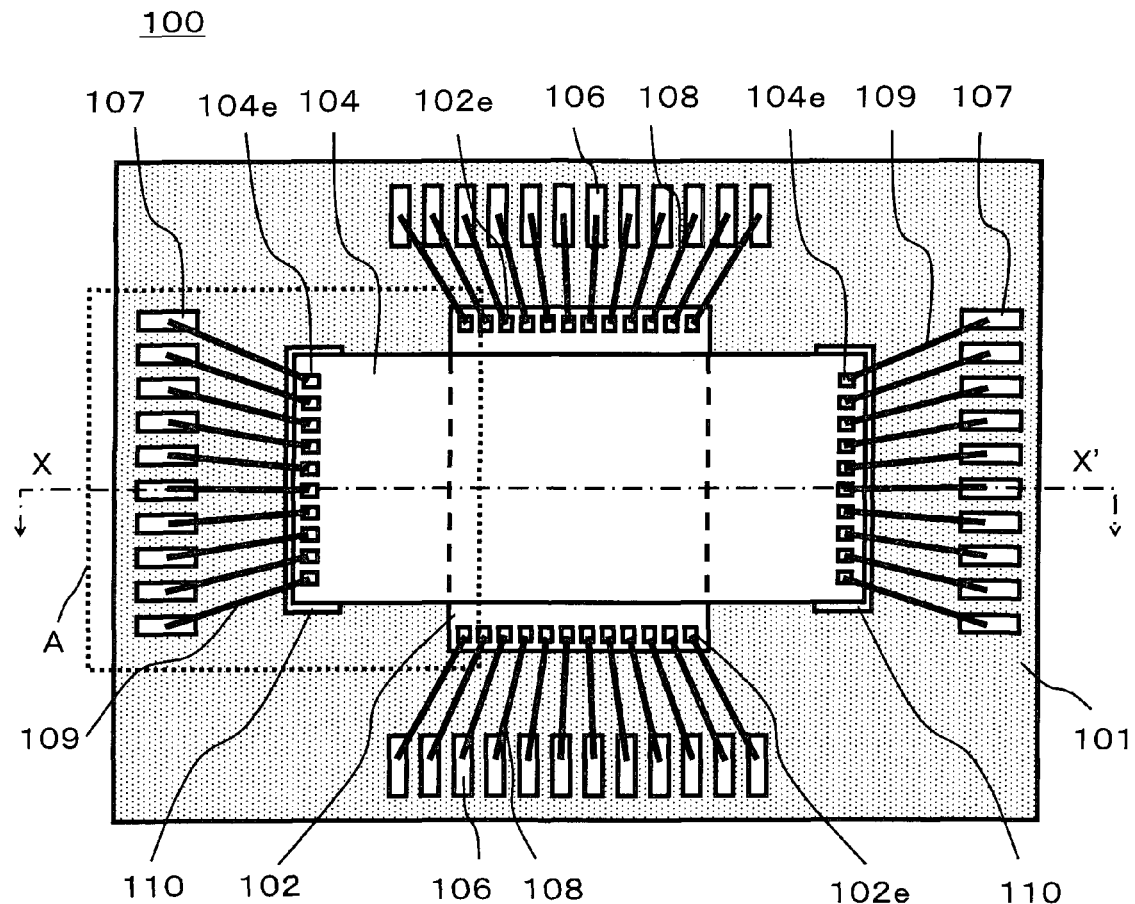
FIGS. 1A and 1B are a block diagram illustrating a semiconductor device according to a first embodiment.
Figure 1B:
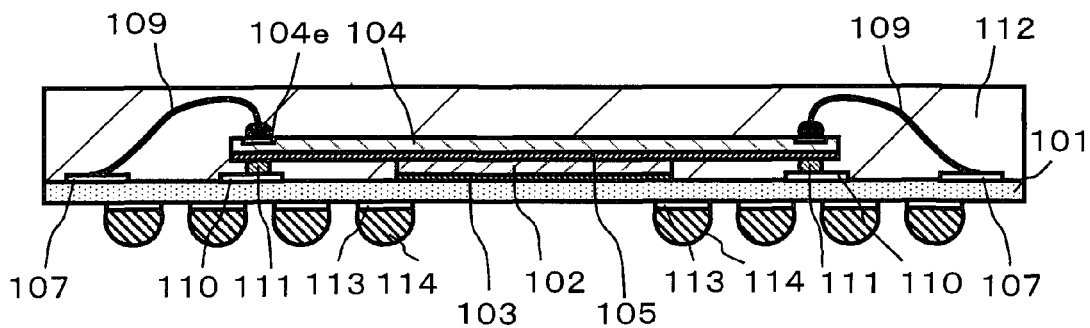

A semiconductor device 100 according to the first embodiment is shown in FIGS. 1A and 1B.

FIG. 1A shows a plan view of the semiconductor device 100, and FIG. 1B shows an X-X' cross-section of FIG. 1A. Note that in FIG. 1A, display of a resin sealing portion is omitted, and the external form thereof is shown with a solid line.

With the semiconductor device 100, two semiconductor elements are disposed in layers on the main face on one side of the wiring board 101 serving as a supporting base.

That is to say, a first semiconductor element 102 is mounted in a so-called face-up state on the wiring board 101 via an adhesive layer 103, and further, a second semiconductor element 104 is mounted in a face-up state on the first semiconductor element 102 via an adhesive layer 105.

Now, the second semiconductor element 104 has a rectangular shape, and is mounted on the first semiconductor element 102 so as to extend (protrude) past the width of the first semiconductor element 102 in wing form (cantilever form). Therefore, the extending (protruding) portion of the second semiconductor element 104 and the supporting board 101 are separated at the side portion of the first semiconductor element 102.

The first semiconductor element 102 has an intermediate member positioned between the wiring board 101 and the second semiconductor element 104 as an intermediate member.

With such as configuration, plural external connection electrode terminals 102e of the first semiconductor element 102 are placed near the edges of the second semiconductor element 104 along the two edges which differ from the two extending edges thereof.

Also, plural external connection electrode terminals 104e of the second semiconductor element 104 are placed near the edges of the second semiconductor element 104 along the two edges of both ends in the lengthwise direction thereof.

On the other hand, plural electrode terminals 106 corresponding to the external connection electrode terminals 102e of the first semiconductor element 102 and plural electrode terminals 107 corresponding to the external connection electrode terminals 104e of the second semiconductor element 104 are placed on the main face of the wiring board 101.

The external connection electrode terminals 102e of the first semiconductor element 102 and the electrode terminal 106 on the wiring board 101 are connected with a bonding wire 108, and on the other hand, the external connection electrode terminals 104e of the second semiconductor element 104 and the electrode terminal 107 on the wiring board 101 are connected with a bonding wire 109.

As a featured configuration of the present embodiment, a long conductive pad 110 having the same length as the length of the edge of the semiconductor element 104 is placed along the edge portions (sides) of the second semiconductor element 104, on the wiring board 101 near both end portions of the extended portion of the second semiconductor element 104, and convex-shaped members made of bumps 111 are placed on the conductive pad 110 so as to be positioned roughly directly below each of the plural external connection electrode terminals 104e on the second semiconductor element 104.

On the other hand, a sealing resin 112 coats the main face on the one side of the wiring board 101 so as to cover the semiconductor element 102 and semiconductor element 104, as well as the bonding wires 108 and 109 and the like.

Further, external connection terminals 114 are placed on each of plural electrode terminals 113 which are placed in grid form, on the other main face of the wiring board 101.

With such a configuration, the wiring board 101 is formed from an organic insulating resin such as glass-epoxy, glass-BT (bismaleimide triazine), or polymide, or a non-organic material such as ceramic, glass, silicone, or the like. The surface and/or interior of the wiring board 101 have applied a so-called multi-layer wiring technology, whereby wiring made up of copper (Cu) or the like and electrode terminals are placed thereupon. The surface of the copper wiring or electrode terminals may have a coating layer placed thereupon made up of nickel (Ni) and gold (Au), as needed.

The wiring board 101 may also be called a supporting board, circuit board, or interposer.

Also, the semiconductor element 102 and semiconductor element 104 have active elements such as transistors, passive elements such as capacitors, and wiring layers which mutually connect these function elements form an electronic circuit, which are made by applying a so-called wafer process, on the main face on one side of the semiconductor substrate made of silicone (Si) or gallium arsenic (GaAs).

The wiring layer of the semiconductor element 102 and semiconductor element 104 is connected to the external connection electrode terminals of the semiconductor devices.

The semiconductor element 102 and semiconductor element 104 are mounted/disposed as to the wiring board 101 such that the main face whereupon the electronic circuit is formed is the upper face (external surface). Such a state is called a face-up state.

Also, the bonding wires 108 and 109 which connect the external connection electrode terminals on the semiconductor elements and the electrode terminals placed on the wiring board 101 are fine wires of which the primary components are metals such as gold (Au), copper (Cu), or aluminum (Al).

The adhesive layers 103 and 105 which are placed on the other main face of the semiconductor elements are made up of a material primarily of a polymide-type resin or epoxy-type resin. The adhesive may include particles made up of conductive material such as silver (Ag), gold (Au), palladium (Pd), Copper (Cu), and the like.

Also, the long conductive pad 101 placed on the wiring board 101 is formed with copper (Cu), similar to the wiring and electrode terminals formed on the wiring board 101. A coating layer made up of nickel (Ni) and gold (Au) may be placed on the surface of the conductive pad 110, as needed.

The bumps 111 serving as convex-shaped members which are placed on the conductive pad 110 are made up of a metal bump formed with a so-called ball bonding method.

Note that the conductive pad 110 may be individualized corresponding to the placement positions of the bumps 111 instead of having a long shape, i.e. may be placed independently, and also may be placed so as to be divided for each of the plural bumps 111.

A resin having an epoxy resin as the main component is employed for the resin member making up the resin sealing portion 112.

Further, with the other main face of the wiring board 101, the external connection terminals 114 placed on the external connection terminal 113 are formed with a solder ball (solder bump).

Thus, the semiconductor device 100 according to the present embodiment forms a so-called BGA (Ball Grid Array) type semiconductor device.

Accordingly, a so-called LGA (Land Grid Array) type semiconductor device instead of placing a solder ball on the external connection terminals 113 may be formed as needed.

With such a semiconductor device 100, in the event of connecting the separation portion from the wiring board 101 of the second semiconductor element 104 mounted on the first semiconductor element 102, i.e. the external connection electrode terminals 104e positioned at the extended portion from the first semiconductor element 102, with a bonding wire 109, the portion of the second semiconductor element 104 subjected to wire bonding is mechanically supported with the bumps 111.

Thus, in the event of the wire bonding process, bending of the second semiconductor element 104 is suppressed, and damage to the second semiconductor element 104 can be prevented.

Also, pressure from bonding capillaries is effectively applied, and the bonding wire 109 is connected to the external connection electrode terminals 104e of the second semiconductor element 104 in a sure manner.

Next, the manufacturing method of the semiconductor device 100 will be described with reference to FIGS. 2A to 2E and FIGS. 3A to 3D.

Note that FIGS. 2A to 2E and FIGS. 3A to 3D equate to the cross-section shown in FIG. 1B, and the configuration elements which are the same as the configuration elements shown in FIGS. 1A and 1B have the same reference numerals.

Figure 2A:
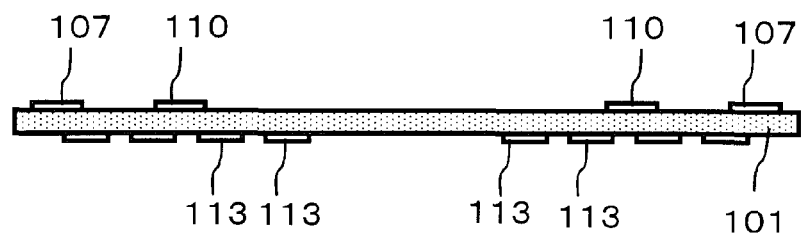
FIGS. 2A to 2E are a cross-sectional diagram illustrating a manufacturing process of the semiconductor device according to the first embodiment.

The wiring board 101 whereupon electrode terminals 106, 107, and 113, as well as a long conductive pad 110 are placed on the surface thereof is mounted on a die-bonder bonding stage (not shown) of a die-bounder (see FIG. 2A).

This is then heated to a predetermined temperature, e.g. 50° C. to 200° C. with a heater placed on the bonding stage.

Figure 2B:
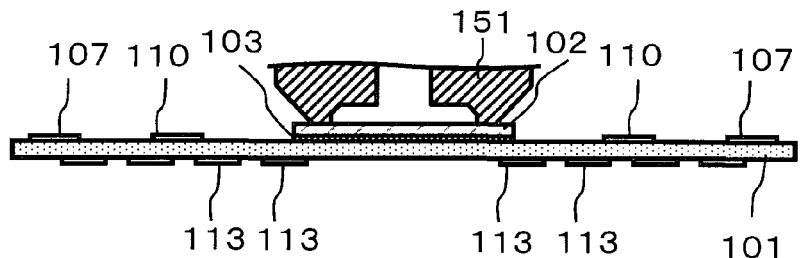

Next, the first semiconductor element 102 of which the upper face (electronic circuit forming face) is adhered/held with a vacuum collet 151 is mounted on the wiring board 101, and in accordance with the pressure from the vacuum collet 151, the first semiconductor element 102 is affixed onto the wiring board 101 with an adhesive layer 103 which is selectively placed on the back face of the first semiconductor element 102 or the upper face of the wiring board 101 beforehand (see FIG. 2B).

The adhesive layer 103 is placed beforehand by drawing or gluing or the like.

Note that a thermo-setting resin may be employed as the adhesive. In such a case, following mounting the first semiconductor element 102 on the wiring board 101, this may be heated by a thermostatic bath or hot plate or the like to 120° C. to 240° C., for example, whereby the adhesive is semi-hardened or hardened.

Next, the wiring board 101 is mounted on the bonding stage (not shown) of a wire bonder, and this is heated to a predetermined temperature, e.g. 100° C. to 200° C., with the heater placed on the bonding stage.

Figure 2C:
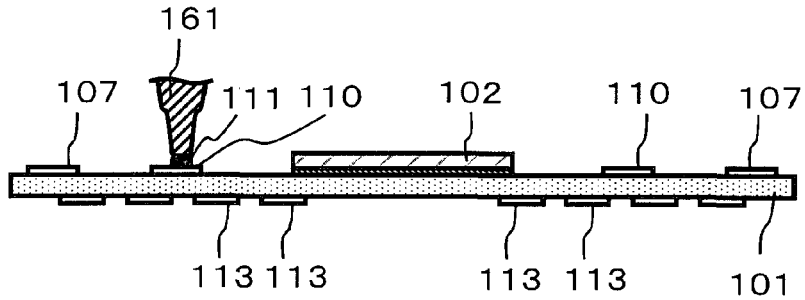

A so-called ball bonding method which uses a bonding capillary 161 on a wire bonding tool is employed, whereby plural bumps 111 are formed on the surface of the long conductive pad 110 of the wiring board 101 (see FIG. 2C).

The placement of the bumps 111 on the surface of the conductive pad 110 is performed so as to correspond to the positions where the external connection electrode terminals 104e of the second semiconductor element 104 are placed.

Figure 2D:
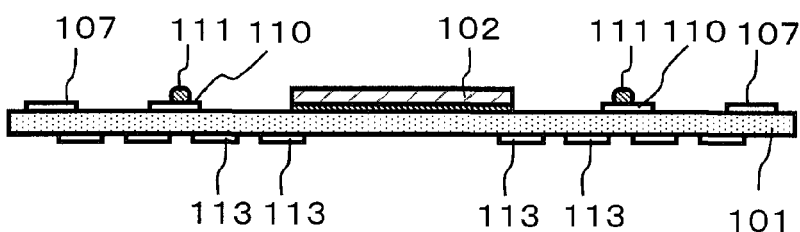

Let us say that the height of the bumps 111 is roughly the same as that of the upper face of the first semiconductor element 102 (see FIG. 2D).

That is to say, the height of the bumps 111 is roughly same height as the height made up from the thickness of the first semiconductor element 102 and the adhesive layer 103.

Note that the sequence may be reversed for the placing process of the bumps 111 onto the conductive pad 110 and the affixing process of the first semiconductor element 102 onto the wiring board 101.

Next, the wiring board 101 is mounted on the die-bonder bonding stage (not shown), and this is heated to a predetermined temperature, e.g. 50° C. to 200° C., with the heater placed on the bonding stage.

Figure 2E:
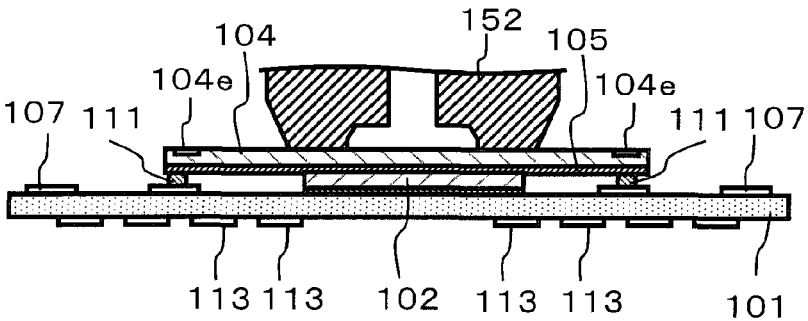

The second semiconductor element 104 of which the upper face (electronic circuit forming face) is adhered with a vacuum collet 152 is mounted on the first semiconductor element 102, and in accordance with the pressure from the vacuum collet 152, the second semiconductor element 104 is affixed to the first semiconductor element 102 with an adhesive layer 105 which is selectively placed on the back face of the second semiconductor element 104 or the upper face of the first semiconductor element 102 beforehand (see FIG. 2E).

Consequently, the bumps 111 are positioned roughly directly below each of the external connection electrode terminal 104e of the second semiconductor element 104.

Note that in the case of placing the adhesive layer 105 over the entire back face of the second semiconductor element 104, the bumps 111 and the back face of the second semiconductor element 104 may be affixed via the adhesive layer 105.

Next, the wiring board 101 is mounted on the wire bonder bonding stage (not shown) of a wire bounder, and this is heated to a predetermined temperature, e.g. 100° C. to 200° C., with the heater placed on the bonding stage.

The external connection electrode terminals of the semiconductor element and the electrode terminal on the wiring board corresponding thereto are connected with the bonding wire, employing a normal ball bonding method.

Figure 3A:
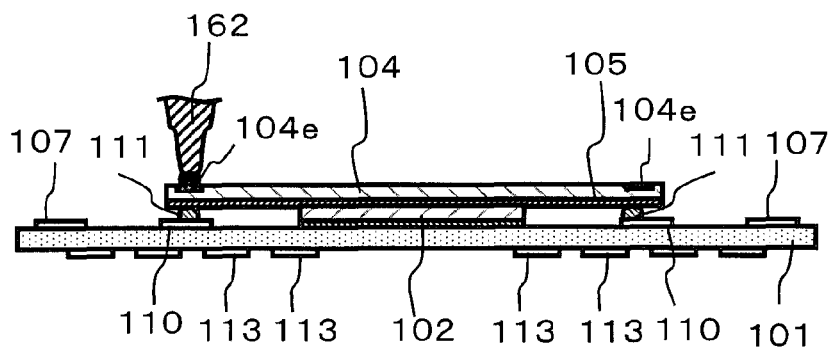
FIGS. 3A to 3D are a cross-sectional diagram illustrating a manufacturing process of the semiconductor device according to the first embodiment, and illustrates a manufacturing process which follows the manufacturing process illustrated in FIGS. 2A to 2E.

That is to say, the leading end of the bonding wire 109, i.e. the boll portion, is connected to the external connection electrode terminal 104e of the second semiconductor element 104 employing a bonding capillary 162 (see FIG. 3A)

In the case of such bonding wire 109 connection, the portion of the external connection electrode terminal 104e of the second semiconductor element 104 subjected to wire bonding is mechanically supported with the bumps 111, and bending of the second semiconductor element 104 is suppressed, thereby preventing damage thereto.

Also, the absorption of ultrasonic vibration energy is prevented, pressure is effectively applied, and the bonding wire 109 is connected to the external connection electrode terminal 104e of the second semiconductor element 104 in a sure manner.

That is to say, with the wiring board 101, the bumps 111 are positioned roughly directly below the external connection electrode terminals 104e of the second semiconductor element 104, and resists the pressure in the event of connecting the bonding wire 109 as to the external connection electrode terminals 104e of the second semiconductor element 104.

Figure 3B:
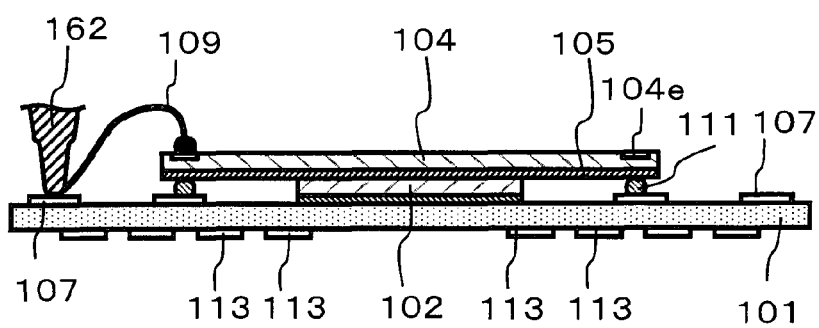

Following such wire bonding, the other end (trailing end) of the bonding wire 109 is connected as to the electrode terminal 107 on the wiring board 101 by a stitch bonding method (see FIG. 3B).

At this time, the bonding wire 109 has a predetermined looping form.

Note that before the wire bonding processing between the external connection electrode terminals 104e of the second semiconductor element 104 and the electrode terminals 107 on the wiring board 101, or following the ending thereof, the external connection electrode terminals 102e of the first semiconductor 102 and the electrode terminals 105 of the wiring board 101 are also connected using the bonding wire 108 (not shown).

Figure 3C:
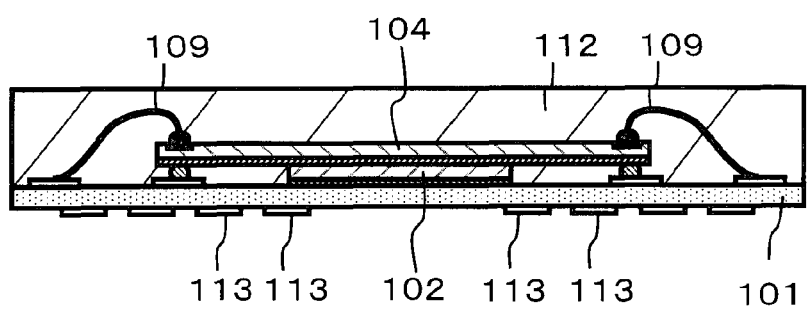

Thus, following connecting the external connection electrode terminals of the semiconductor elements and the electrode terminals of the wiring board with wire bonding method, the layered structure of the semiconductor element which is formed on the main face of the wiring board 101 is coated with a sealing resin 112, along with the bonding wires 108, 109, and so forth (see FIG. 3C).

As a coating method for the sealing resin 112, a known transfer mold method, compression mold method, or potting method can be employed.

Note that in the case of such resin sealing also, the extended portion of the second semiconductor element 104 is supported with bumps 111.

Accordingly, the second semiconductor element 104 can be prevented from deforming or damage by the in-flow pressure of the sealing resin 112 with a transfer mold method or the like.

Figure 3D:
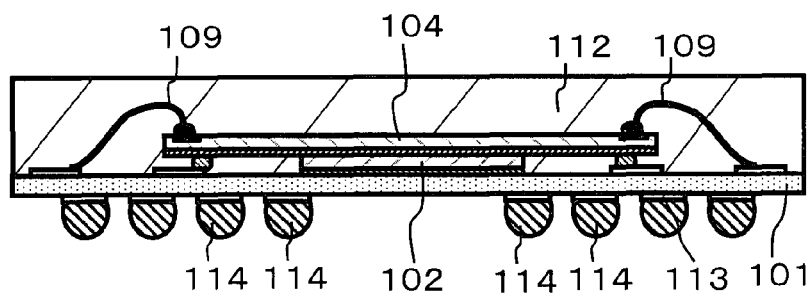

An external connection terminal 114 made up of a solder ball electrode is placed as to the electrode terminal 113 on the other main face of the wiring board 101, using a reflow soldering method or the like, thereby forming the semiconductor device 100 (see FIG. 3D).

Note that in the case of using a process wherein the wiring board 101 is a large board, and multiple layered structures of semiconductor elements are formed on one main face of the wiring board 101 (not shown), after forming the external connection terminal 114, the resin sealing unit 112 and wiring board 101 are cut by dicing in the layered direction thereof (thickness direction), thereby obtaining an individual semiconductor device 100.

Now, a process for forming the bumps 111 on the conductive pad 110 of the wiring board 101 with a so-called ball bonding method will be described with reference to FIGS. 4A to 4C.

Figure 4A:
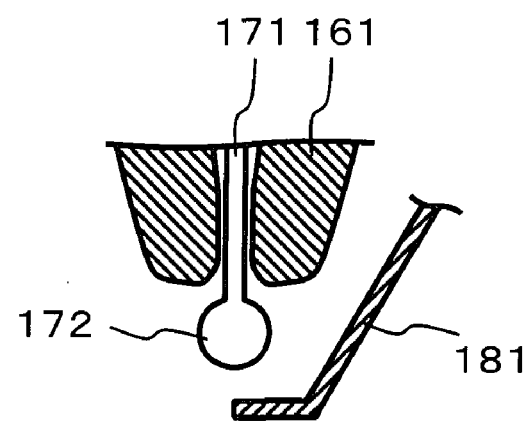
FIGS. 4A to 4C are a diagram illustrating a process to form a bump.

Thus, electrical discharged is performed between a bonding wire 171 made up of a metal composed primarily of gold (Au) led from the leading end of the bonding capillary 161 of the wire bonding tool, and a torch 181, and a ball 172 is formed on the tip portion of the bonding wire 171 (see FIG. 4A).

Figure 4B:
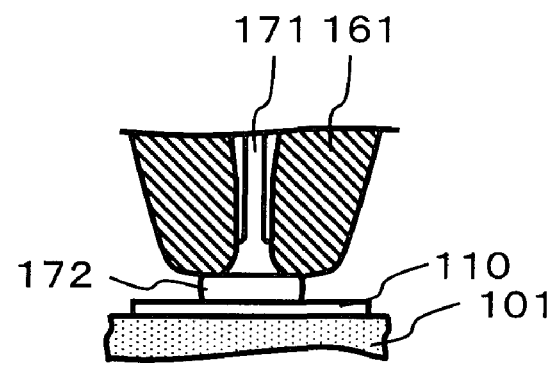

Next, the ball 172 is pressed onto the conductive pad 110 placed on the member subjected to connection, i.e. on the surface of the wiring board 101 by the bonding capillary 161, while load and ultrasonic vibrations are applied, and is this connected to the conductive pad 110 (see FIG. 4B).

With such a connecting processing, the ball 172 is deformed, and is connected with a flat plate shape portion as to the surface of the conductive pad 110.

Note that at this time, let us say that the load applied by the bonding capillary 161 is approximately 4 gf through 7 gf in the case that the diameter of the bonding wire 171 is 15 μm, and is approximately 10 gf through 20 gf in the case that the diameter of the wire 172 is 20 μm.

Also, with such a bonding process, the bonding stage which holds the wiring board 101 can be heated to 100° C. to 200° C.

Figure 4C:
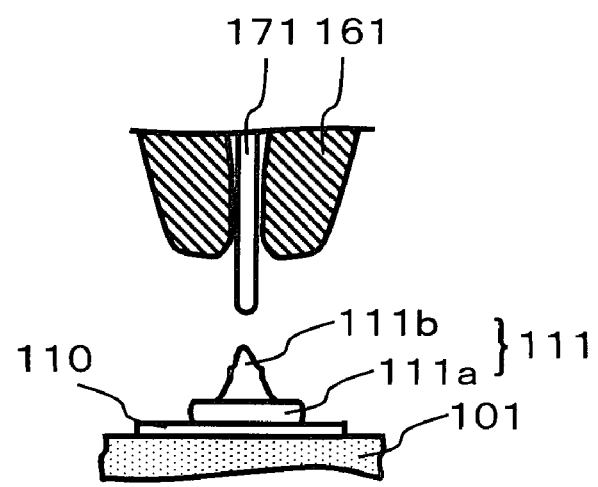

Next, in a state wherein the bonding wire 171 is held with a clamp (not shown) on the bonding capillary 161, the bonding capillary 161 is subjected to pull up, and the bonding wire 171 is cut (torn off) (see FIG. 4C).

Thus, a bump 111 having a plate-shaped base portion 111a and a protruding portion 111b which protrudes on the upper face thereof is formed on the conductive pad 110.

The bump 111 is subjected to various types of deformities, corresponding to the application location (disposal location) thereof.

That is to say, one example is that the shape of the protruding portion 111b of the bump 111 is deformed corresponding to application location (disposal location) thereof. Also, there are cases wherein the bump 111 serves as a layered structure.

Such a deformation example of the bump 111 will be described with reference to FIGS. 5A to 5C.

For example, in the case that, with the semiconductor device 100, the length of the extended portion of the second semiconductor element 104 is long, and the extension length from the edge portion of the first semiconductor element 102 positioned directly therebelow is long, bending of the second semiconductor element 104 becomes great in the event of wire bonding to the external connection electrode terminal 104e of the second semiconductor element 104.

Figure 5A:
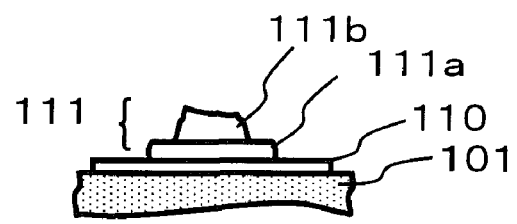
FIGS. 5A to 5C are a diagram illustrating a modified example of a bump.

In such a case, the upper face of the protruding portion 111b of the bump 111 becomes a sloped face corresponding to the bending face occurring with the second semiconductor element 104 so as to make contact as to the bend of the second semiconductor element 104, in a face-contact state (see FIG. 5A).

That is to say, the upper face of the protruding portion 111*b* of the bump 111 becomes a downward sloped face along the extension direction of the second semiconductor element 104 from the first semiconductor element 102 side.

Such a sloped face is formed in the process shown in FIGS. 4A to 4C, by pressing a flat surface portion of which the tip portion of the bonding capillary 162 is sloped, against a crown portion of the bonding wire 171, after the bonding of the ball 172, before tearing off the bonding wire 171, and after the bonding capillary 162 is temporarily subjected to rise up and is moved in the horizontal direction.

Figure 5B:
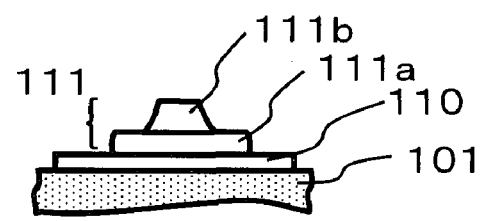

After this, the bonding wire 171 is torn off and the bump 111 having the protruding portion 111*b* with a sloped face on the upper face is formed.

on the other hand, in the case that the length of the extended portion of the second semiconductor element 104 is short and so forth, a bump having a protruding portion wherein the upper face is a flat surface is placed (see FIG. 5B).

Such a flat surface is formed after the process shown in FIGS. 4A to 4C, by pressing a stamping tool having a flat portion or plate-shaped member or the like, parallel with the wiring board 101, onto the tip portion of the bump 111.

Note that pressing with the stamping tool or plate-shaped member or the like can be performed in increments of individual bumps 111, or can be performed together as to plural bumps 111.

Figure 5C:
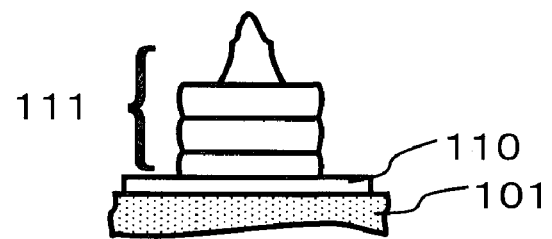

Also, with the semiconductor device 100, in the case that the separation distance between the extended portion of the second semiconductor element 104 and the upper face of the wiring board 101 is great, i.e. in a case that the thickness of the layered structure made up of the first semiconductor element 102 and adhesive layer 103 is great, the bump 111 is configured as a layered structure of multiple bumps (see FIG. 5C). Such a layered structure can be formed by repeating the method shown in FIGS. 4A to 4C. By placing multi-step (multi-layer) layered bumps, the extended portion of the second semiconductor element 104 can be supported in a sure manner.

Note that as a method to form the bumps 111, a so-called selection plating method, as well as the above-described ball bonding method, can be employed.

Accordingly, the external form of the bumps 111 are not limited to the above-mentioned many-stage form, and there may be cases of forming a pillar form.

The placement location and/or the number of placed bumps 111 can be selected as needed.

A modified example of the placement location and/or the number of placed bumps 111 will be described with reference to FIGS. 6A to 6D.

Note that FIGS. 6A to 6D show a rectangular region surrounded with dotted line A in FIG. 1A. Also, FIGS. 6A to 6D omit the second semiconductor element 104 mounted on the first semiconductor element 102, bonding wire 109, and resin sealing portion 112, and shows the external shape of the second semiconductor element 104 with a dotted line.

Figure 6A:
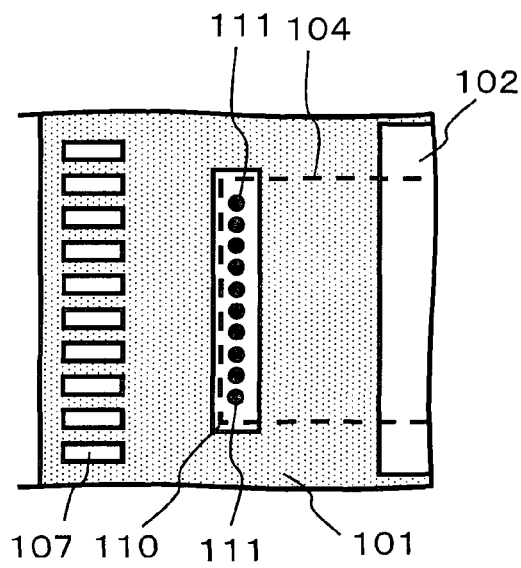
FIGS. 6A to 6D are a plan view illustrating a disposal state of bumps of the semiconductor device according to the first embodiment.

As described above, with the semiconductor device 100, the placement of the bumps 111 on the surface of the conductive pad 110 is performed so as to correspond to the positions where the external connection electrode terminals of the second semiconductor element 104 are placed (see FIG. 6A).

That is to say, the bumps 111 are placed so as to be roughly directly below each of the plural external connection electrode terminals 104*e* of the second semiconductor element 104 (ten with the state shown in the diagram).

With such a state, in the case of wire bonding as to the plural external connection electrode terminals 104*e* of the second semiconductor elements 104, the bumps 111 positioned directly below the individual electrode terminals which are subjected to bonding respond as to the pressure applied thereto, whereby favorable wire bonding is performed.

With such a configuration, placing the bumps 111 corresponding to the number of external connection electrode terminals 104*e* with the second semiconductor element 104 becomes necessary.

However, with such a bump placement configuration, in the case that a semiconductor element having a greater number of external connection terminals serving as the second semiconductor element 104 is employed, time needed for placing the bumps 111 is likely to be increased.

On the other hand, in the case that a semiconductor element with a relatively small form, or a long form with narrow width, is employed as the second semiconductor element 104, there are cases wherein the placement of the number of bumps 111 corresponding to the external connection electrode terminals of the semiconductor elements is not necessary.

In such a case, for example, the following bump placement configuration may be taken.

Figure 6B:
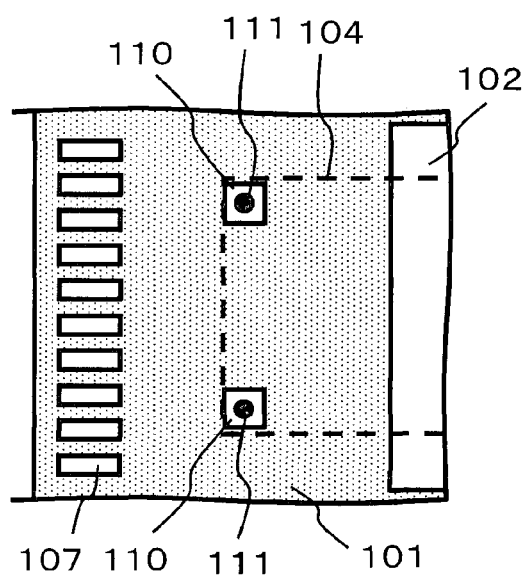

One example is to place the bumps 111 only in both corner portions at the edge portion in the lengthwise direction of the semiconductor element (the second semiconductor element 104 of the semiconductor device 100) (a total of two bumps) (see FIG. 6B).

Figure 6C:
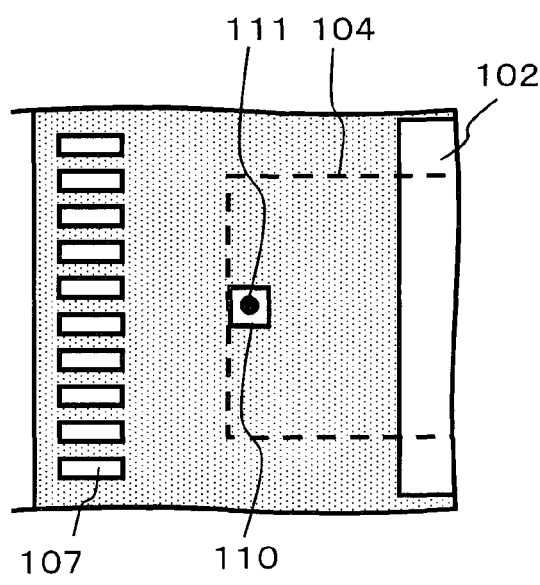

Another example is to place the bump 111 only in roughly the central portion of the side at the edge portion in the lengthwise direction of the semiconductor element (the second semiconductor element 104 of the semiconductor device 100) (a total of one bump) (see FIG. 6C).

Figure 6D:
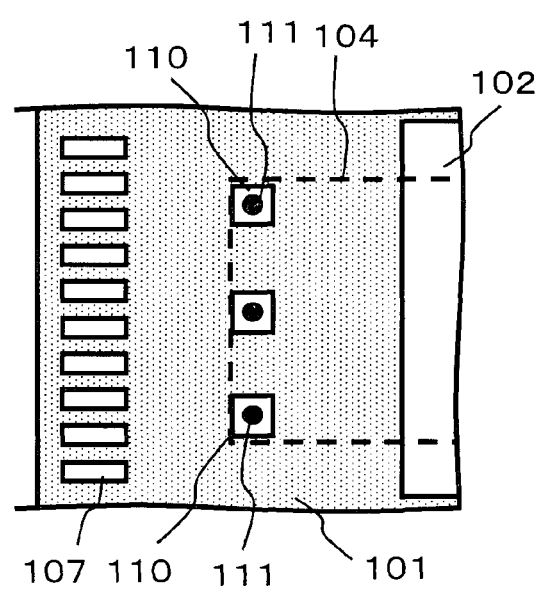

Another example is to place the bump 111 in both corner portions at the edge portion in the lengthwise direction of the semiconductor element (the second semiconductor element 104 of the semiconductor device 100), and in roughly the central portion at the edge portion (a total of three bumps) (see FIG. 6D).

Also, the bumps 111 are not limited to being positioned on a line of an external connection electrode terminal array of the semiconductor element (the second semiconductor element 104 of the semiconductor device 100), and may be positioned deviated inwards or outwards from the line of the external connection electrode terminal array of the semiconductor device (not shown).

With such bump placement configurations, the conductive pad 110 does not need to be in a long form, and can be selectively placed corresponding to the locations of placement of the bumps 111.

With such a bump 111 selective placement configuration, the number of placed bumps 111 can be reduced, whereby the cost of the placement process can be reduced and the efficiency thereof improved.

The semiconductor device 100 can have further various types of modifications.

One example is that a so-called reverse bonding method can be employed as connection method of the bonding wire 109 which connects the external connection electrode terminals 104*e* of the second semiconductor element 104 and the electrode terminal 107 on the wiring board 101.

Figure 7:
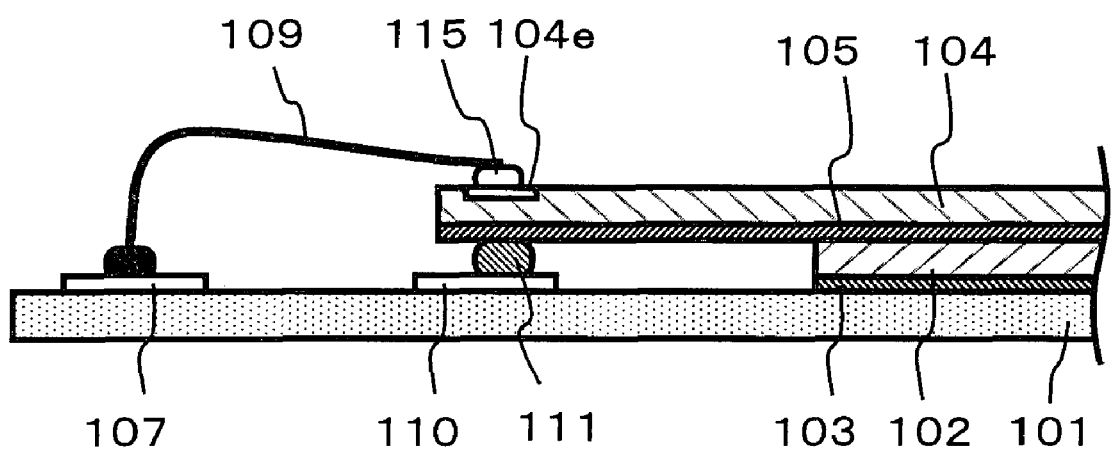
FIG. 7 is a cross-sectional diagram illustrating a bonding wire connection modification example of the semiconductor device according to the first embodiment.

A state employing such a reverse bonding method is shown in FIG. 7 as a semiconductor element 130. In this diagram, the portions corresponding to the configuration shown in FIGS. 1A and 1B have the same reference numerals therewith.

As shown in FIG. 7, with the semiconductor device 130, the ball portion which is the leading end of the bonding wire 109 is connected to the electrode terminal 107 of the wiring board 101, and the other end (trailing end) of the bonding wire 109 is connected to a bump 115 which is placed on the external connection electrode terminal 104e of the second semiconductor element 104.

Even in a case of employing such a reverse bonding method, in the event of connecting the other end (trailing end) of the bonding wire 109 to the external connection electrode terminal 104e of the second semiconductor element 104, pressure of the bonding tool is applied as to the second semiconductor element 104.

Also, the placement of bumps 115 on the external connection electrode terminals 104e of the second semiconductor element 104 which precedes the connections is performed using the so-called ball bonding method, similar to the method described with reference to FIGS. 4A to 4C.

Accordingly, in the case of placement of the bumps 115 also, pressure of the bonding tool is applied as to the second semiconductor element 104.

The bumps 111 resist the pressure of the bonding tool, support the second semiconductor element 104, and prevent deforming and damage of the second semiconductor element 104.

By employing such a reverse bonding method, the height of the wire loop of the bonding wire 109 can be lower as compare to a normal wire bonding method with the semiconductor device 100.

Thus, with the semiconductor device 130, a semiconductor device with a lower height (thin thickness) can be formed without inviting an increase in height (thickness) of the resin sealing portion.

Also, with the semiconductor device 100, the second semiconductor element 104 is mounted on the first semiconductor element 102 so as to extend in wing form in both directions from two edges facing one another of the first semiconductor element 102.

However, depending on the state of the first semiconductor element 102, the mounting position of the second semiconductor element 104 of the first semiconductor element 102 and the extension direction thereafter may be specified or restricted.

That is to say, as with the semiconductor storage element for example, an arrangement may be made wherein the external connection electrode terminals are positioned in the roughly central portion of the semiconductor element and placed in column form in the lengthwise direction of the semiconductor storage element.

In the case of mounting such a semiconductor element serving as the first semiconductor element 102 on the wiring board 101 in a face-up state, and mounting the second semiconductor element 104 on the first semiconductor element 102, in order for the bonding wire 108 to be enabled to connect as to the external connection electrode terminal of the first semiconductor element 102, one of the two sides of the first semiconductor element 102 along the array of the external connection electrode terminals needs to be released, and the second semiconductor element 104 needs to be mounted so as to be extended in wing form (cantilever form) on this side.

Figure 8A:
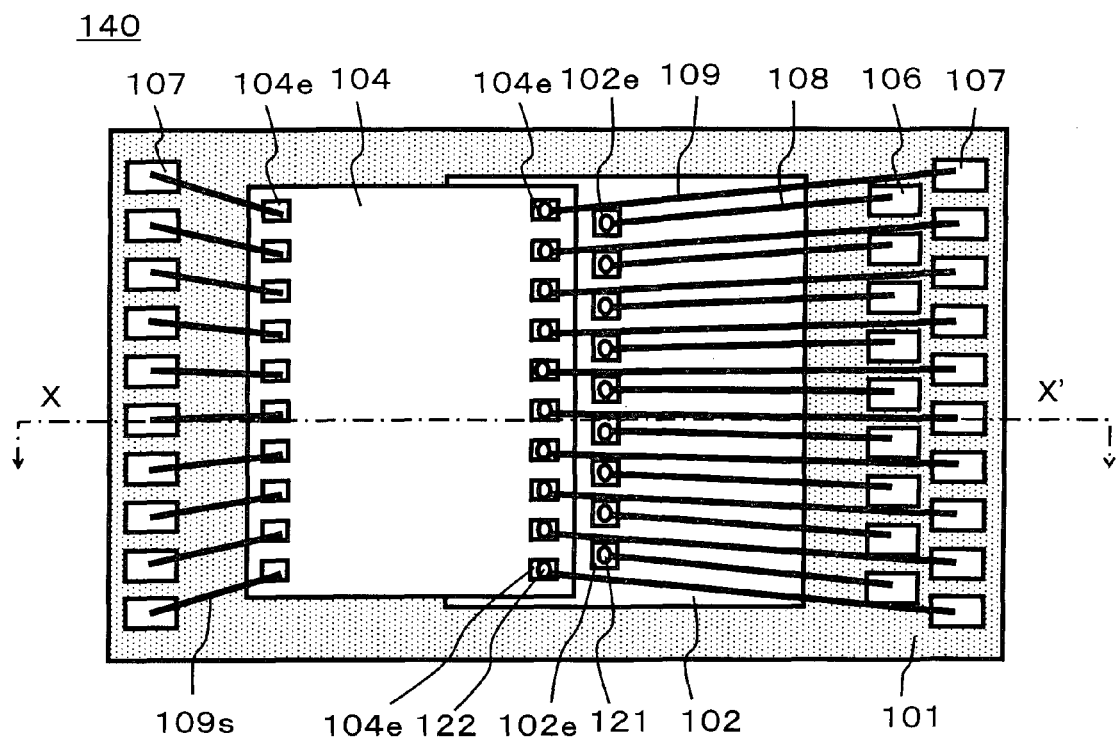
FIGS. 8A and 8B are a diagram illustrating the configuration of a modified example of the semiconductor device according to the first embodiment.
Figure 8B:
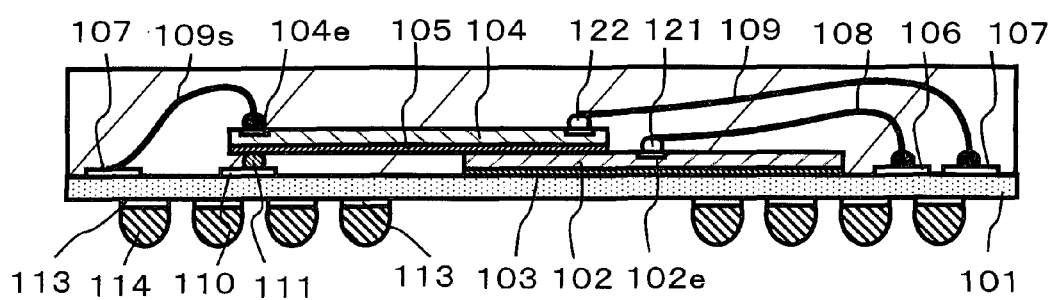

The semiconductor element configuration including a mounting mode of such a semiconductor element is shown in FIGS. 8A and 8B as a semiconductor device 140.

FIG. 8A shows a plan view of the semiconductor device 140, and FIG. 8B shows an X-X' cross-section of FIG. 8A. Note that in FIG. 8A, display of a resin sealing portion is omitted, and the external form thereof is shown with a solid line.

With the semiconductor device 140, two semiconductor elements are disposed in layers on the main face on one side of the wiring board 101 serving as a supporting base.

That is to say, a first semiconductor element 102 is mounted in a so-called face-up state on the wiring board 101 via an adhesive layer 103, and a second semiconductor element 104 is mounted in a face-up state on the first semiconductor element 102 via an adhesive layer 105.

Plural external connection electrode terminals 102e are placed in column form in the roughly central portion on the surface of the first semiconductor element 102.

Also, the second semiconductor element 104 is mounted on the first semiconductor element 102 so as to avoid the placement portions of the external connection electrode terminals 102e of the first semiconductor element 102, and to extend (protrude) in wing form (cantilever form) from one side parallel to the array of external connection electrode terminals 102e of the first semiconductor element 102.

Therefore, the extended portion (protruding portion) of the second semiconductor element 104 and the supporting board 101 are separated at the side portion of the first semiconductor element 102.

The first semiconductor element 102 forms an intermediate member positioned between the wiring board 101 and the second semiconductor element 104 as an intermediate member.

With such a placement configuration, the length of the extending portion (protruding amount) of the second semiconductor element 104 is greater than 1/2 the length of a side parallel to the extension direction of the second semiconductor element 104.

That is to say, the area of the extended portion of the second semiconductor element 104 is greater than the area where the second semiconductor element 104 is affixed to the first semiconductor element 102.

Plural external connection electrode terminals 104e of the second semiconductor element 104 are placed along each of two sides facing one another of the second semiconductor element 104, with one of the arrays approaching the array of external connection electrode terminals 102e of the first semiconductor element 102 in an approximately parallel manner. Also, the other array is positioned at a region far from the first semiconductor element 102, of the extended (protruding) portion.

On the other hand, plural electrode terminals 106 are placed on the main face of the wiring board 101 corresponding to the external connection electrode terminals 102e of the first semiconductor element 102, and plural electrode terminals 107 are placed on the main face of the wiring board 101 corresponding to the external connection electrode terminals 104e of the second semiconductor element 104.

A portion of the electrode terminals 107 are positioned on the outer side of the electrode terminal 106 array, and are placed so as to be roughly parallel thereto.

The external connection electrode terminals 102e of the first semiconductor element 102 and the electrode terminals 106 on the wiring board 101 are connected with the bonding wire 108, and the external connection electrode terminals 104e of the second semiconductor element 104 and the electrode terminals 107 on the wiring board 101 are connected with the bonding wire 109.

As a connection method of the bonding wire 108 as to the external connection electrode terminals 102e of the first semiconductor element 102, and as a connection method of the bonding wire 109 as to the external connection electrode terminals 104e positioned on the first semiconductor element 102 of the second semiconductor element 104, a reverse bonding method is employed.

That is to say, the trailing end of the bonding wire 108 is connected to a bump 121 which is placed on the external connection electrode terminals 102e of the first semiconductor element 102, and on the other hand, the trailing end of the bonding wire 109 is connected to a bump 122 which is placed on the external connection electrode terminals 104e positioned on the first semiconductor element 102 of the second semiconductor element 104.

The direction in which the bonding wires 108 and 109 are extended are roughly the same, which enables suppressing the height of the wire loop while preventing mutual contact, whereby the reverse bonding method is effective.

As a featured configuration of the semiconductor device 140, a long conductive pad 110 having the same length as the length of the edge of the second semiconductor element 104 is placed along the edge portions (sides) of the second semiconductor element 104, on the wiring board 101 of the extended (protruding) portion of the second semiconductor element 104. Bumps 111 are placed on the conductive pad 110 so as to be positioned roughly directly below each of the plural external connection electrode terminals 104e on the second semiconductor element 104.

A bonding wire 109s is connected to the external connection electrode terminals 104e at the extended (protruding) portion of the second semiconductor element 104 with a normal wire bonding method.

Also, a sealing resin 112 is placed on one main face of the wiring board 101 so as to cover the semiconductor elements 102 and 104, and bonding wires 108 and 109.

Further, external connection terminals 114 made up of solder balls (solder bumps) on the electrode terminals 113, which are placed in grid form, are placed on the other main face of the wiring board 101.

With such a semiconductor device 140, the length of the extended (protruding) portion (extension length) of the second semiconductor element 104 becomes comparatively large, so the effectiveness of the bumps 111 being placed is high.

That is to say, in the event of connecting the leading end of the bonding wire 109s to the external connection electrode terminals 104e of the second semiconductor element 104, the portions of the second semiconductor element 104 to be subjected to wire bonding are mechanically supported by the bumps 111. Accordingly, the bending of the second semiconductor element 104 is suppressed, and damage to the second semiconductor element 104 is prevented.

Further, in the event of mounting the second semiconductor element 104 on the first semiconductor element 102, mounting can be performed while being supported by the bumps 111, whereby the second semiconductor element 104 can be accurately placed in layers without sloping on the first semiconductor element 102.

Thus, the setting freedom of the disposal configuration of the first semiconductor element 102 and second semiconductor element 104 of the semiconductor device improved.

(Second Embodiment)

A second embodiment of the semiconductor device according will be described with reference to FIGS. 9A through 13B.

The semiconductor element according to the present embodiment is mounted in a face-down (flip-chip) state on a wiring board which is a supporting base, and comprises a first semiconductor element wherein external connection bump electrodes thereof are connected to electrode terminals on the wiring board, and a second semiconductor element which is mounted on the first semiconductor element in a face-up state, wherein an electrode terminal pad thereof is connected to the electrode terminals on the wiring board with a wire bonding method.

Figure 9A:
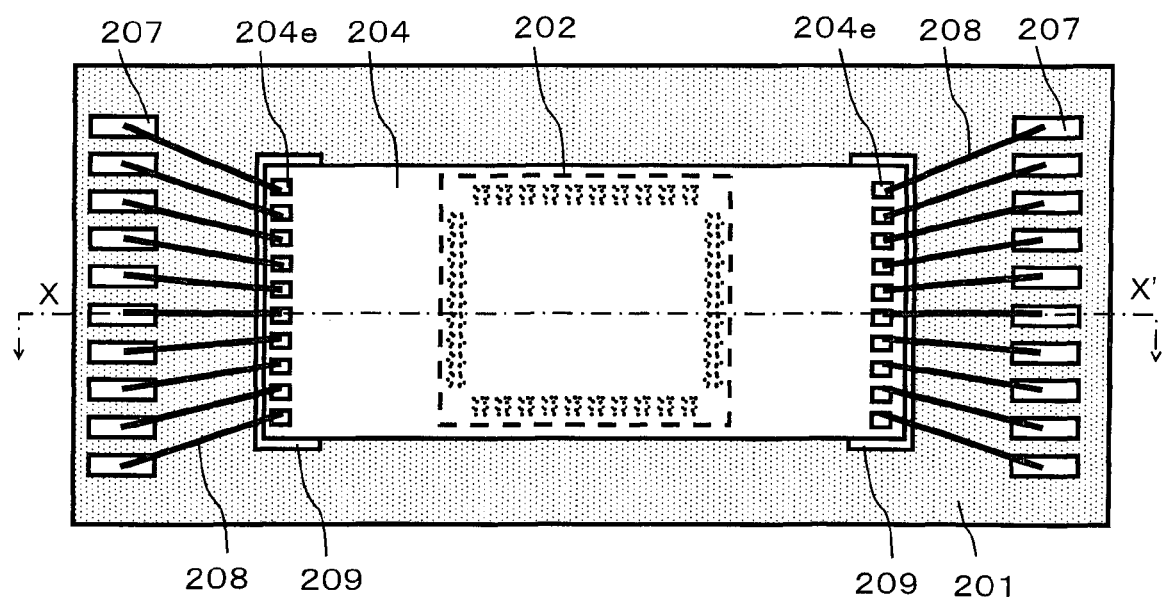
FIGS. 9A and 9B are a diagram illustrating a semiconductor device according to a second embodiment.
Figure 9B:
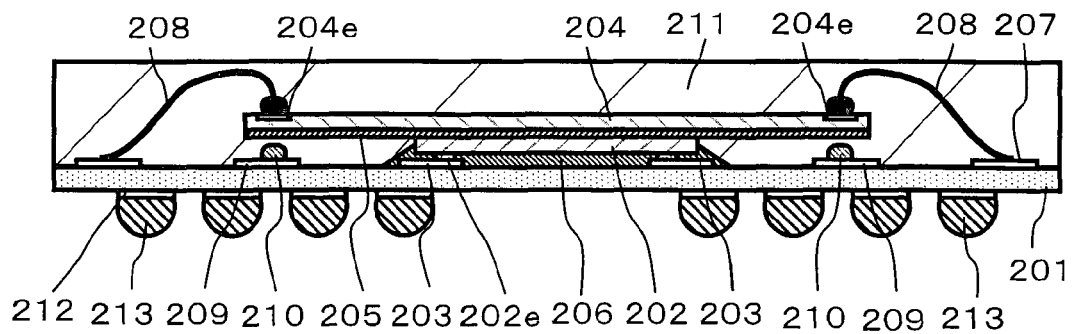

A semiconductor device 200 according to the second embodiment is shown in FIGS. 9A and 9B.

FIG. 9A shows a flat surface of the semiconductor device 200, and FIG. 9B shows an X-X' cross-section of FIG. 9A. Note that in FIG. 9A, display of a resin sealing portion is omitted, and the external form thereof is shown with a solid line.

With the semiconductor device 200, two semiconductor elements are disposed in layers on the main face on one side of the wiring board 201 serving as a supporting base.

That is to say, a first semiconductor element 202 is mounted in a so-called face-down (flip-chip) state on the wiring board 201, and is connected to an electrode terminal 203 on the wiring board 201 with external connection protrusion (bump) electrodes 202e which are placed on the electrode terminal (not shown).

A second semiconductor element 204 is then mounted in a face-up state on the first semiconductor element 202 via an adhesive layer 205.

Now, the first semiconductor element 202 is formed with a relatively small flat surface, and the second semiconductor element 204 having a rectangular shape is mounted on the first semiconductor element 202 so as to extend (protrude) past the width of the first semiconductor element 202 in wing form (cantilever form).

Therefore, the extended (protruding) portion of the second semiconductor element 204 and the wiring board 201 are separated at the side portion of the first semiconductor element 202.

The first semiconductor element 202 forms an intermediate member which is positioned between the wiring board 201 and second semiconductor element 204 as an intermediate member.

A so-called underfill material 206 fills in between the first semiconductor element 202 and wiring board 201.

The underfill material 206 is placed so as to spread out in skirt form from the region of the wiring board 201 corresponding to the first semiconductor element 202, protects the connection between the external connection protrusion (bump) electrodes 202e of the first semiconductor element 202 and the electrode terminal 203 of the wiring board 201, while affixing the first semiconductor element 202 and wiring board 201.

Note that plural external connection protruding electrodes 202e of the first semiconductor element 202 are placed along each of four edge portions of the main surface (electronic circuit forming face) of the semiconductor element 202.

Also, plural external connection protruding electrodes 204e of the second semiconductor element 204 are placed along both edge portions in the lengthwise direction of the second semiconductor element 204.

On the other hand, plural electrode terminals 203 corresponding to the external connection protruding electrodes 202e of the first semiconductor element 202 are placed on the main face of the wiring board 201 as described above, and also plural electrode terminals 207 corresponding to the external connection electrode terminals 204e of the second semiconductor element 204 are placed on the main face of the wiring board 201.

The external connection protruding electrodes 202e of the first semiconductor element 202 and the electrode terminals 201e on the wiring board 201 are connected by a so-called thermocompression bonding, and on the other hand, the external connection electrode terminals 204e of the second semiconductor 204 and the electrode terminals 207 on the wiring board 201 are connected with a bonding wire 208.

Note that the external connection protruding electrodes 202e of the first semiconductor element 202 are made up of a metal alloy material with the primary components being gold (Au), copper (Cu), or nickel (Ni) or the like, a soldering material with the primary components being tin (Sn) and silver (Ag), or tin (Sn), silver (Ag), and copper (Cu), or a conductive resin material including metal particles such as silver (Ag), for example.

Also, the underfill material 206 is formed with the primary component being an insulating resin with thermosetting properties, or heat plasticization, and for example an epoxy-type, polymide-type, acrylic-type, or silicone-type may be employed.

Note that the amount of underfill material 206 to be employed is relatively small, so whether or not this has similar physical properties as the sealing member is not of concern.

As a featured configuration of the present embodiment, a long conductive pad 209 having the same length as the length of the edge of the semiconductor element 204 is placed along the edge of the second semiconductor element 204, on the wiring board 201 near both end portions in the lengthwise direction of the second semiconductor element 204.

Convex-shaped members serving as bumps 210 are placed on the conductive pad 209 so as to be positioned roughly directly below each of the plural electrode terminals 204e on the second semiconductor element 204.

A sealing resin 211 coats the main face on the one side of the wiring board 201 so as to cover the semiconductor element 202 and semiconductor element 204, as well as the bonding wire 208 and the like.

Further, external connection terminals 213 made of solder balls (solder bumps) are placed on the electrode terminals 212 which are placed in grid form, on the other main face of the wiring board 201.

According to this configuration, the first semiconductor element 202 is mounted with the flip-chip method, so leading the bonding wire from the semiconductor element 202 and placing electrode terminals on the wiring board 201 in the periphery of the semiconductor element 202 is not necessary, so the size of the semiconductor device is not increased.

Note that by employing the external connection protruding electrodes 202e, the height of the back face of the first semiconductor element 202, i.e. the separation distance (spacing) between the second semiconductor element 204 mounted on the first semiconductor element 202 and the surface of the wiring board 201, becomes large. However, by selecting the thickness of the second semiconductor element 204 and height of the bumps 210, the flexing amount of the second semiconductor element 204 at the time of wire bonding can be restricted, thereby preventing damage to the second semiconductor element 204.

The manufacturing method of the semiconductor device 200 according to the second embodiment will be described with reference to FIGS. 10A through 12D.

Figure 10A:
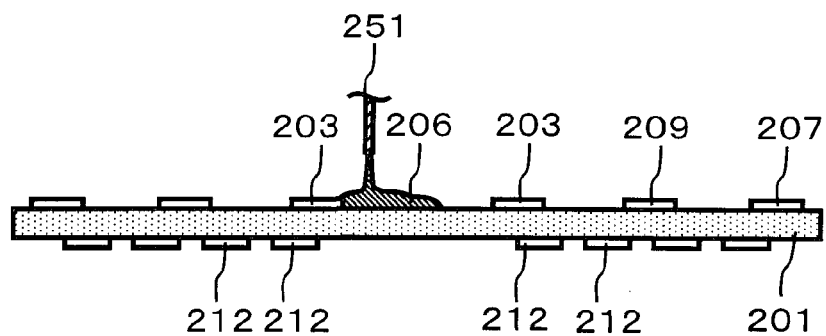
FIGS. 10A to 10D are a cross-sectional diagram illustrating a manufacturing process of the semiconductor device according to the second embodiment.

First, the wiring board 201 on which the electrode terminals 204 and 207, along with the electrode terminal 212 and so forth are placed on the main face thereof is prepared, and the underfill material 206 is fixed to a mounting planning portion of the first semiconductor element 202 on one of the:main faces of the wiring board 201 (semiconductor element mounting face) (see FIG. 10A).

The wiring board 201 takes a many-layer wiring configuration as needed. Also the underfill material 206 is selectively dispelnsed onto the wiring board 201 via a nozzle 251.

Next, the wiring board 201 is mounted on a bonding stage (not shown) for a flip-chip bonder, and wiring board 201 is heated to a predetermined temperature with a heater placed on the bonding stage, to 50° C. to 150° C., for example.

Figure 10B:
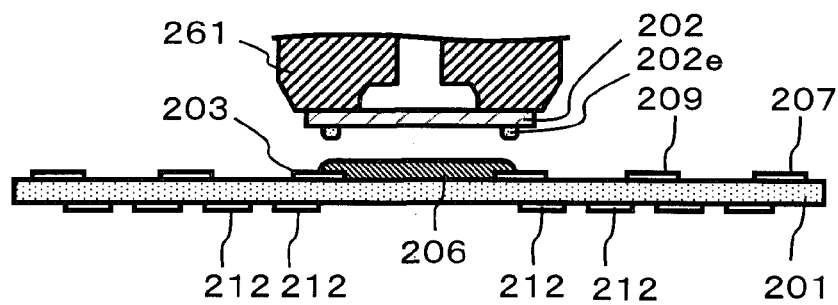

The first semiconductor element 202 to which the back face thereof (electronic circuit non-forming face) is held by the bonding tool 261, which is heated to a predetermined temperature, e.g. 150° C. to 300° C beforehand, is positioned on the wiring board 201 (see FIG. 10B).

Figure 10C:
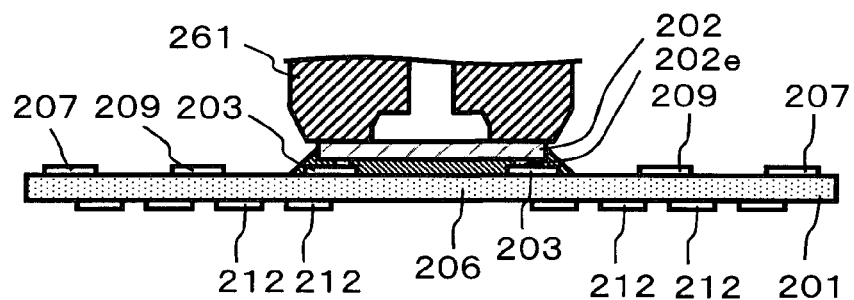

Along with the pressure and heating by the bonding tool 261, the external connection protruding electrodes 202e of the first semiconductor element 202 is connected to the electrode terminal 203 of the wiring board 201 (see FIG. 10C).

That is to say, the first semiconductor element 202 is mounted in a face-down state.

Figure 10D:
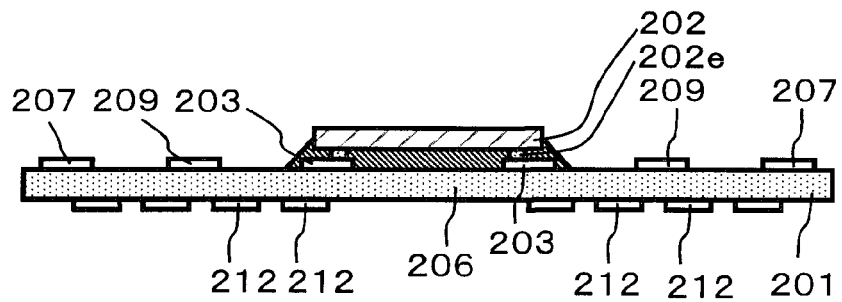

Consequently, the underfill material 206 fills in the space between the first semiconductor element 202 and wiring board 201, while spreading out in skirt form in the periphery of the first semiconductor element 202, and hardens (see FIG. 10D).

With such an underfill material 206 placement, connection of the external connection protruding electrodes 202e of the first semiconductor element 202 to the electrode terminals 201e of the wiring board 201 can be strengthened, while the entry of moisture and so forth into the space between the first semiconductor element 202 and wiring board 201 is prevented.

Next, the wiring board 201 is mounted on a bonding stage (not shown) of a wire bonder, and this is heated to a predetermined temperature with a heater placed on the bonding stage, to 100° C. to 200° C., for example.

Figure 11A:
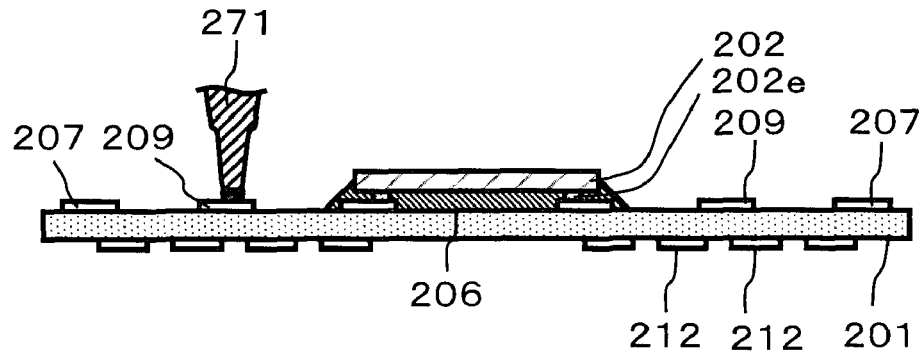
FIGS. 11A to 11C are a cross-sectional diagram illustrating a manufacturing process of the semiconductor device according to the second embodiment, and illustrates a manufacturing process which follows the manufacturing process illustrated in FIGS. 10A to 10D.

A so-called ball bonding method which uses a bonding capillary 271 is employed, whereby plural bumps 210 are formed on the surface of the long conductive pad 209 of the wiring board 201 (see FIG. 11A).

The placement of the bumps 210 on the surface of the conductive pad 209 is performed so as to correspond to the positions where the external connection electrode terminals of the second semiconductor element 204 are placed.

Figure 11B:
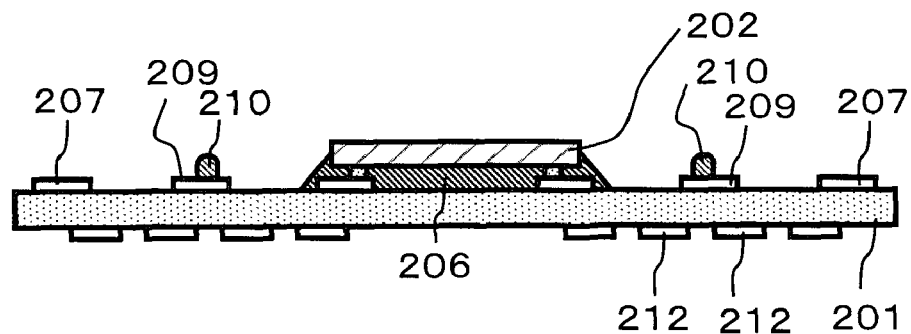

Let us say that the height of the bumps 210 is roughly the same as the height of the position of the back face of the first semiconductor element 202, or slightly lower (see FIG. 11B).

That is to say, the height of the bumps 210 is roughly the same height as the height made up from the thickness of the first semiconductor element 202 including the external connection protruding electrodes 202e, or a height slightly lower than this. In the case that the height of the bumps 210 is a height slightly lower than the height made up from the thickness of the first semiconductor element 202 including the external connection protruding electrodes 202e, the height thereof is a height whereby the flexing amount of the second semiconductor element 204 which is placed with a later process and subjected to wire bonding does not exceed an allowed value.

Next, the wiring board 201 is mounted on a die-bonder bonding stage (not shown), and this is heated to a predetermined temperature, e.g. 50° C. to 200° C. with a heater placed on the bonding stage.

Figure 11C:
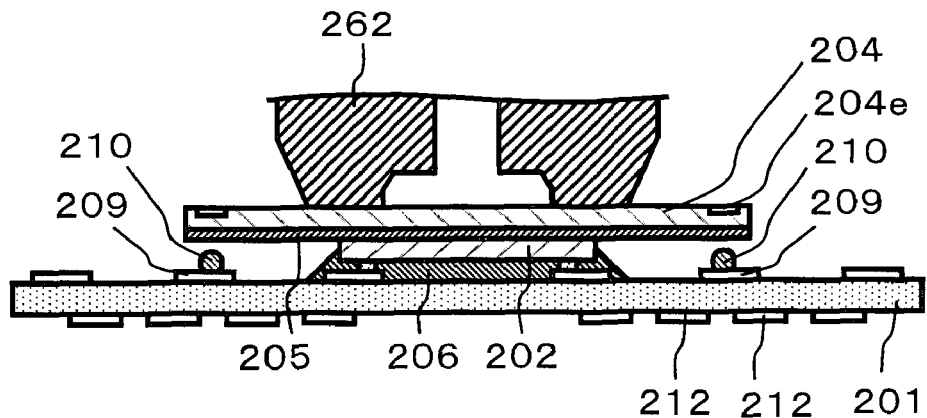

The second semiconductor element 204 of which the upper face (electronic circuit forming face) is adhered with a vacuum collet 262 is mounted on the first semiconductor element 202, and in accordance with the pressure from the vacuum collet 262, the second semiconductor element 204 is affixed to the first semiconductor element 202 with an adhesive layer 205 which is selectively placed on the back face of the second semiconductor element 204 or the upper face of the first semiconductor element 202 beforehand (see FIG. 11C).

Consequently, the bumps 210 become positioned roughly directly below each of the external connection electrode terminals 204e of the second semiconductor element 204.

After this, the wiring board 201 is mounted on a bonding stage for wire bonding (not shown), and this is heated to a predetermined temperature, e.g. 100° C. to 200° C. with a heater placed on the bonding stage.

Figure 12A:
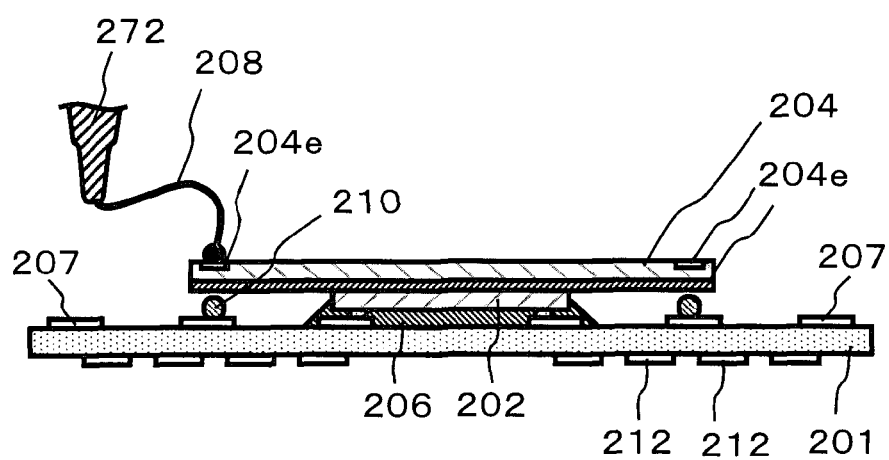
FIGS. 12A to 12D are a cross-sectional diagram illustrating a manufacturing process of the semiconductor device according to the second embodiment, and illustrates a manufacturing process which follows the manufacturing process illustrated in FIGS. 11A to 11C.

The leading end of the bonding wire 208 is connected to the external connection electrode terminal 204e of the second semiconductor element 204 with the ball bonding method employing a bonding capillary 272 (see FIG. 12A).

In the case of such bonding wire 208 connection, the portion of the second semiconductor element 204 subjected to wire bonding is mechanically supported with the bumps 210, and bending of the second semiconductor element 204 is suppressed, thereby preventing damage thereto.

Also, the absorption of ultrasonic vibration energy is prevented, pressure is effectively applied, and the bonding wire 208 is connected to the external connection electrode terminal 204e of the second semiconductor element 204 in a sure manner.

That is to say, with the wiring board 201, the bumps 210 are positioned roughly directly below the external connection electrode terminals 204e of the second semiconductor element 204, and resists the pressure in the event of connecting the bonding wire 208 as to the external connection electrode terminals 204e of the second semiconductor element 204.

Figure 12B:
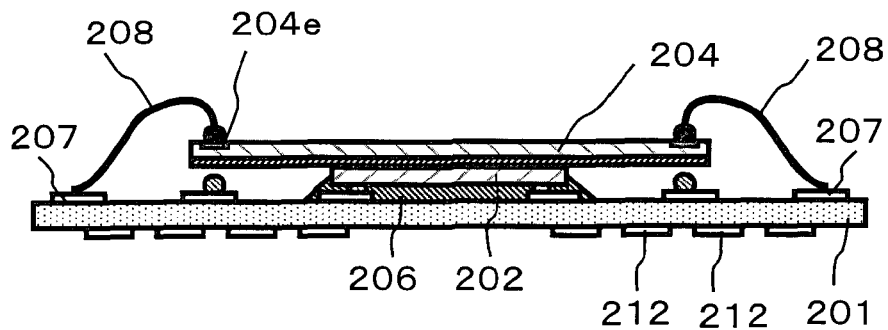

Following such wire bonding, the other end (trailing end) of the bonding wire 208 is connected as to the electrode terminal 207 on the wiring board 201 by a stitch bonding method (see FIG. 12B).

At this time, the bonding wire 208 has a predetermined looping form.

Figure 12C:
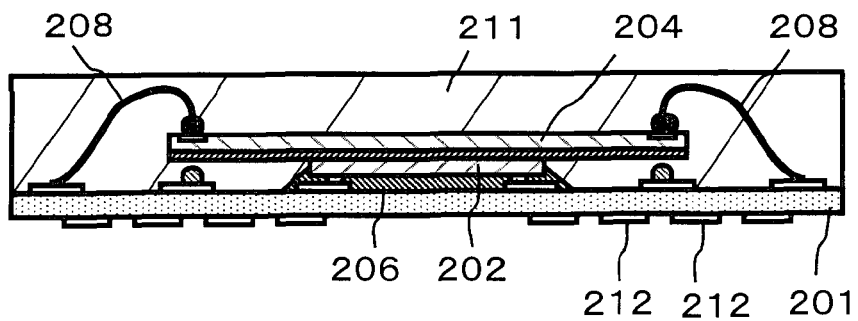

Next, the layered structure of the semiconductor element formed on the main face of the wiring board 201 is coated along with the bonding wire with a sealing resin 211 (see FIG. 12C).

As a resin coating method, a transfer mold method, compression mold method, or potting method can be employed, as described above.

Note that in the case of such resin sealing also, the extended portion of the second semiconductor element 204 is supported with bumps 210. Accordingly, bending of the second semiconductor element 204 by the in-flow pressure of the sealing resin 211 which may occur with a transfer mold method or the like is suppressed, and damage thereto is prevented.

Figure 12D:
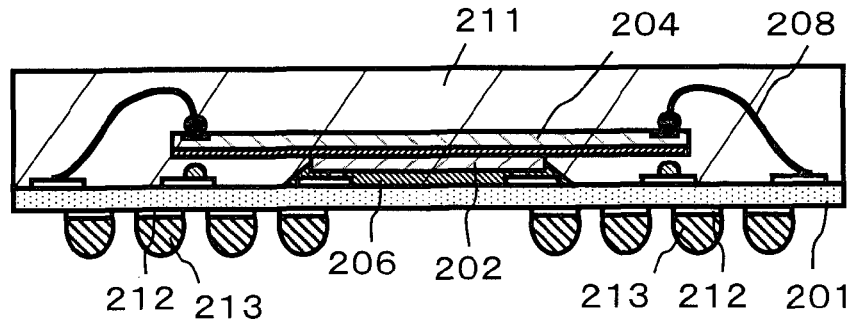

After this, external connection terminals 213 made from solder ball electrodes are placed on the electrode terminal 212 on the other main face of the wiring board 201, employing a reflow soldering method or the like, thus forming the semiconductor device 200 (see FIG. 12D).

Note that in the case of using a process wherein the wiring board 201 is a large board, and multiple layered structures of semiconductor elements are formed on one main face of the wiring board 201 (not shown), after forming the external connection terminal 213, the resin sealing unit 211 and wiring board 201 are disconnected in the layered direction thereof (thickness direction), thereby obtaining an individual semiconductor device 200.

Figure 13A:
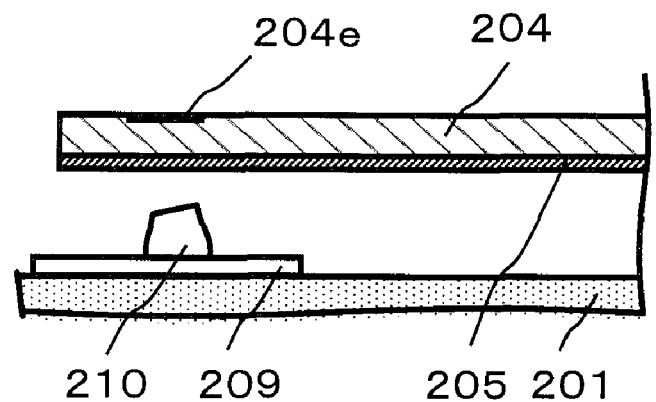
FIGS. 13A and 13B are a diagram illustrating a disposal state of bumps and a bonding wire connection modification example of the semiconductor device according to the first embodiment.

Also, in the case that the extension amount (length) from the first semiconductor element 202 with the second semiconductor element 204 is great, as a protruding portion upper face shape of the bumps 210, "downward sloped face along the extension direction of the second semiconductor element 204 from the first semiconductor element 202 side" which is described with reference to FIG. 5A above can also be employed (see FIG. 13A).

Figure 13B:
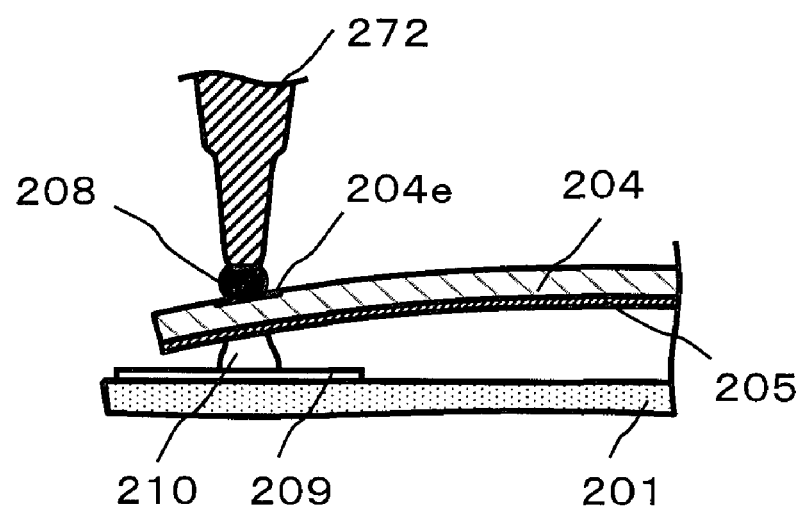

With such a configuration, in the event of wire bonding to the external connection electrode terminals 204e of the second semiconductor element 204, the bumps 210 come in contact with the bend occurring with the semiconductor element 204, in a face contact state (see FIG. 13B).

Thus, bending of the semiconductor element 204 is suppressed, and damage thereto is prevented.

(Third Embodiment)

A third embodiment of the semiconductor element will be described with reference to FIGS. 14A through 22B.

The semiconductor device according to the third embodiment comprises a first semiconductor element which is mounted on a wiring board serving as a supporting base in a face-up state, with an external connection electrode terminal of the first semiconductor element being connected to an electrode terminal on the wiring board with a wire bonding method; a second semiconductor element which is mounted on the first semiconductor element in a face-up state, with an external connection electrode terminal of the second semiconductor element being connected to an electrode terminal on the wiring board with a wire bonding method; and a third semiconductor element which is mounted on the second semiconductor element in a face-up state, with an external connection electrode terminal of the third semiconductor element being connected to an electrode terminal on the wiring board with a wire bonding method.

Figure 14A:
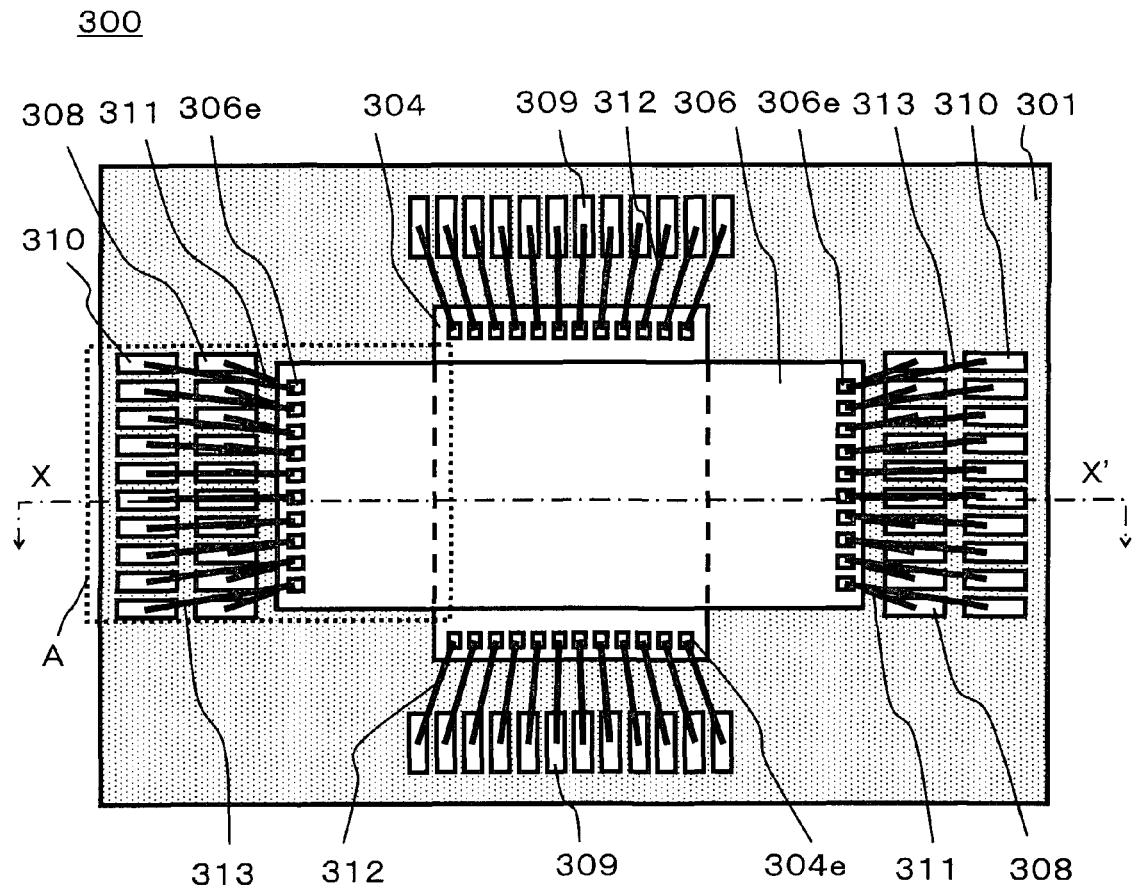
FIGS. 14A and 14B are a diagram illustrating a semiconductor device according to a third embodiment.
Figure 14B:
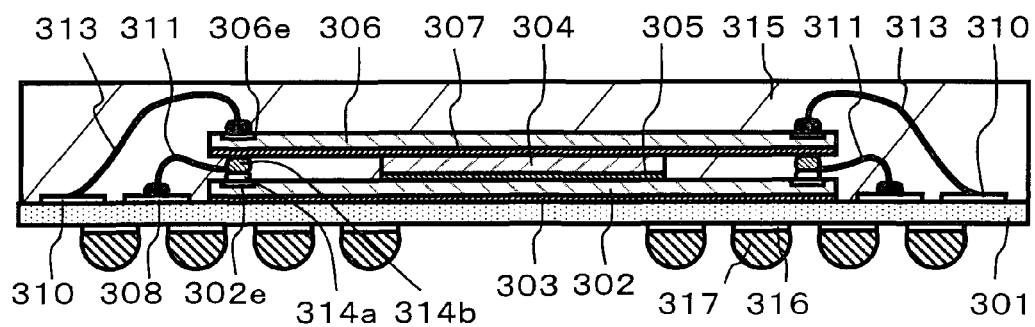

The semiconductor device 300 according to the third embodiment is shown in FIGS. 14A and 14B.

FIG. 14A shows a flat surface of the semiconductor device 300, and FIG. 14B shows an X-X' cross-section of FIG. 14A. Note that in FIG. 14A, display of a resin sealing portion is omitted, and the external form thereof is shown with a solid line.

With the semiconductor device 300, three semiconductor elements are disposed in layers on the main face on one side of the wiring board 301 serving as a supporting base.

That is to say, a first semiconductor element 302 is mounted in a so-called face-up state on the wiring board 301 via an adhesive layer 303, a second semiconductor element 304 is mounted in a face-up state on the first semiconductor element 302 via an adhesive layer 305, and further, a third semiconductor element 306 is mounted in a face-up state on the second semiconductor element 304 via an adhesive layer 307.

The first semiconductor element 302 has a rectangular shape, and is mounted in one direction (X direction) on the wiring board 301.

The second semiconductor element 304 also has a rectangular shape, and is mounted on the first semiconductor element 302 so as to extend (protrude) past the width of the first semiconductor element 302 in the Y direction in wing form (cantilever form). Therefore, the extended (protruding) portion of the second semiconductor element 304 and the supporting board 301 are separated at the side portions of the first semiconductor element 302.

Further, the third semiconductor element 306 also has a rectangular shape, and is mounted in the same direction as the first semiconductor element 302 (X direction) on the second semiconductor element 304, so is mounted so as to be positioned roughly directly above the first semiconductor element 302.

That is to say, the first through third semiconductor elements are disposed in a layered manner in a state wherein the semiconductor elements positioned mutually above or below is intersected roughly orthogonally.

The second semiconductor element 304 is positioned between the first semiconductor element 302 and the third semiconductor element 306, thus forming an intermediate member.

With such a configuration, plural external connection electrode terminals 302e of the first semiconductor element 302 are each placed along two sides that differ from the two extending sides of the second semiconductor element 304.

Also, plural external connection electrode terminals 304e of the second semiconductor element 304 are each placed along two sides on both edges of the second semiconductor element 304 in the lengthwise direction.

Further, plural external connection electrode terminals 306e of the third semiconductor element 306 are each placed along two sides that differ from the two extending sides of the second semiconductor element 304, and are positioned roughly directly above the external connection electrode terminal 302e of the first semiconductor element 302.

On the other hand, electrode terminals 308 are placed on the main face of the wiring board 301 so as to correspond to the external connection electrode terminals 302e of the first semiconductor element 302, and also electrode terminals 309 are placed on the main face of the wiring board 301 so as to correspond to the external connection electrode terminals 304e of the second semiconductor element 304.

Further, plural electrode terminals 310 corresponding to the external connection electrode terminals 306e of the third semiconductor element 306 are placed parallel to the array of electrode terminals 308 which correspond to the first semiconductor element 302.

The external connection electrode terminals 302e of the first semiconductor element 302 and the electrode terminal 308 on the wiring board 301 are connected with a bonding wire 311, employing a reverse bonding method.

on the other hand, the external connection electrode terminals 304e of the second semiconductor element 304 and the electrode terminals 309 on the wiring board 301 are connected with a bonding wire 312, employing a forward bonding method. Also, the external connection electrode terminals 306e of the third semiconductor element 306 and the electrode terminal 310 on the wiring board 301 are also connected with a bonding wire 311, employing a forward bonding method.

As a featured configuration of the present embodiment, with the external connection electrode terminal 302e of the first semiconductor element 302, a bump which is a convex-shaped member is placed at the trailing end of the bonding wire 311 connected to the external connection electrode terminals 302e.

That is to say, a bump 314a is placed on the external connection electrode terminal 302e of the first semiconductor element 302, the trailing end of the bonding wire 311 is connected to the bump 314a, and a second bump 314b is further placed on the trailing end portion of the bonding wire 311. The bump 314 having this layered configuration is positioned roughly directly below the external connection electrode terminals 306e of the third semiconductor element 306.

Note that the extension amount (length) of the second semiconductor element 304 from the first semiconductor element 302 is small.

Accordingly, placing a long conductive pad along the sides of the second semiconductor element 304, and placing bumps to correspond to the external connection electrode terminals 304e of the second semiconductor element 304 on the conductive pad, are not performed with the wiring board 301.

In a case such as the extension amount (length) of the second semiconductor element 304 from the first semiconductor element 302 is great, placing bumps is performed as needed.

A sealing resin 315 coats one main face of the wiring board 301 so as to cover the semiconductor elements 302, 304, and 306 as well as the bonding wires 311, 312, and 313 and so forth.

Further, external connection terminals 317 made of solder balls (solder bumps) are placed on the electrode terminals 316 which are placed in a grid form, on the other main face of the wiring board 301.

With such a semiconductor device 300, in the event of connecting the portion of the third semiconductor element 306 mounted on the second semiconductor element 304 which is separated from the first semiconductor element 302, i.e. the external connection electrode terminal 306e positioned at the extended portion from the second semiconductor element 304, with the bonding wire, the portion of the third semiconductor element 306 to be subjected to wire bonding is mechanically supported by the bumps 314 placed on the external connection electrode terminals 302e of the first semiconductor element 302, whereby bending of the third semiconductor element 306 is suppressed, and damage thereof is prevented.

Also, pressure from the bonding capillary is effectively applied, and the bonding wire 313 is connected to the external connection electrode terminal 306e of the third semiconductor element 306 in a sure manner.

At this time, the first semiconductor element 302 has a small amount of warping or waving as compared to the wiring board 301. Accordingly, in the case of placing multiple bumps 314 on the external connection electrode terminals 302e of the first semiconductor element 302, these bumps are formed with the height of the upper face thereof more evenly formed.

Accordingly, in the case of wire bonding processing as to the external connection electrode terminals 306e of the third semiconductor element 306, the third semiconductor element 306 can be supported in a more sure manner.

Also, by further placing bumps 314b on the bonding wire 311 connected to the bumps 314a on the external connection electrode terminals 302e, the connection between the bonding wire 311 and the external connection electrode terminals 302e are strengthened, and the reliability of the semiconductor device 300 can be improved.

Next, the manufacturing method of the semiconductor device 300 having such a configuration will be described with reference to FIGS. 15A through 17D.

Figure 15A:
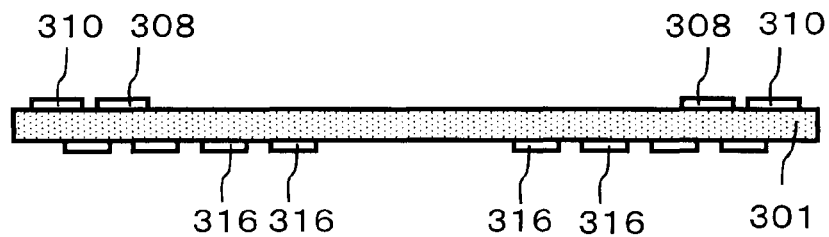
FIGS. 15A to 15E are a cross-sectional diagram illustrating a manufacturing process of the semiconductor device according to a third embodiment.

First, the wiring board 301 whereupon the electrode terminals 308, 309, 310, and 316 and the like are placed on the surface thereof is mounted on a die-bonder bonding stage (not shown) of a die-bonder(see FIG. 15A).

The wiring board 301 is then heated to a predetermined temperature, e.g. 50° C. to 200° C. with a heater placed on the bonding stage.

Figure 15B:
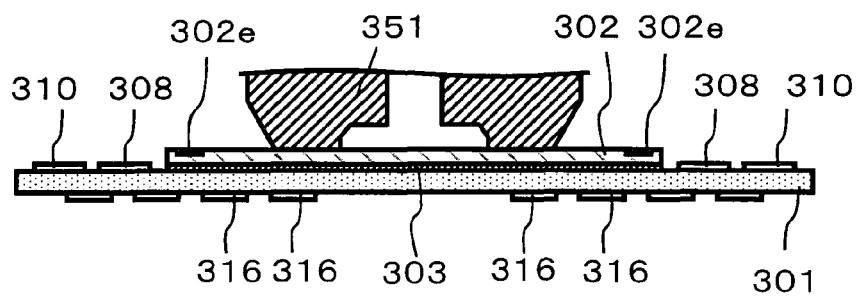

Next, the first semiconductor 302 of which the upper face (electronic circuit forming face) is held with a vacuum collet 351 is mounted on the wiring board 301, and in accordance with the pressure from the vacuum collet 351, the first semiconductor element 302 is affixed to the wiring board 301 with an adhesive layer 303 which is selectively placed on the back face of the first semiconductor element 302 or the upper face of the wiring board 301 beforehand (see FIG. 15B).

Figure 15C:
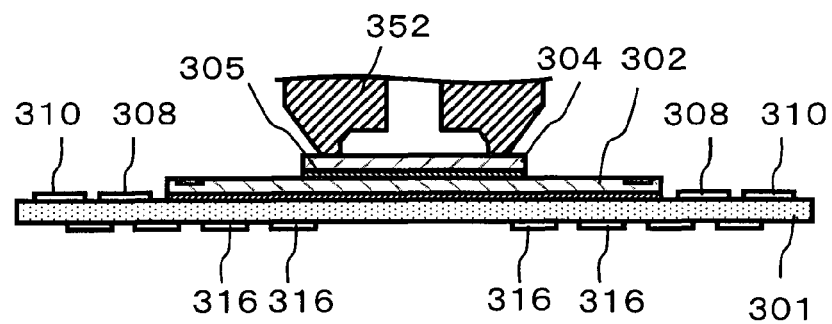

Next, the second semiconductor element 304 of which the upper face (electronic circuit forming face) is adsorbed with the vacuum collet 351 is mounted on the first semiconductor element 302, and following the pressure of the vacuum collet 352, the second semiconductor element 304 is affixed to the first semiconductor element 302 by an adhesive layer 305 which is selectively placed on the back face of the second semiconductor element 304 or the upper face of the first semiconductor element 302 beforehand (see FIG. 15C).

The adhesive layer 305 is placed beforehand by drawing or gluing or the like.

Note that a thermo-setting resin may be employed as the adhesive. In such a case, following mounting the first semiconductor element 302 on the wiring board 301, this may be heated by a thermostatic bath or hot plate or the like to 120° C. to 240° C., for example, whereby the adhesive is semi-hardened.

Next, the wiring board 301 is mounted on the bonding stage (not shown) of a wire bonder, and this is heated to a predetermined temperature, e.g. 100° C. to 200° C., with the heater placed on the bonding stage.

Figure 15D:
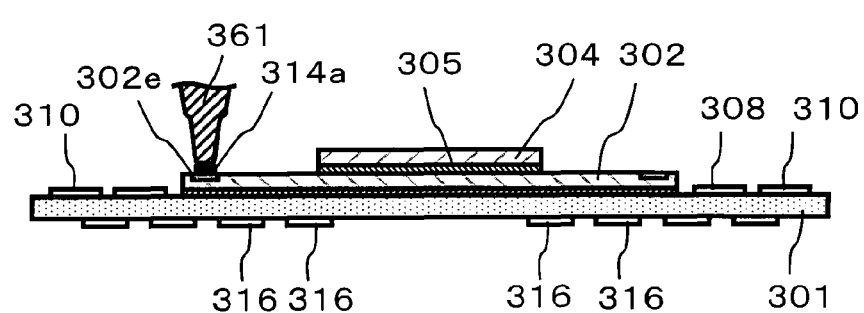
Figure 15E:
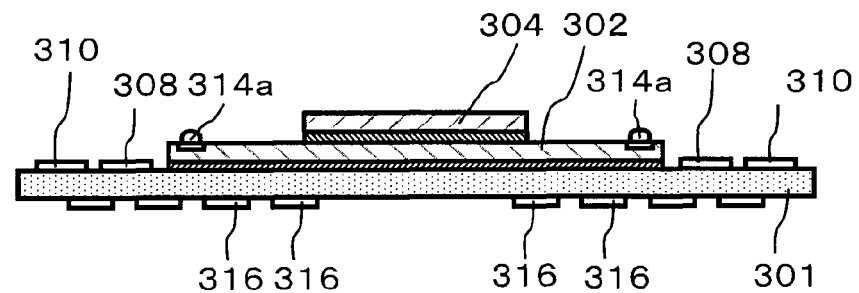

A so-called ball bonding method which uses a bonding capillary 361 is employed, whereby bumps 341a are formed on the surface of each of the external connection electrode terminals 302e of the first semiconductor element 302 (see FIGS. 15D and 15E).

Next, a reverse bonding method which uses a bonding capillary 371 is employed, whereby the ball portion which is the leading end of the bonding wire 311 is connected to the electrode terminal 308 on the wiring board 301.

Figure 16A:
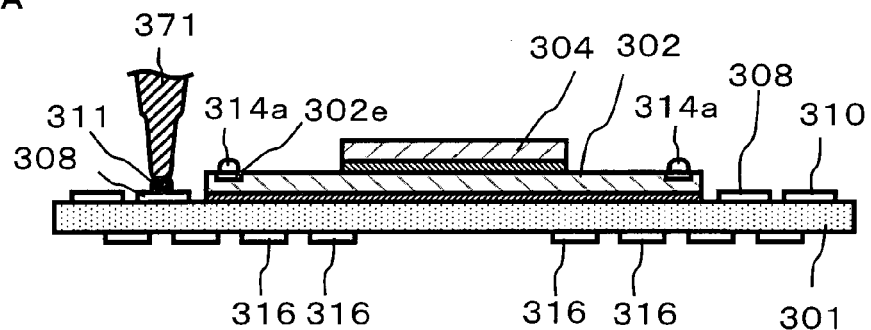
FIGS. 16A to 16E are a cross-sectional diagram illustrating a manufacturing process of the semiconductor device according to the third embodiment, and:illustrates a manufacturing process which follows the manufacturing process illustrated in FIGS. 15A to 15E.
Figure 16B:
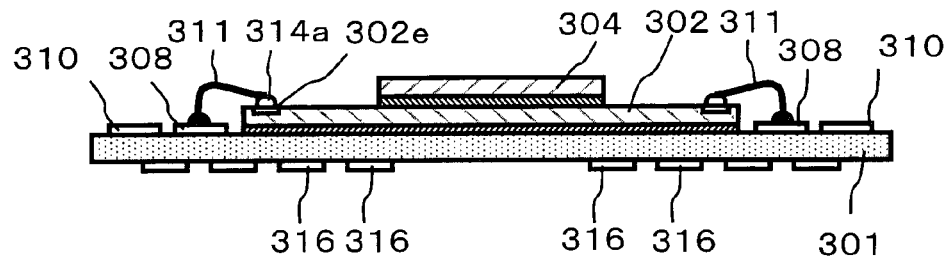

The other end (trailing end) of the bonding wire 311 is connected to the bump 314a which is placed on the external connection electrode terminal 304e of the first semiconductor element 304 (see FIGS. 16A and 16B).

At this time, the bonding wire 311 has a predetermined looping form.

Figure 16C:
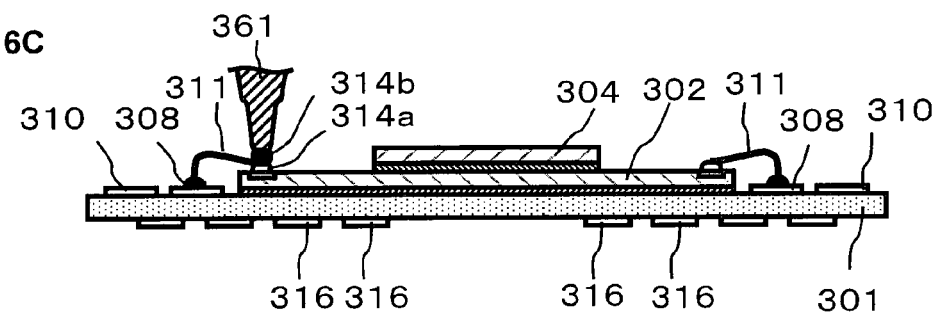
Figure 16D:
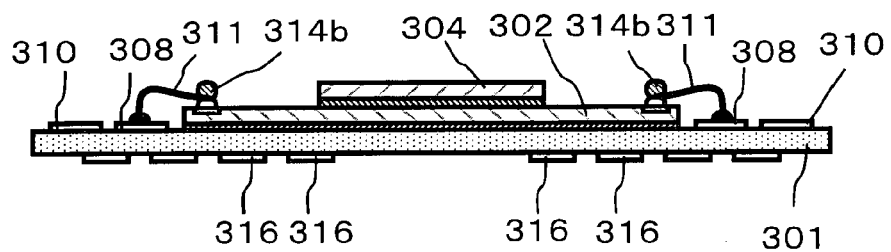

After this, the so-called ball bonding method which uses a bonding capillary 361 is employed, whereby a second bump 314b is formed on the trailing end portion of the bonding wire 311 which is connected to the bump 314a (see FIGS. 16C and 16D).

That is to say, the bump 314a and bump 314b make up the bump 314 in a layered configuration.

Next, the wiring board 301 is mounted on a die-bonder bonding stage (not shown), and this is then heated to a predetermined temperature, e.g. 50° C. to 200° C. with a heater placed on the bonding stage.

Figure 16E:
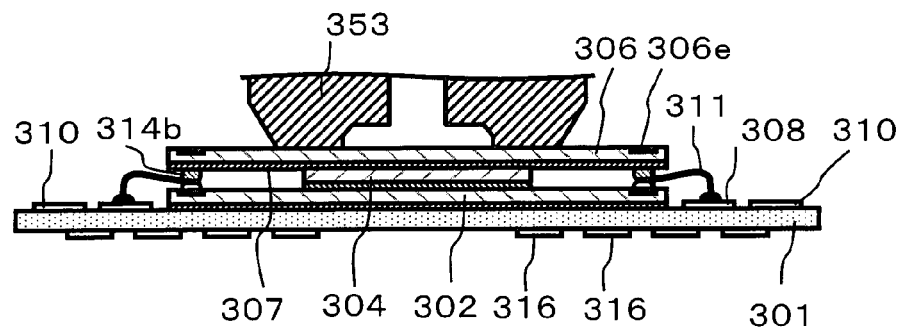

The third semiconductor element 306 of which the upper face (electronic circuit forming face) is held with the vacuum collet 353 is mounted on the second semiconductor element 304, and following the pressure of the vacuum collet 353, the third semiconductor element 306 is affixed to the second semiconductor element 304 by an adhesive layer 307 which is selectively placed on the back face of the third semiconductor element 306 or the upper face of the second semiconductor element 304 beforehand (see FIG. 16E).

At this time, the external connection electrode terminals 306e of the third semiconductor element 306 are positioned roughly directly above the bumps 314 placed on the external connection electrode terminals 302e of the first semiconductor element 302.

Note that in the case of placing the adhesive layer 307 over the entire face of the back face of the third semiconductor element 306, the bump 314 and the back face of the third semiconductor element 306 may be affixed via the adhesive layer 307.

Next, the wiring board 301 is mounted on the bonding stage (not shown) of a wire bonder, and this is heated to a predetermined temperature, e.g. 100° C. to 200° C., with the heater placed on the bonding stage.

Figure 17A:
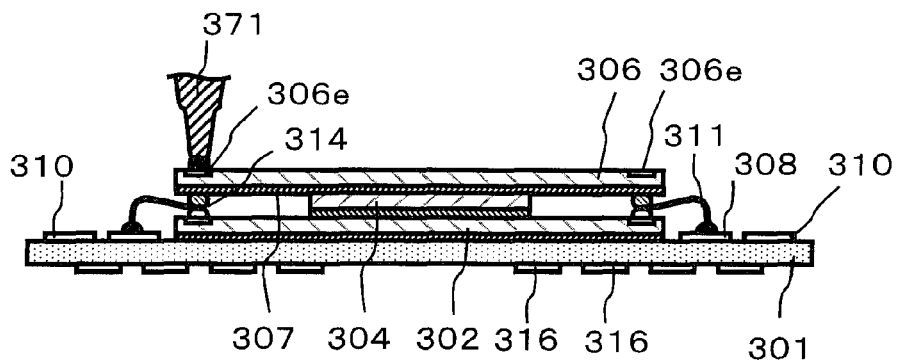
FIGS. 17A to 17D are a cross-sectional diagram illustrating a manufacturing process of the semiconductor device according to the third embodiment, and illustrates a manufacturing process which follows the manufacturing process illustrated in FIGS. 16A to 16E.

The leading end of the bonding wire 313 is connected to the external connection electrode terminal 306e of the third semiconductor element 306 by using the bonding capillary 371 (see FIG. 17A).

In the case of such a bonding wire 313 connection, the portion of the third semiconductor element 306 subjected to wire bonding is mechanically supported with the bumps 314, the bending of the third semiconductor element 306 is suppressed, and damage thereof is prevented.

Also, the absorption of ultrasonic vibration energy is prevented, pressure is effectively applied, and the bonding wire 313 is connected to the external connection electrode terminal 306e of the third semiconductor element 306 in a sure manner.

That is to say, on the wiring board 301, the bumps 314 are positioned roughly directly below the external connection electrode terminals 306e of the third semiconductor element 306, and resist pressure in the event of a bonding wire connection as to the external connection electrode terminals 306e of the third semiconductor element 306.

Figure 17B:
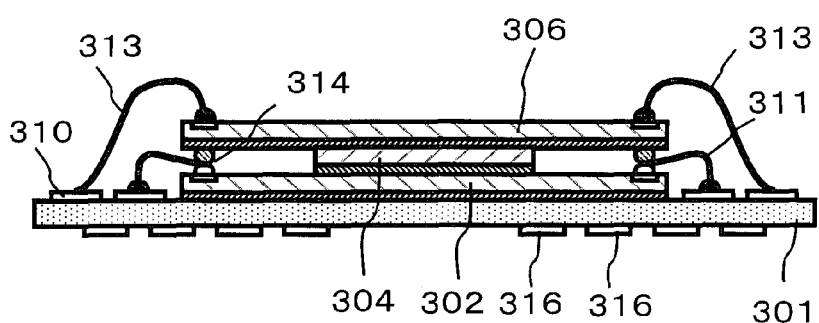

The other end (trailing end) of the bonding wire 313 is connected to the electrode terminal 310 on the wiring board 301 with the stitch bonding method (see FIG. 17B).

At this time, the bonding wire 313 has a predetermined looping form.

Note that before or after the wire bonding processing between the external connection electrode terminal 306e of the third semiconductor element 306 and the electrode terminal 310 on the wiring board 301, the external connection electrode terminals 304e of the second semiconductor element 304 and the electrode terminal 309 on the wiring board 301 are also connected with the wire bonding method using the bonding wire 312 (not shown).

Figure 17C:
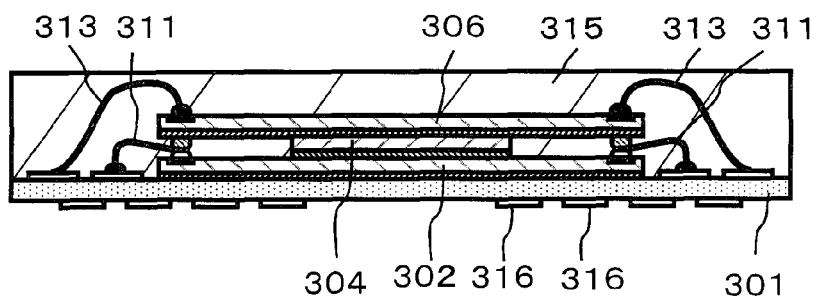

Next, the layered structure of the semiconductor element formed on the main face of the wiring board 301, along with the bonding wire, is coated with the sealing resin 315 (see FIG. 17C).

As a method to perform resin coating, a known transfer mold method, compression mold method, or potting method can be employed.

Note that in the case of resin sealing also, the extended portion of the third semiconductor element 306 is supported by the bumps 314. Accordingly, bending of the third semiconductor element 306 from the in-flow of the sealing resin 315 with a transfer mold method and so forth is suppressed, and modifications and damage are prevented.

Figure 17D:
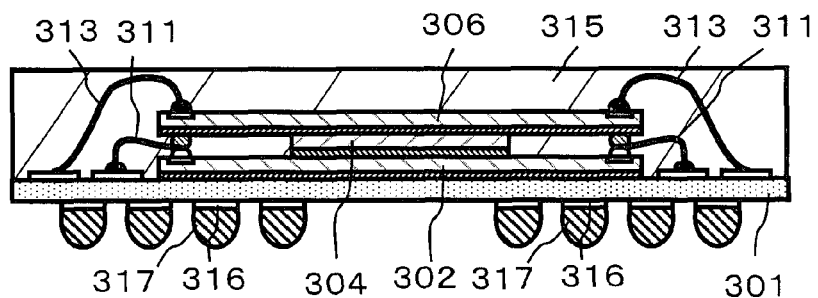

Following this, external connection terminals 317 made up of solder ball electrodes are placed on the electrode terminal 316 on the other main face of the wiring board 301, using a reflow soldering method, whereby the semiconductor device 300 is formed (see FIG. 17D).

Note that in the case of using a process wherein the wiring board 301 is a large board, and multiple layered structures of semiconductor elements are formed on one main face of the wiring board 301 (not shown), after forming the external connection terminal 316, the resin sealing unit 315 and wiring board 301 are disconnected in the layered direction thereof (thickness direction), thereby obtaining an individual semiconductor device 300.

Also, the bumps 314 placed on the surface of each of the external connection electrode terminals 302e of the first semiconductor element 302 can select the placing position and/or placing form as needed.

A modified example of the placing position and/or placing form of the bumps 314 will be described with reference to FIG. 18A to 18C. Note that FIG. 18A to 18C show a rectangular region surrounded with dotted line A in FIG. 14A.

Also, FIG. 18 omits the display of the third semiconductor element 306 mounted on the second semiconductor element 304, the bonding wire 313, and the resin sealing portion 315.

Figure 18A:
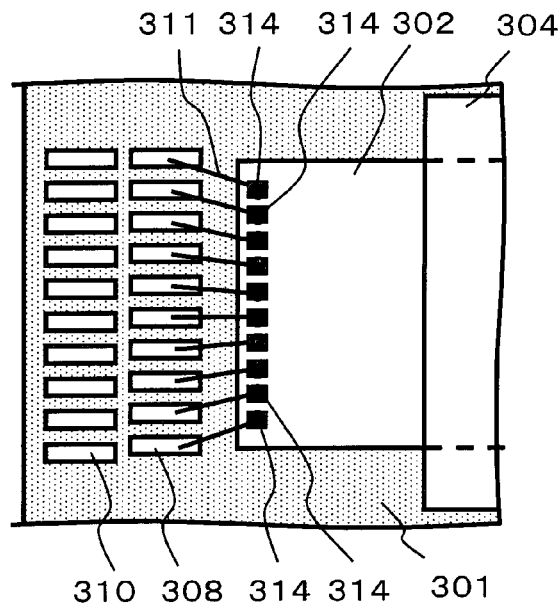
FIGS. 18A to 18C are a plan view illustrating a first disposal state of bumps of the semiconductor device according to the third embodiment.
Figure 18B:
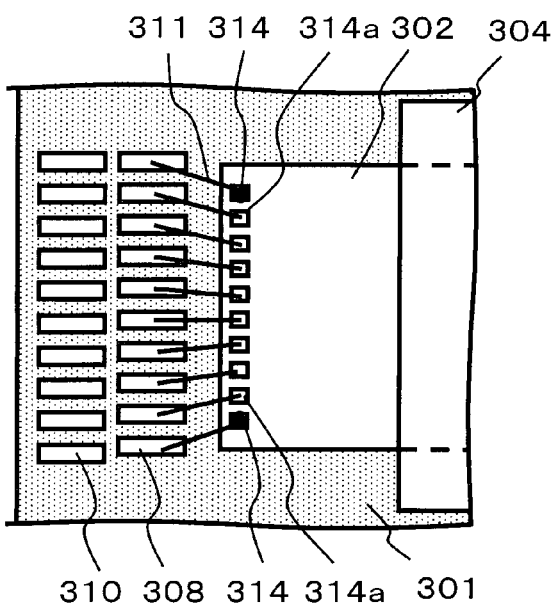
Figure 18C:
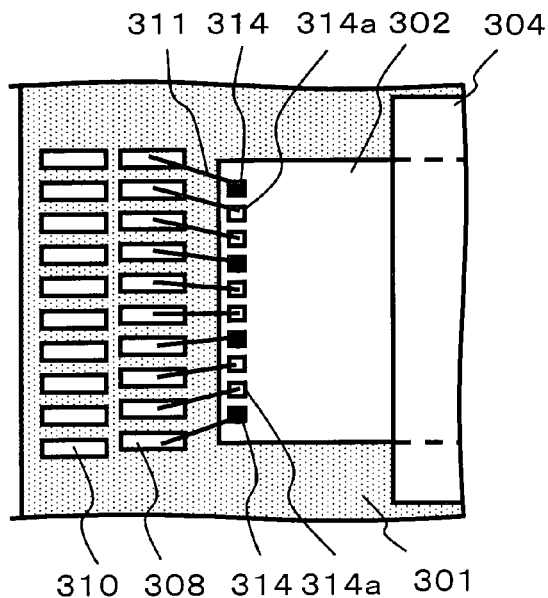

As described above, with the semiconductor device 300, the placing of the bumps 314 onto the external connection electrode terminals 302e of the first semiconductor element 302 is performed as to all of the external connection electrode terminals 302e (ten in the state shown in the diagram) of the first semiconductor element 302 (see FIG. 18A).

With such a configuration, in the case of wire bonding to the plural external connection electrode terminals 306e of the third semiconductor element 306, the bumps 314 positioned directly below the individual electrode terminals which are subjected to bonding respond as to the pressure applied thereto, whereby favorable wire bonding is performed.

However, in such a case, placing at least the number of bumps to correspond to the external connection electrode terminals 306e of the third semiconductor element 306 is necessary.

The bumps 314 take a process of placing the bump 314a onto the external connection electrode terminal 302e of the first semiconductor element 302, connecting the trailing end of the bonding wire 311 onto the bump 314a, and further placing the bump 314b on the trailing end connecting portion of the bonding wire 311.

Employing a bump 314 having such a multi-step configuration can require an increase in time for the placement process of the bump 314, in the case that a semiconductor element serving as the third semiconductor element 306 is employed which has larger semiconductor elements or a large number of external connection electrode terminals 306e having many functions.

On the other hand, in the case that a relatively small or long semiconductor element is employed as the third semiconductor element 306, there may be cases wherein placing the number of bumps 314 corresponding to the external connection electrode terminal of the semiconductor element is not necessary.

In such a case, for example the following types of bump placement configuration can be taken.

One example is that with an external connection electrode terminal 302e array of the first semiconductor element 302, the bumps 314b are placed only on the trailing end portion of the bonding wire 311 to the bump 314a with the external connection terminals positioned on both edge portions (a total of two) (see FIG. 18B).

Another example is that, within an external connection electrode terminal 302e array of the first semiconductor element 302, the bumps 314b are placed as to the trailing end of the bonding wire 311 on the bump 314a with selected plural external connection terminals (four here) (see FIG. 18C).

That is to say, placing the bumps 314b as to all of the bumps 314a connected to the trailing end of the bonding wire 311 is not performed, and the placement locations thereof are appropriately selected.

Thus, by selecting the placing locations for the bumps 314b, i.e. by selecting the placing form of the layered bump 314, efficiency of the bump 314 placement process can be improved.

Also, the placement configuration of the bumps 314 on the external connection electrode terminals 302e of the first semiconductor element 302 can take a form such as the following.

Figure 19A:
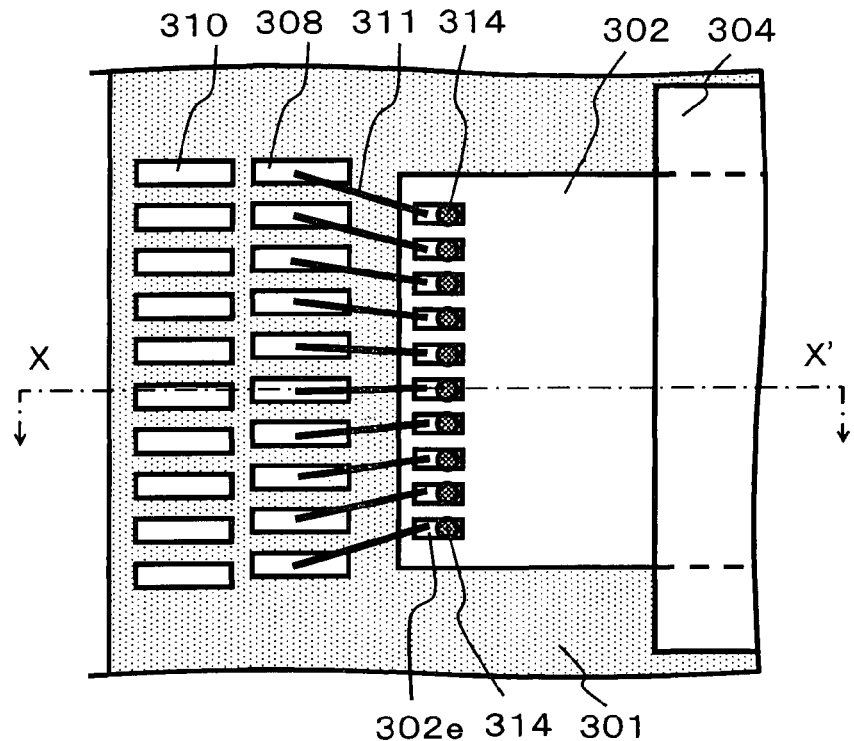
FIGS. 19A to 19C are a diagram illustrating a second disposal state of bumps of the semiconductor device according to the third embodiment.
Figure 19B:
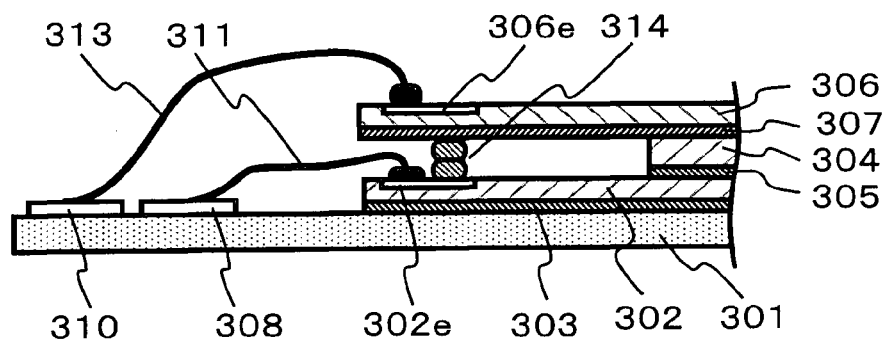
Figure 19C:
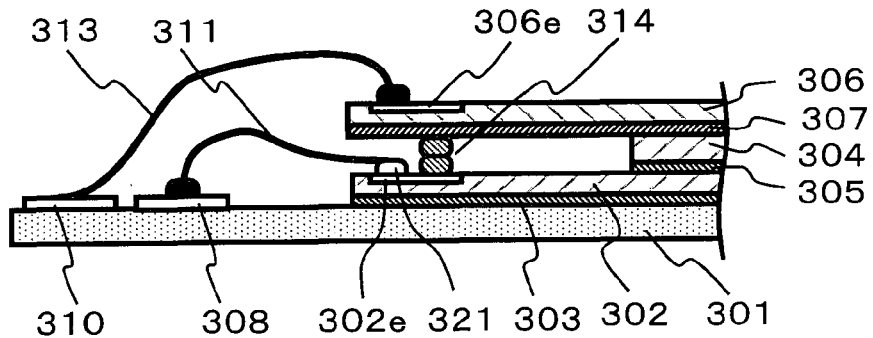

As one example, let us say that the flat face form of the external connection electrode terminals 302e of the first semiconductor element 302 is in a long shape, one edge portion side thereof is the region to be subjected to wire bonding, and near the other edge portion is the placement portion for the bumps 314 (see FIG. 19A).

Note that FIG. 19A also shows the rectangular region surrounded with the dotted line A in FIG. 14A.

FIG. 19A also omits the display of the third semiconductor element 306, the bonding wire 313 which is led from the external connection electrode terminal 306e of the third semiconductor element 306 and connected to the electrode terminal 310, and the resin sealing portion 315.

That is to say, with such a configuration, with the external connection electrode terminal 302e of the first semiconductor element 302, the portion of the bonding wire 311 to be subjected to wire bonding and the placement portions of the bumps 314 are not overlapped.

By using such an electrode terminal configuration, with a wire bonding method as to the external connection electrode terminal 302e of the first semiconductor element 302, either a normal wire bonding method wherein a ball which is the leading end of the bonding wire is connected (see FIG. 19B), or a reverse bonding method wherein the trailing end of the bonding wire is connected (see FIG. 19C), may be selected and employed.

Note that in the event of employing a reverse bonding method, the portion of the external connection electrode terminal 302e to be subjected to wire bonding has a bump 321 placed thereupon beforehand.

With such a separation of portion to be wire bonded and bump placement portion, in the event of wire bonding to the external connection electrode terminal 306e of the third semiconductor element 306, there is no bump directly below the portion of the external connection electrode terminal 306e of the third semiconductor element 306 to be subjected to wire bonding, but the warped portion of the third semiconductor element 306 is effectively supported.

Also, in the event of placing the bump 314a and 314b on the external connection electrode terminal 302e of the first semiconductor element 302 in a layered manner, the bonding wire is not between the two bumps, so the connection between the bumps is further strengthened, and also enables ease of determining the height of the layered bumps. Accordingly, enabling the height of the layered bumps to be roughly the same as that of the upper face of the second semiconductor element 304, and enabling the upper face of the bumps to make contact with the bottom face of the third semiconductor element 306 can be readily performed.

On the other hand, with the first semiconductor element 302, the external connection electrode terminals 302e and the bump placement portions may be separated.

Figure 20A:
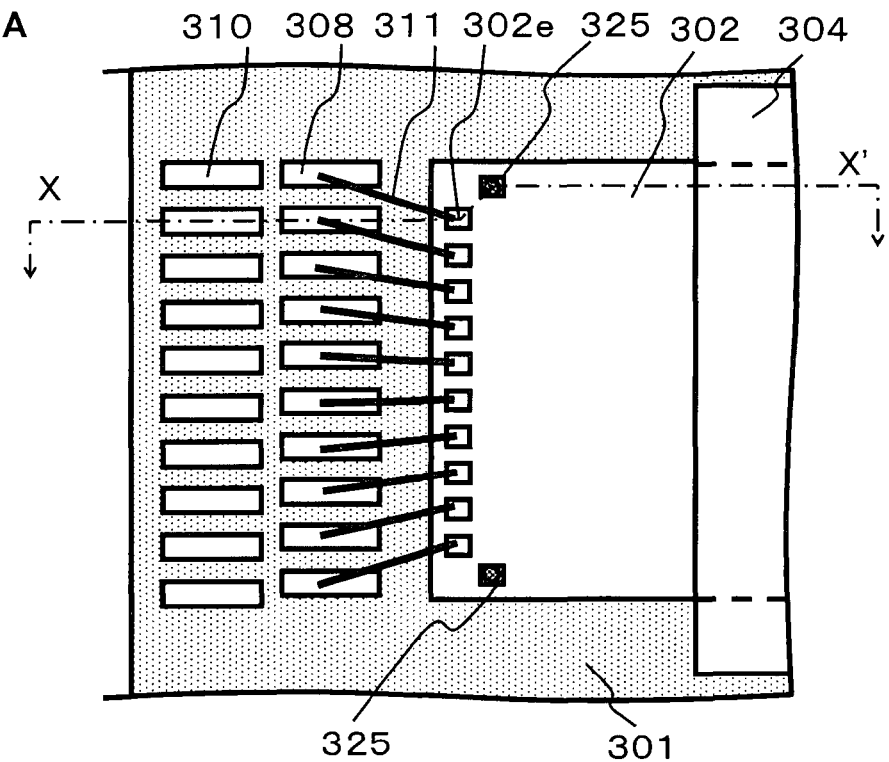
FIGS. 20A to 20C are a diagram illustrating a third disposal state of bumps of the semiconductor device according to the third embodiment.
Figure 20B:
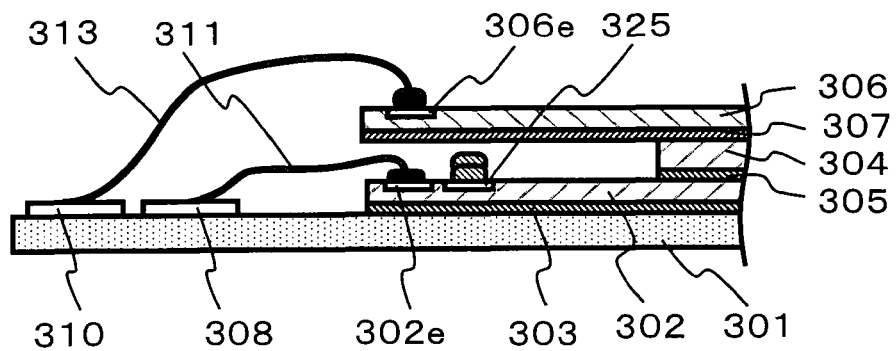
Figure 20C:
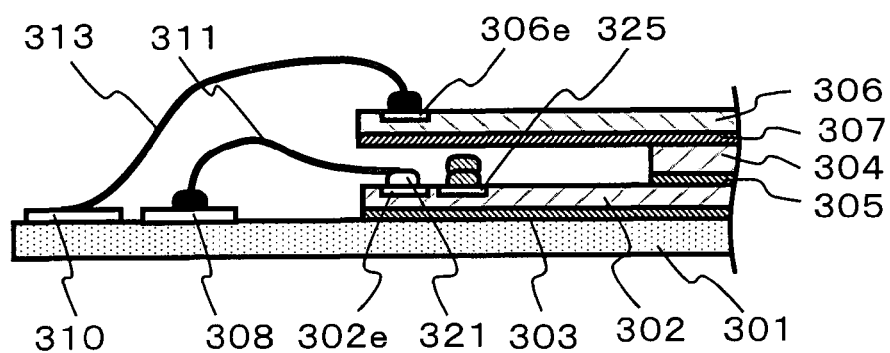

That is to say, the bump placement portion 325 is disposed near the array of external connection electrode terminals 302e, and also in a position different from the array of external connection electrode terminals 302e (see FIG. 20A).

The bump placement portion 325 includes a terminal pad portion formed from material similar as that of the external connection electrode terminal 302e, and at least one bump formed thereupon. Multiple bumps are layered as needed.

FIG. 20A also shows the rectangular region surrounded by the dotted line A in FIG. 14A.

FIG. 20A also omits the display of the third semiconductor element 306, the bonding wire 313 which is led from the external connection electrode terminal 306e of the third semiconductor element 306 and connected to the electrode terminal 310, and the resin sealing portion 315.

With such separate/independent placements of bump placement portions 325, in the event of wire bonding to the external connection electrode terminals 306e of the third semiconductor element 306, there are no bumps directly below the external connection electrode terminals 306e of the third semiconductor element 306, but the warped portions of the third semiconductor element 306 are effectively supported.

By using such an electrode terminal configuration, with a wire bonding method as to the external connection electrode terminal 302e of the first semiconductor element 302, either a normal wire bonding method wherein a ball which is the leading end of the bonding wire is connected (see FIG. 20B), or a reverse bonding method wherein the trailing end of the bonding wire 311 is connected via the bump 321 (see FIG. 20C), may be selected and employed.

Also, in the event of placing the bumps in layers, with the bump placement portion 325 of the first semiconductor element 302, there is no bonding wire between the bumps, so the connection between the bumps is further strengthened, and the height of the layered bumps can be readily determined.

Further, as another means, the external connection electrode terminal 302e of the first semiconductor element 302 and the bump placement portion may be separated.

Figure 21A:
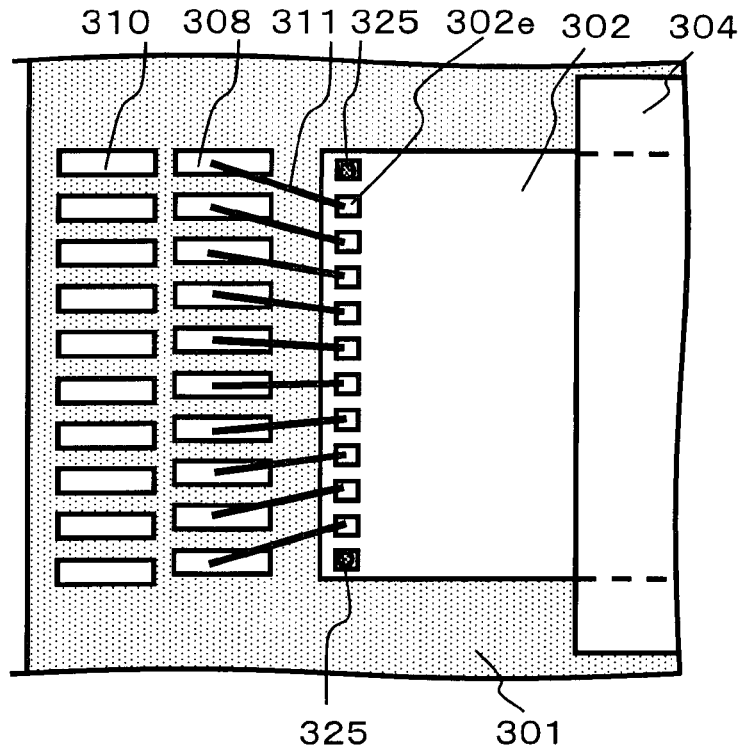
FIGS. 21A to 21C are a plan view illustrating a fourth disposal state of bumps of the semiconductor device according to the third embodiment.
Figure 21B:
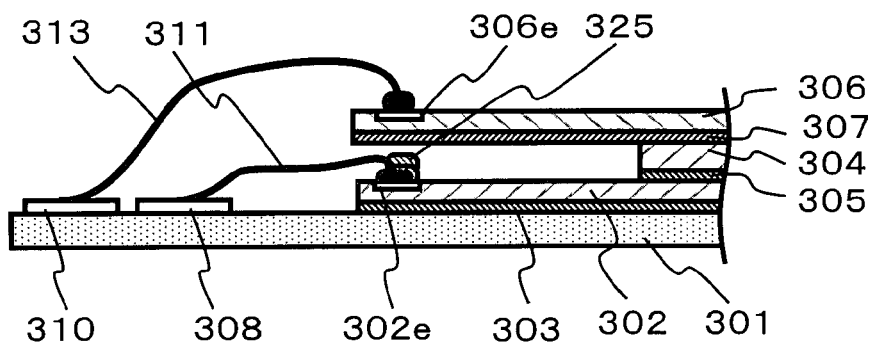
Figure 21C:
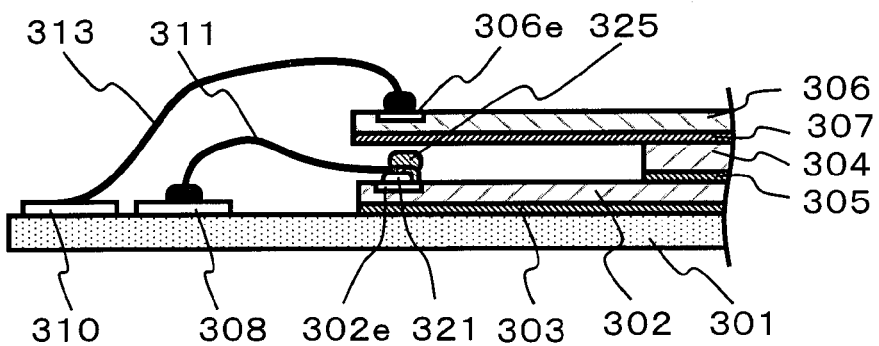

That is to say, the bump placement portions 325 are placed near both edge portions of the external connection electrode terminal 302e array so as to be distanced from the external connection electrode terminal 302e (see FIG. 21A).

Note that FIG. 21A also shows the rectangular region surrounded with the dotted line A in FIG. 14A.

FIG. 21A also omits the display of the third semiconductor element 306, the bonding wire 313 which is led from the external connection electrode terminal 306e of the third semiconductor element 306 and connected to the electrode terminal 310, and the resin sealing portion 315.

With a disposal configuration wherein bump placement portions 325 are separated and independent, there are no bumps directly below the external connection electrode terminals 306e of the third semiconductor element 306 at the time of wire binding to the external connection electrode terminals 306e of the third semiconductor element 306. However, the third semiconductor element 306 is effectively supported with two bumps.

By using such an electrode terminal configuration, with a wire bonding method as to the external connection electrode terminal 302e of the first semiconductor element 302, either a normal wire bonding method wherein a ball which is the leading end of the bonding wire is connected (see FIG. 21B), or a reverse bonding method wherein the trailing end of the bonding wire is connected (see FIG. 21C), may be selected and employed.

Also with such a form, in the event of placing bumps in layers on the external connection electrode terminals 302e of the first semiconductor element 302, there is no bonding wire between the bumps, so the connection between the bumps are further strengthened, and the height of the layered bumps can be readily determined.

Note that with the third embodiment, the first semiconductor element 302 and third semiconductor element 306 are disposed in the same direction in a layered manner, and the second semiconductor element 304 which is disposed therebetween is placed in a difference direction from these semiconductor elements, i.e. so as to intersect with the first semiconductor element 302 and third semiconductor element 306.

However, in order to fulfill the function required as a semiconductor device, there may be cases wherein the layered placement configuration differs from the embodiments described above.

Figure 22A:
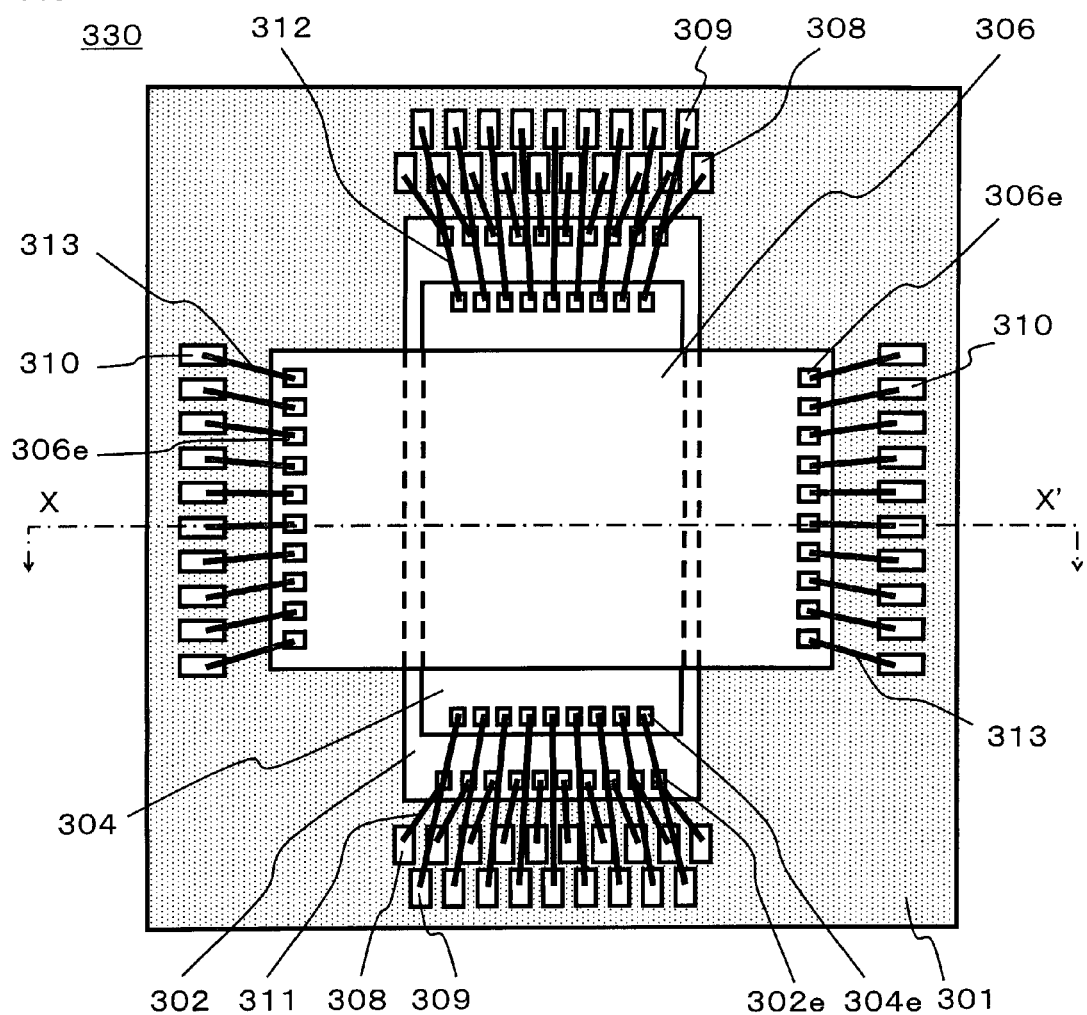
FIGS. 22A and 22B are a diagram illustrating a modified example of the semiconductor device according to the third embodiment.
Figure 22B:
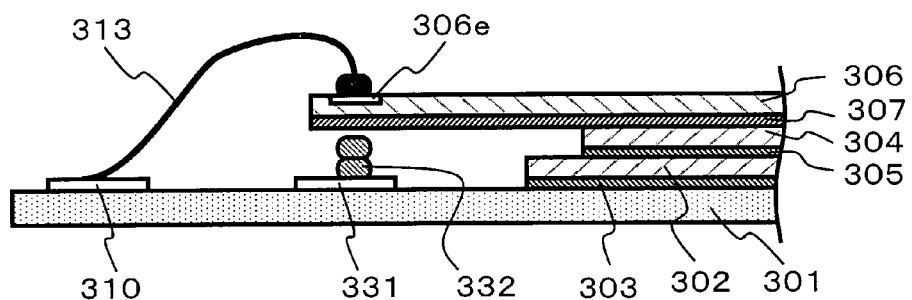

That is to say, there may be cases, such as shown with the semiconductor device 330 shown in FIGS. 22A and 22B for example, wherein the first semiconductor element 302 is mounted on the wiring board 301 in a so-called face-up state via the adhesive layer 303, the second semiconductor element 304 is mounted on the first semiconductor element 302 in the same direction as the first semiconductor element 301 (Y direction) and in a face-up state via the adhesive layer 305, and on the other hand, the third semiconductor element 306 is mounted on the second semiconductor element 304 in a direction different from the second semiconductor element 304 (X direction) in a face-up state via the adhesive layer 307.

The first semiconductor element 302 here has a rectangular shape, and is mounted on the wiring board 301 in one direction (Y direction).

Also, the second semiconductor element 304 also has a rectangular shape, and is mounted on the first semiconductor element 302 in the same direction as the first semiconductor element 302 (Y direction). However, the external dimensions thereof are smaller than that of the first semiconductor element 302, so the various external connection terminals are not in a positional relation so as to be layered.

The third semiconductor element 306 has a rectangular shape, and is mounted on the second semiconductor element 304 so as to extend (protrude) past the width of the second semiconductor element 304 in the X direction in wing form (cantilever form). Therefore, the extended (protruding) portion of the third semiconductor element 306 and the supporting board 301 are separated at the side portions of the second semiconductor element 304.

That is to say, the third semiconductor element 306 is disposed so as to be in a state intersecting with the layered structure of the first and second semiconductor elements so as to be mutually orthogonal, in a layered manner.

The first semiconductor element 302 and second semiconductor element 304 are positioned between the wiring board 301 and third semiconductor element 306 to form an intermediate member.

With such a configuration, plural external connection electrode terminals 302e of the first semiconductor element 302 are each placed along two sides which differ from the two extending sides of the third semiconductor element 306.

That is to say, plural external connection electrode terminals 304e of the second semiconductor element 304 are also each placed along two sides which differ from the two extending sides of the third semiconductor element 306.

That is to say, the external connection electrode terminal array of the first semiconductor element 302 and the external connection electrode terminal array of the second semiconductor element 304 are positioned so as to be mutually parallel.

On the other hand, plural external connection electrode terminals 306e of the third semiconductor element 306 are placed along the sides of the edge portion of the extending portions from the second semiconductor element 304.

Plural electrode terminals 308 corresponding to the external connection electrode terminals 302e of the first semiconductor element 302 are placed in an array on the main face of the wiring board 301, and plural electrode terminals 309 corresponding to the external connection electrode terminals 304e of the second semiconductor element 304 are placed in an array so as to be parallel with the electrode terminal 308 array corresponding to the third semiconductor element 302.

Further, plural electrode terminals 310 are placed in an array corresponding to the external connection electrode terminals 306e of the third semiconductor element 306.

The external connection electrode terminal 302e of the first semiconductor element 302 and the electrode terminals 308 of the wiring board 301 are connected with a bonding wire 311, and the external connection electrode terminals 304*e* of the second semiconductor element 304 and the electrode terminal 309 on the wiring board 301 are connected with a bonding wire 312.

Also, the external connection electrode terminal 306*e* of the third semiconductor element 306 and the electrode terminal 310 of the wiring board 301 are connected with a bonding wire 313.

As a featured configuration for such an embodiment, a long shaped conductive pattern 331 is placed along the short side of the third semiconductor element 306 on the surface of the writing board 301 which is positioned directly below the electrode terminal 306*e* of the third semiconductor element 306 which extends (protrudes) past the width of the second semiconductor element 304 in the X direction in wing form (cantilever form), and plural bumps 332 are placed on the conductive pattern 331 so as to be positioned roughly directly below the electrode terminals 306*e* of the third semiconductor element 306.

The bumps 332 have two bump layered configurations.

With such a semiconductor device, in the event of connecting the portion of the third semiconductor element 306 mounted on the second semiconductor element 304 which is separated from the wiring board 301, i.e. the external connection electrode terminal 306*e* positioned at the extended portion from the second semiconductor element 304, as to the bonding wire 313, the portion of the third semiconductor element 306 to be subjected to wire bonding is mechanically supported by the bumps 332 placed on a conductive pattern 331 on the wiring board 301.

Accordingly, the bending of the third semiconductor element 306 is suppressed, and damage thereof is prevented.

Also, pressure from the bonding capillary is effectively applied, and the bonding wire 313 is connected to the external connection electrode terminal 306*e* of the third semiconductor element 306 in a sure manner.

(Fourth Embodiment)

As described above, in the event of mounting/placing multiple semiconductor elements in layers on a wiring board, there may be cases wherein a so-called spacer member is placed between the semiconductor elements to form a layered configuration.

Figure 23A:
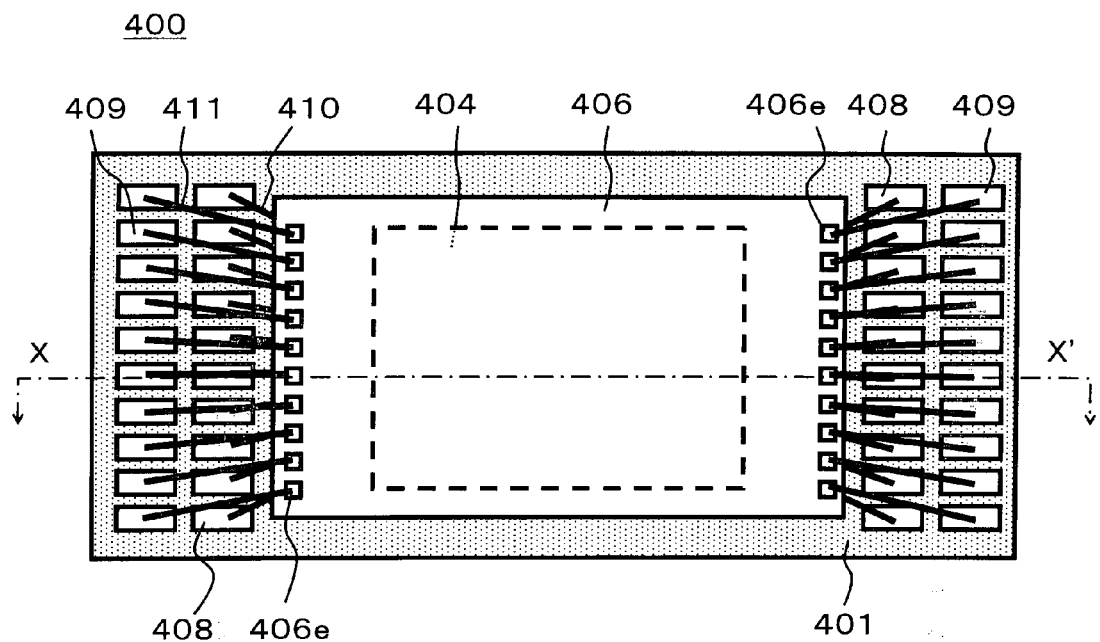
FIGS. 23A and 23B are a diagram illustrating a semiconductor device according to a fourth embodiment.
Figure 23B:
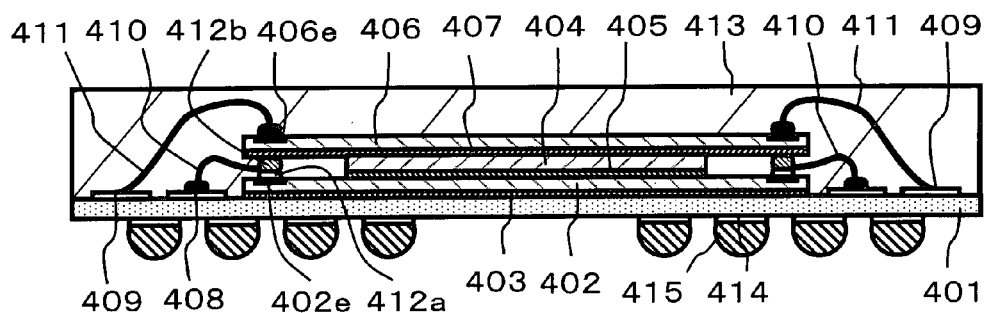

The semiconductor device configuration including the mounting state of the semiconductor element formed by employing such spacer member is shown in FIGS. 23A and 23B, as a fourth embodiment of the semiconductor device.

FIG. 23A shows a flat surface of the semiconductor device 400 according to the fourth embodiment, and FIG. 23B shows an X-X' cross-section of FIG. 23A. Note that in FIG. 23A, display of a resin sealing portion is omitted, and the external form thereof is shown with a solid line.

That is to say, with a semiconductor device 400, a first semiconductor element 402 is mounted on a wiring board 401 which is a supporting base, in a so-called face-up state via an adhesive layer 403, and a spacer 404 is mounted on the first semiconductor element 402 via an adhesive layer 405.

A second semiconductor element 406 is mounted on the spacer 404 in a face-up state via an adhesive layer 407.

The first semiconductor element 402 has a rectangular shape, and is mounted in one direction (X direction) on the wiring board 401.

Also, the second semiconductor element 406 also has a rectangular shape, and is mounted on the spacer 404 in the same one direction (X direction) as the first semiconductor element 402, and is positioned directly above the first semiconductor element 402.

The spacer 404 is positioned between the first semiconductor element 402 and the second semiconductor element 406 to form an intermediate member.

The spacer 404 has a smaller planar shape and area than the second semiconductor element 406 placed thereupon.

As a spacer 404, a material having the same thermal expansion coefficient as the semiconductor element, e.g., a plate-shaped silicone (Si) piece may be used.

Also, the external connection electrode terminals 406*e* of the second semiconductor element 406 are positioned roughly directly above the external connection electrode terminals 402*e* of the first semiconductor element 402.

On the other hand, on the main face of the wiring board 401, plural electrode terminals 408 are placed corresponding to the external connection electrode terminals 402*e* of the first semiconductor element 402, and plural electrode terminals 409 are placed corresponding to the external connection electrode terminals 406*e* of the second semiconductor element 406 so as to be parallel to the array of electrode terminals 408 which correspond to the first semiconductor element 402.

The external connection electrode terminal 402*e* of the first semiconductor element 402 and the electrode terminal 408 on the wiring board 401 are connected with a bonding wire 410, and the external connection electrode terminal 406*e* of the second semiconductor element 406 and the electrode terminal 409 on the wiring board 401 are connected with a bonding wire 411.

As a featured configuration with the present embodiment, a bump 412*a* is placed on the external connection electrode terminal 402*e* of the first semiconductor element 402, and a bump 412*b* is placed on the trailing end of the bonding wire 410 which is connected to the bump 412*a* with the reverse bonding method.

Thus, the bump 412 which is a convex-shaped member is a layered structure (multi-step bump), and is positioned roughly directly below the external connection electrode terminal 406*e* of the second semiconductor element 406.

As a method to form the bump configuration which is placed on the external connection electrode terminal 402*e* of the first semiconductor element 402, a method shown in FIGS. 15D through 16D, for example, can be employed.

A sealing resin 413 coats one main face of the wiring board 401 so as to cover the semiconductor element 402, semiconductor element 406, and bonding wires 410 and 411, and so forth.

Further, an external connection terminal 415 made up of a solder ball (solder bump) is placed on the electrode terminal 414 arranged in grid form, on the other main face of the wiring board 401.

With such a semiconductor device 400, in the event of connecting the portion of the second semiconductor element 406 mounted on the spacer 404 which is separated from the first semiconductor element 402, i.e. the external connection electrode terminal 406*e* positioned at the extended portion from the spacer 404, with the bonding wire 411, the portion of the second semiconductor element 406 to be subjected to wire bonding is mechanically supported by the bumps 412 placed on the external connection electrode terminals 402*e* of the first semiconductor element 402, whereby bending of the second semiconductor element 406 is suppressed, and damage thereof is prevented.

Also, pressure from the bonding capillary is effectively applied, and the bonding wire 411 is connected to the external connection electrode terminal 406*e* of the second semiconductor element 406 in a sure manner.

Thus, with the semiconductor element layered configuration formed by using the spacer 404, the first semiconductor element 402 mounted on the wiring board 401 is mounted in the case of having a smaller surface area than the second semiconductor element 406 which is mounted on the first semiconductor element 402 via the spacer 404, or in a state whereby the second semiconductor element 406 extends in one of the directions from the first semiconductor element 402.

In such a case, a placement configuration of the electrode terminal 408 on the wiring board 401 which is connected to the external connection electrode terminal 402*e* of the first semiconductor element 402 via the bonding wire 410, and a placement configuration of the bump 412 which is placed so as to be positioned roughly directly below the external connection electrode terminal 406*e* of the second semiconductor element 406, can be selected.

That is to say, with the layered configuration of the first semiconductor element 402 and second semiconductor element 406 via the spacer 404, in the case that the extended amount (length) from the edge portion of the first semiconductor element 402 of the second semiconductor element 406 is relatively small (short), with the electrode terminal 408 on the wiring board 401 connected to the bonding wire 410 led from the external connection electrode terminal 402*e* of the first semiconductor element 402, a configuration can be made wherein the trailing end of the bonding wire 410 is placed below the bumps 412 placed in layers.

Figure 24A:
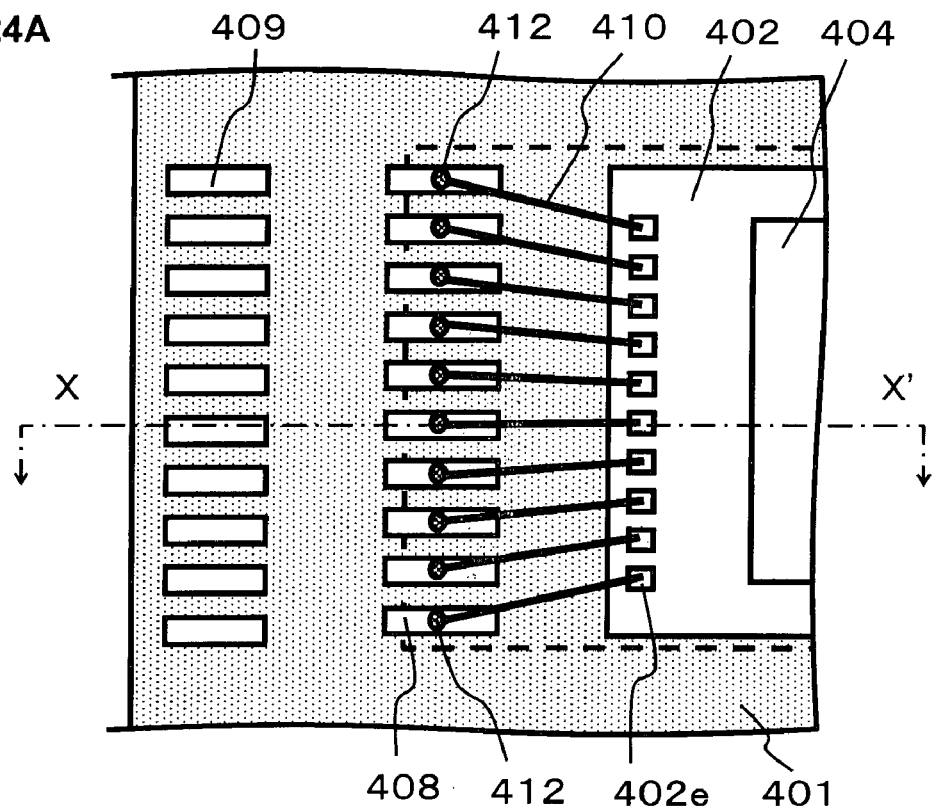
FIGS. 24A and 24B are a diagram illustrating a first disposal state of bumps of the semiconductor device according to the fourth embodiment.
Figure 24B:
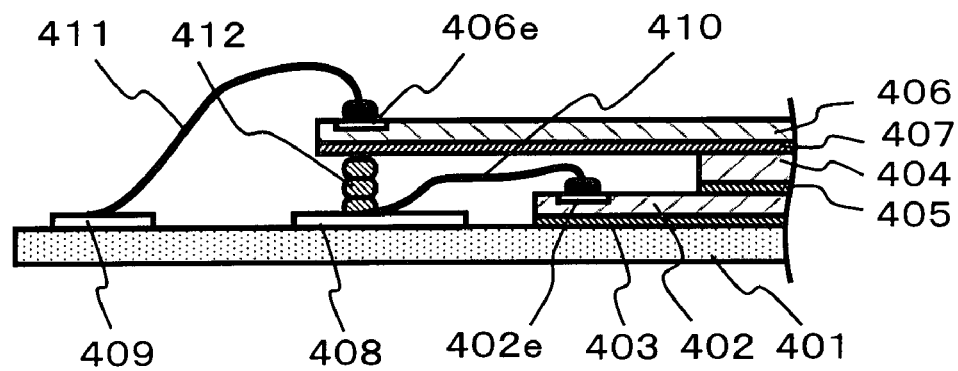

Such a configuration is shown in FIGS. 24A and 24B. Note that FIG. 24B shows an X-X' cross-section of FIG. 24A.

At this time, the number of layers of the bump 412 is selected according to the height deemed necessary.

According to such a configuration, in the case of connection of the bonding wire 411 to the external connection electrode terminal 406*e* of the second semiconductor element 406, because of the existence of the bumps 412, damage to the second semiconductor element 406 is prevented, which wire bonding is performed with high reliability as to the external connection electrode terminal 406*e* of the second semiconductor element 406.

On the other hand, in the case that the extended amount (length) of the second semiconductor element 406 from the edge portion of the first semiconductor element 402 is relatively great (long), the form configuration of the electrode terminal 408 on the wiring board 401 to which the bonding wire 410 led from the external connection electrode terminal 402*e* of the first semiconductor element 402 is connected needs to be modified as described below.

That is to say, it is necessary to suppress the marked increase in length of the bonding wire 410 and to prevent the increase in inductance.

In order to do so, the form of the electrode terminal 408 on the wiring board to which the bonding wire 410 led from the external connection electrode terminal 402*e* of the first semiconductor element 402 is connected has a long shape, and one edge portion thereof, i.e. an edge portion near the first semiconductor element side 402, becomes the region to be subjected to wire bonding, and the other edge portion becomes the placement portion for the bump 412.

Figure 25A:
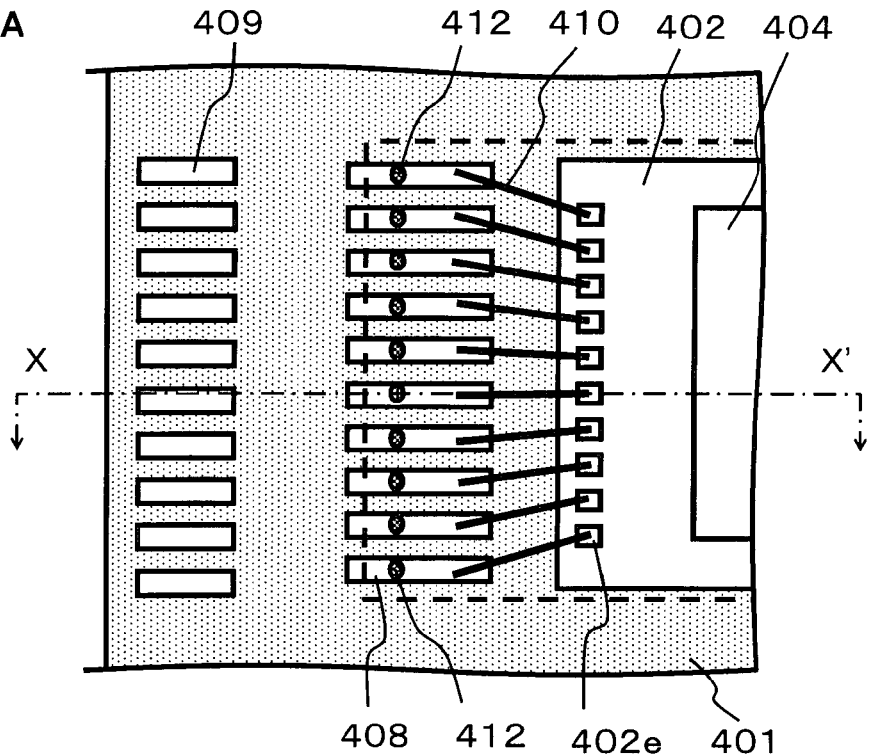
FIGS. 25A and 25B are a diagram illustrating a second disposal state of bumps of the semiconductor device according to the fourth embodiment.
Figure 25B:
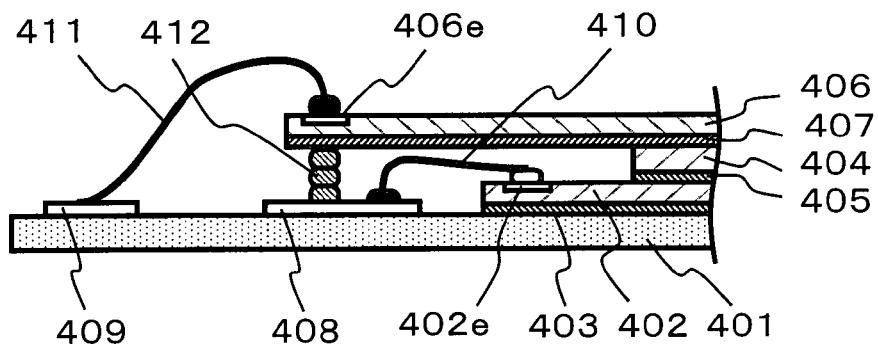

Such a configuration is shown in FIG. 25A and 25B. Note that FIG. 25B shows an X-X' cross-section of FIG. 25A.

According to such an electrode terminal configuration on the wiring board 401, increase to the actual length of the bonding wire 410 led from the external connection electrode terminal 402*e* of the first semiconductor element 402 is not invited, and so the inductance of the bonding wire 410 is not increased.

Also, with such means, the electrode terminal 408 on the wiring board to which the bonding wire 410 led from the external connection electrode terminal 402*e* of the first semiconductor element 402 is connected, and the conductive pattern 421 wherein the multi-step bump 412 is placed, may be separated.

Figure 26A:
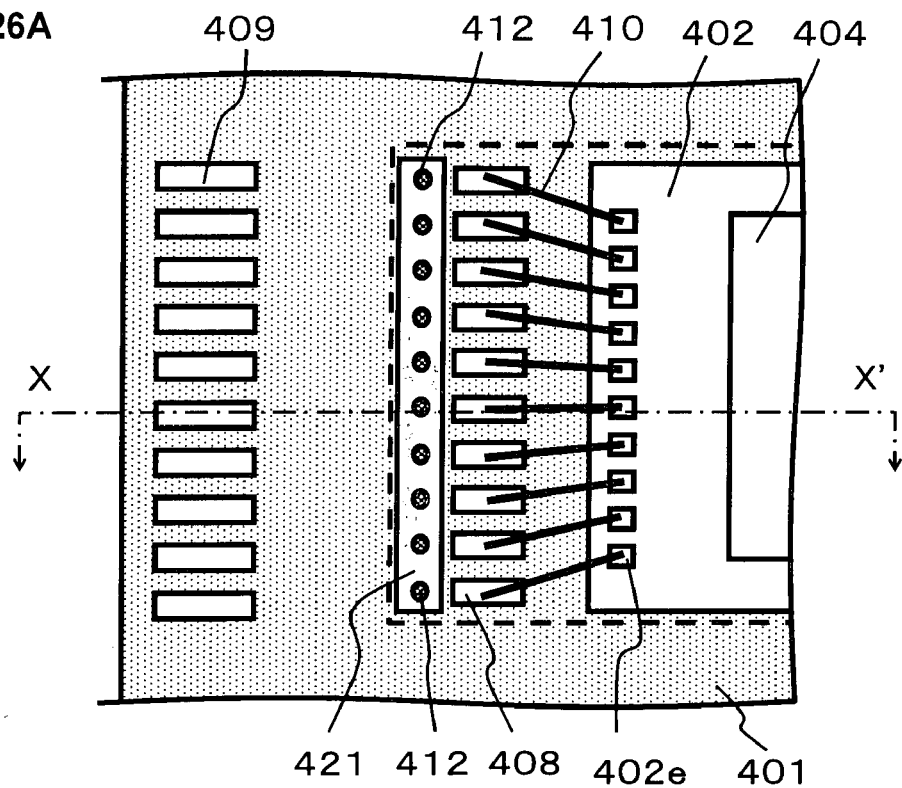
FIGS. 26A and 26B are a diagram illustrating a third disposal state of bumps of the semiconductor device according to the fourth embodiment.
Figure 26B:
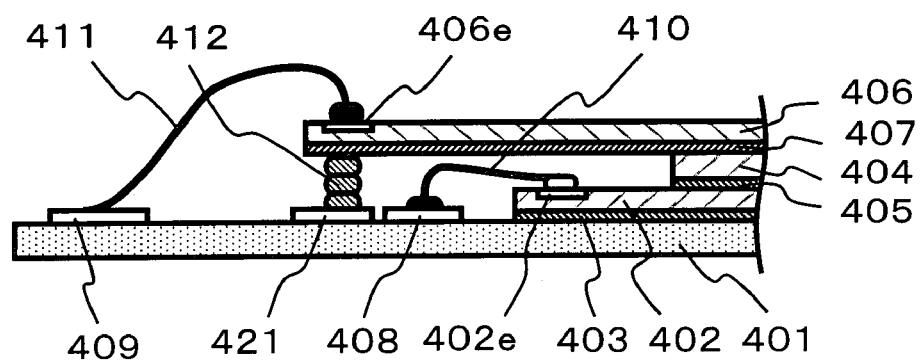

Such a configuration is shown in FIGS. 26A and 26B. Note that FIG. 26B shows an X-X' cross-section of FIG. 26A.

The conductive pattern 421 has a long shape along the electrode terminal array on the wiring board array 401, and bumps 412 are placed on the surface thereof, corresponding to the external connection electrode terminals 406*e* of the second semiconductor element 406.

With such a disposal configuration of the electrode terminal and conductive layers on the wiring board 401 also, increase to the actual length of the bonding wire 410 led from the external connection electrode terminal 402*e* of the first semiconductor element 402 is not invited, and so the inductance of the bonding wire 410 is not increased.

On the other hand, in the case that suppressing the inductance of the bonding wire 410 led from the external connection electrode terminal 402*e* of the first semiconductor element 402 is not deemed necessary but simplification of the bump placement process is deemed necessary, the electrode terminal array to which the bonding wire 410 led from the external connection electrode terminal 402*e* of the first semiconductor element 402 is connected may be disposed on the side further on the outside than the extended edge portion of the second semiconductor element 406, and the placement portion 422 of the bump 412 may be disposed corresponding to the corner portions of the extended portion of the second semiconductor element 406.

Figure 27A:
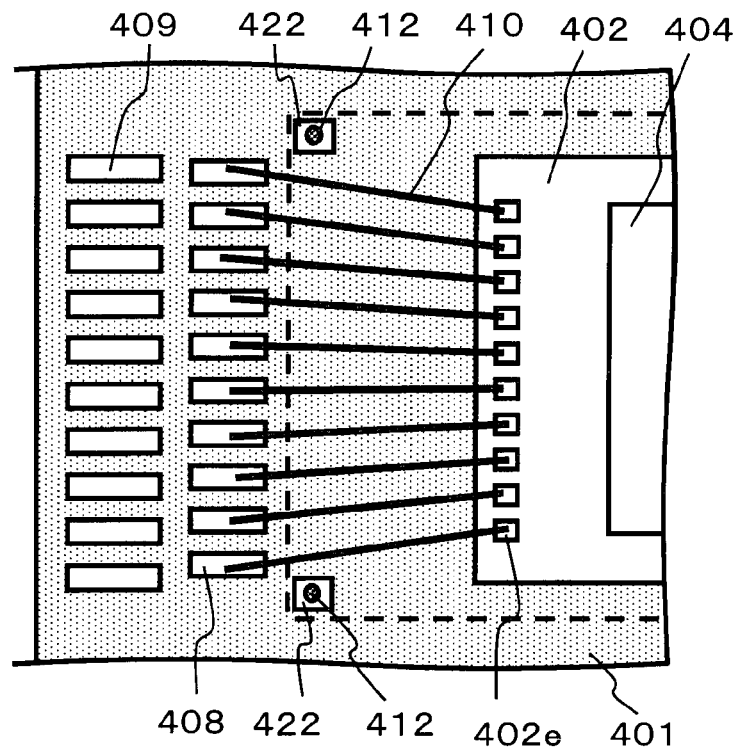
FIGS. 27A and 27B are a diagram illustrating a fourth disposal state of bumps of the semiconductor device according to the fourth embodiment.
Figure 27B:
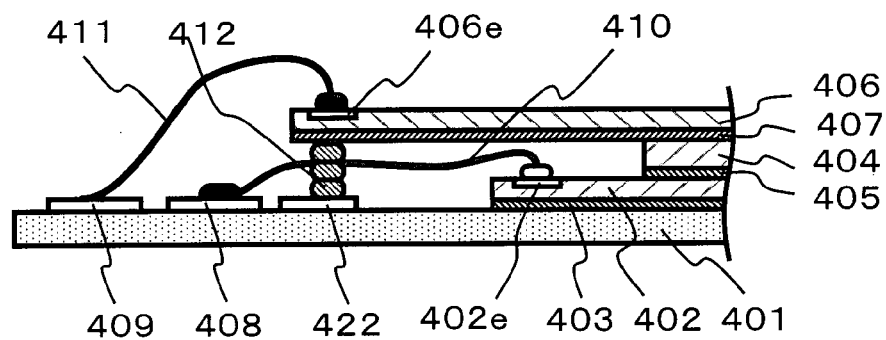

Such a configuration is shown in FIGS. 27A and 27B. Note that FIG. 27B shows an X-X' cross-section of FIG. 27A.

According to the electrode terminal configuration on the wiring board 401, the placement process of the bumps 412 is simplified, thereby enabling reduced manufacturing cost of the semiconductor device 400.

(Fifth Embodiment)

A fifth embodiment of the semiconductor device will be described with reference to FIGS. 28 through 31.

The semiconductor device according to the fifth embodiment is a resin sealing type semiconductor device which is formed by using a so-called lead frame.

The semiconductor device according to the fifth embodiment comprises a first semiconductor element which is mounted on a die stage formed from the lead frame structure in a face-up state, and wherein an electrode terminal pad thereof is connected to an inner lead with the wire bonding method, and a second semiconductor element which is mounted on a spacer placed on the first semiconductor element in a face-up state on the spacer, and wherein an electrode terminal pad thereof is connected to an inner lead with the wire bonding method.

With such a configuration, the first and second semiconductor elements are semiconductor elements having similar functions such as a semiconductor storage element (semiconductor memory), and the electrode terminals connected to a shared signal terminal or power source terminal are connected to the same inner lead.

Also, the spacer has a smaller planar form and area than the second semiconductor element.

Figure 28A:
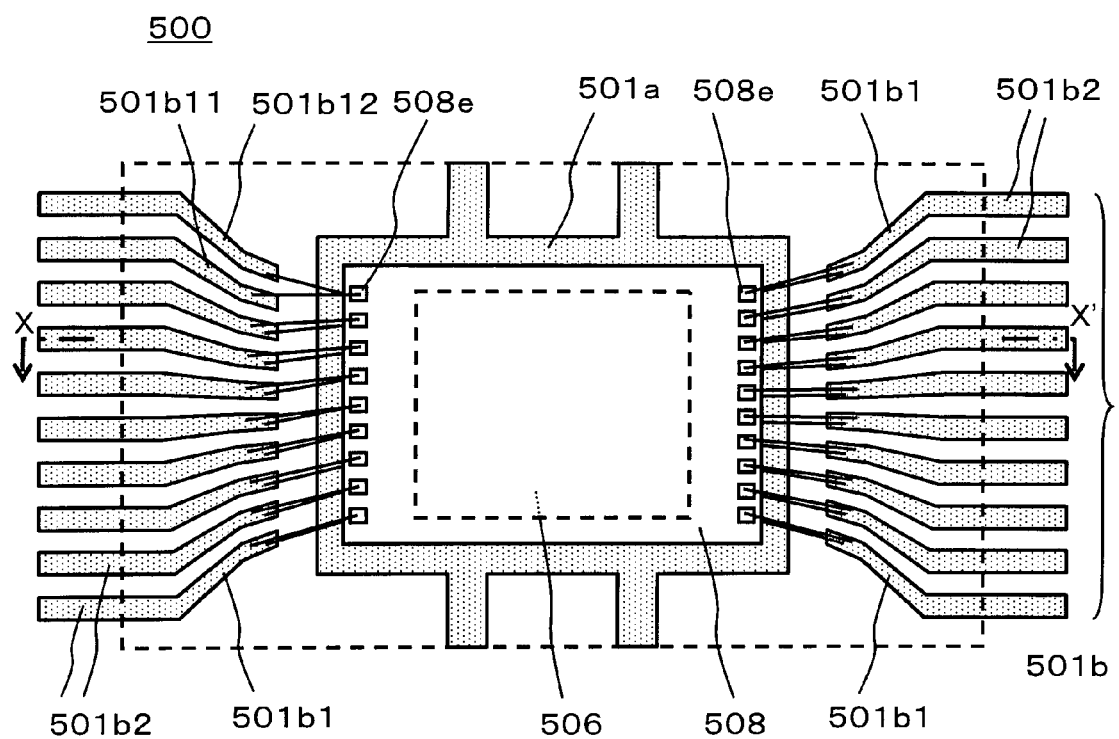
FIGS. 28A and 28B are a diagram illustrating a semiconductor device according to a fifth embodiment.
Figure 28B:
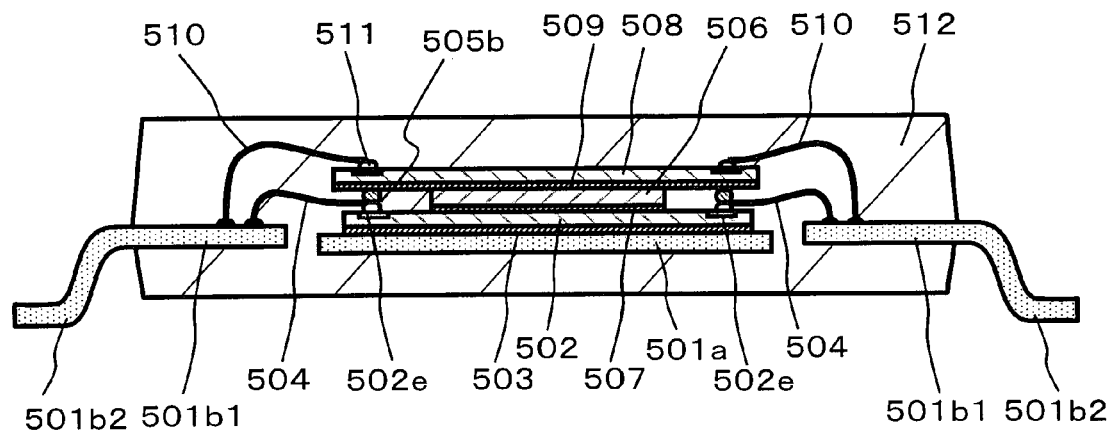

A semiconductor device 500 according to the present embodiment is shown in FIGS. 28A to 28B.

FIG. 28A shows a plan view of the semiconductor device 500, and FIG. 28B shows an X-X' cross-section of FIG. 28A. Note that in FIG. 28A, display of a resin sealing portion is omitted, and the external form thereof is shown with a dotted line.

The semiconductor device 500 is a semiconductor device of a so-called TSOP (Thin Small Outline Package) type.

That is to say, the semiconductor device 500 comprises a die stage 501a formed from the so-called lead frame structure and plural leads 501b placed in the periphery of the die stage 501a.

The leads 501b here are placed along two facing sides of the die stage 501a having a roughly rectangular shape.

A first semiconductor element 502 is mounted/affixed to the die stage 501a with an adhesive layer 503.

An external connection electrode terminal 502e of the first semiconductor element 502 and an inner lead portion 501b1 of the lead 501b is connected with a bonding wire 504.

Now, the leading end of the bonding wire 504 is connected to the inner lead portion 501b1 of the lead 501b, and the trailing end thereof is connected to a bump 505 placed on the external connection electrode terminal 502e of the first semiconductor element 502.

The bump 505 has a layered (stacked) configuration comprising a bump 505a which is placed on the external connection electrode terminal 502e and is connected to the trailing end of the bonding wire 504, and a bump 505b which is placed on the bump 505a, as will be described later.

Also, a spacer 506 made up of a material having a similar thermal expansion coefficient as the semiconductor element, e.g. a chip-type silicone piece, is affixed to the roughly central portion of the upper face of the first semiconductor element 502 (electronic circuit forming face) with an adhesive layer 507.

A second semiconductor element 508 is mounted/affixed on the spacer 506 with an adhesive layer 509.

The spacer 506 is positioned between the first semiconductor element 502 and second semiconductor element 508 to form an intermediate member.

With such a configuration, the second semiconductor element 508 has a planar shape larger than the spacer 506, and the space between the first semiconductor element 502 is separated in the periphery of the spacer 506.

The external connection electrode terminal 508e of the second semiconductor element 508 and the inner lead portion 501b1 of the lead 501b is connected with a bonding wire 510.

A reverse bonding method is employed here, wherein the leading end of the bonding wire 510 is connected to the inner lead portion 501b1 of the lead 501b, and the trailing end thereof is connected to a bump 511 placed on the external connection electrode terminal 508e of the second semiconductor element 508.

Note that in the case that the first semiconductor element 502 and second semiconductor element 508 are semiconductor storage devices having the same terminal configuration, a specified electrode terminal (e.g. address A1) of the first semiconductor element 502 and a specified electrode terminal (e.g. address A1) of the second semiconductor element 508 corresponding thereto are connected in common to one inner lead portion 501b1 by bonding wires.

Other address terminals and data terminals are also similarly connected to a shared corresponding lead 501b for each corresponding terminal.

However, a chip select terminal of the first semiconductor element 502 and second semiconductor element 508 are connected to an inner lead portion 501b11 and 501b12, each of which differ, of the lead 501b.

With such a configuration, a bump 505a is placed on the external connection electrode terminal 502e of the first semiconductor element 502, as described above, and the trailing end of the bonding wire 504 is connected to the bump 505a. On the trailing end connecting portion of the bonding wire 504, another bump 505b is placed, which is a bump 505 having a layered (vertical integration) configuration.

Thus, the height of the upper face of the bump 505 which is a convex-shaped member having a layered (vertical integration) configuration is in a position approximately the same as the height of the upper face of the spacer 506.

A sealing resin 512 is placed so as to coat the layered structures of the first semiconductor element 502 and second semiconductor element 508, the bonding wires 504 and 510, and a portion of the lead frame structure 501.

With the semiconductor element 500, a lead frame structure serving as a semiconductor element supporting member or the external connection terminal is employed, whereby manufacturing cost can be reduced as compared to a semiconductor device using a wiring board, solder ball electrodes, and so forth as with the semiconductor devices described in the first through fourth embodiments.

A manufacturing method of the semiconductor device 500 according to the fifth embodiment will be described with reference to FIGS. 29 through 31.

Figure 29A:
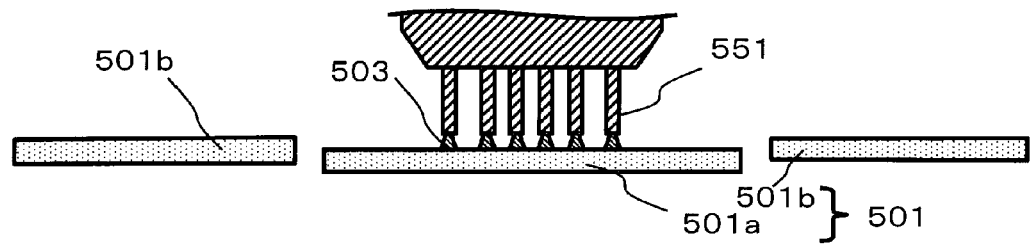
FIGS. 29A to 29E are a cross-sectional diagram illustrating a manufacturing process of the semiconductor device according to the fifth embodiment.

First, an adhesive 503 made of a material primarily comprising an epoxy-type resin or polymide-type resin is attached to the die stage 501a of the lead frame structure 501 via a nozzle 551 (see FIG. 29A).

The adhesive 503 may comprise particles made up of a conductive material such as silver (Ag), gold (Au), palladium (Pd), copper (Cu) and so forth.

Next, a first semiconductor element 502 to which the upper face thereof (electronic circuit forming face) is held with the vacuum collet 561, is pressed onto the adhesive 503 by the vacuum collet 561.

Figure 29B:
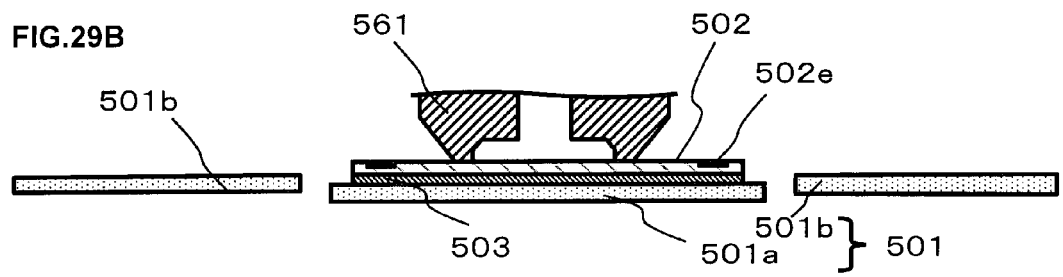

With such pressure, the adhesive 503 spreads out between the first semiconductor element 502 and die stage 501a, whereby the first semiconductor element 503 is mounted on the die stage 501a (see FIG. 29B).

Figure 29C:
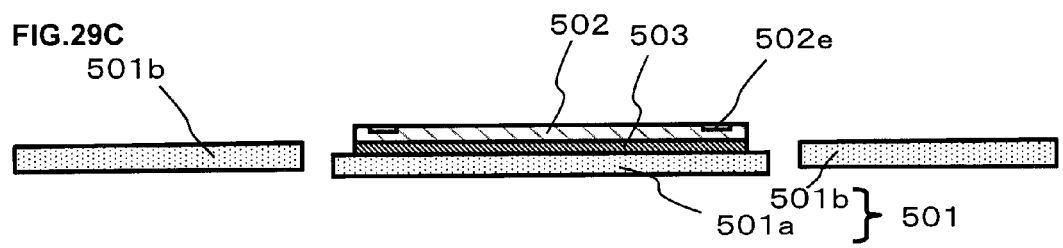

Next, with an oven, heater block or the like, for example, the adhesive 503 is hardened by heating to 150° C. to 200° C., whereby the first semiconductor element 502 is affixed to the die stage 501a (see FIG. 29C).

Next, the lead frame structure 501 is mounted on the die-bonder bonding stage (not shown) of a die bounder, which is heated to a predetermined temperature, e.g. 50° C. to 200° C., with a heater placed on the bonding stage.

Figure 29D:
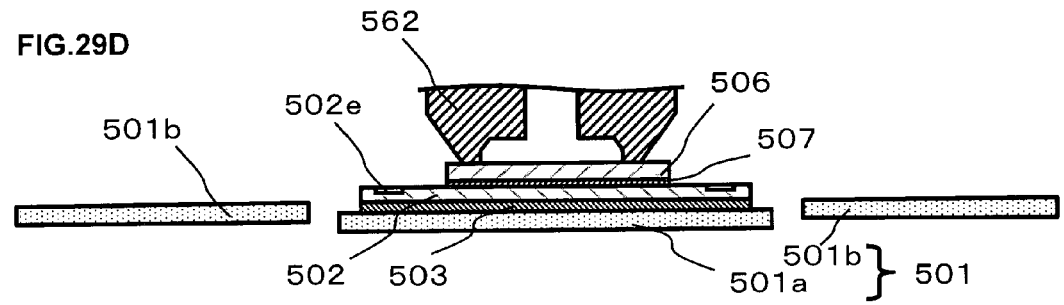

The spacer 506 adsorbed/held by the vacuum collet 562 is placed/affixed to the roughly central portion of the upper face of the first semiconductor element 502 (electronic circuit forming face) (see FIG. 29D).

The spacer 506 is made up of a silicone (Si) piece, and the face subject to affixing is coated with an adhesive layer beforehand.

Next, the lead frame structure 501 is mounted on the wire bonder bonding stage (not shown) of a wire bounder, which is heated to a predetermined temperature, e.g. 150° C. to 300° C., with a heater placed on the bonding stage.

Figure 29E:
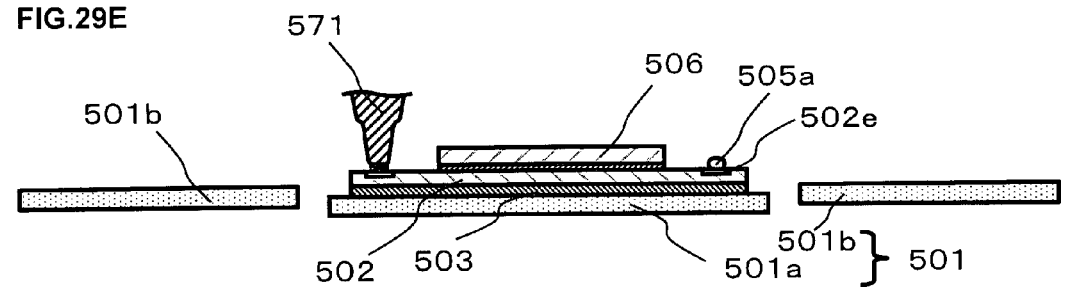

A bump 505a is placed on each of the external connection electrode terminals 502e of the first semiconductor element 502 (see FIG. 29E).

The bump 505a can be formed with a so-called ball bonding method using a bonding capillary 571.

Next, the external connection electrode terminal 502e of the first semiconductor element 502 and the lead 501b of the corresponding lead frame structure 501 are connected with the bonding wire 504, using the bonding capillary 581 (see FIG. 30A).

The bonding wire 504 has the leading end thereof connected to the inner lead portion 501b1 of the lead 501b, and the trailing end thereof is connected to the bump 505a placed on the external connection electrode terminal 502e of the first semiconductor element 502.

Next, a bump 505b is placed on the bump 505a to which the trailing end of the bonding wire 504 is connected, using a bonding capillary 571 (see FIG. 30B).

That is to say, the bump 505a and bump 505b are placed on the external connection electrode terminal 502e of the first semiconductor element 502, in a layered (vertically integrated) state.

The height of the upper face of the bump 505 in the layered (vertically integrated) state is roughly the same as the height of the upper face of the spacer 506.

After this, the lead frame structure 501 is mounted on the die-bonder bonding stage (not shown) of the die-bounder, which is heated to a predetermined temperature, e.g. 50° C. to 200° C., with a heater placed on the bonding stage.

The second semiconductor element 508 of which the upper face (electronic circuit forming face) is held by the vacuum collet 563 is disposed on the spacer 506, and pressure applied.

An adhesive 509 is attached to the back face of the second semiconductor element 508, whereby the second semiconductor element 508 is affixed to the spacer 506 (see FIG. 30C).

At this time, the second semiconductor element 508 has the external connection electrode terminal 508e thereof positioned roughly directly above the bump 505 formed as a layered (vertically integrated) structure, and affixed thereto.

Note that in the case of placing the adhesive layer 509 on the entire face of the back face of the second semiconductor element 508, the bump 505 and the back face of the second semiconductor element 508 may be affixed via the adhesive layer 509.

Next, a bump 511 is placed on each of the external connection electrode terminals 508e of the second semiconductor element 508, with the so-called ball bonding method using the bonding capillary 571 (see FIG. 30D).

In the event of placing the bump 511, the portion of the second semiconductor element 508 to be subjected to bonding is mechanically supported with the bump 505, and bending of the second semiconductor element 508 is suppressed, thereby preventing damage thereto.

Also, pressure is effectively applied, and the bump 511 is connected/placed on the external connection electrode terminal 508e of the second semiconductor element 508 in a sure manner.

That is to say, the bump 505 positioned above the external connection electrode terminal 502e of the first semiconductor element 502 is positioned roughly directly below the external connection electrode terminal 508e of the second semiconductor element 508, thereby resisting pressure in the case of placing the bump 511 as to the external connection electrode terminal 508e of the second semiconductor element 508.

Next, the external connection electrode terminal 508e of the second semiconductor element 508 and the lead 501b of the corresponding lead frame structure 501 is connected with the bonding wire 510 using the bonding capillary 581 (see FIG. 30E).

The bonding wire 510 has the leading end thereof connected to the inner lead portion 501b1 of the lead 501b, and the trailing end thereof is connected to the bump 511 placed on the external connection electrode terminal 508e of the second semiconductor element 508.

In the case of connecting the trailing end of the bonding wire 510, the portion of the second semiconductor element 508 to be subjected to bonding is mechanically supported with the bump 505, thereby preventing damage to the second semiconductor element 508.

Also, the pressure is effectively applied, and the trailing end of the bonding wire 510 is connected to the external connection electrode terminal 508e of the second semiconductor element 508 in a sure manner.

That is to say, the bump 505 positioned above the external connection electrode terminal 502e of the first semiconductor element 502 is positioned roughly directly below the external connection electrode terminal 508e of the second semiconductor element 508, thereby resisting pressure in the case of connecting the trailing end of the bonding wire 510 as to the external connection electrode terminal 508e of the second semiconductor element 508.

Figure 31A:
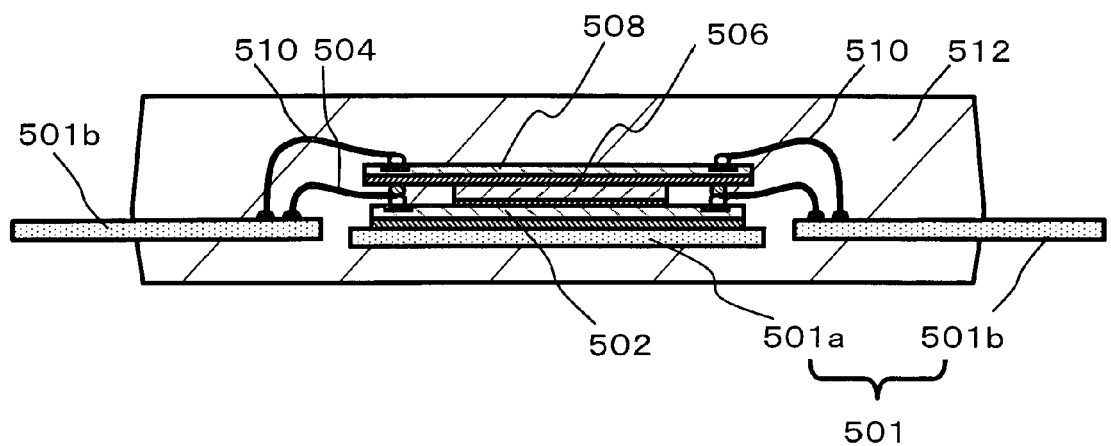
FIGS. 31A and 31B are a cross-sectional diagram illustrating a manufacturing process of the semiconductor device according to the fifth embodiment, and illustrate a manufacturing process which follows the manufacturing process illustrated in FIG. 30A to 30E.

The layered structure of the semiconductor element is coated with a sealing resin 512, along with the bonding wire and lead frame structure 501 (see FIG. 31A).

The resin coating can be performed by employing a known transfer mold method.

At this time, an outer lead portion 501b2 of the lead 501b is not coated with the sealing resin 512, but is exposed.

Figure 31B:
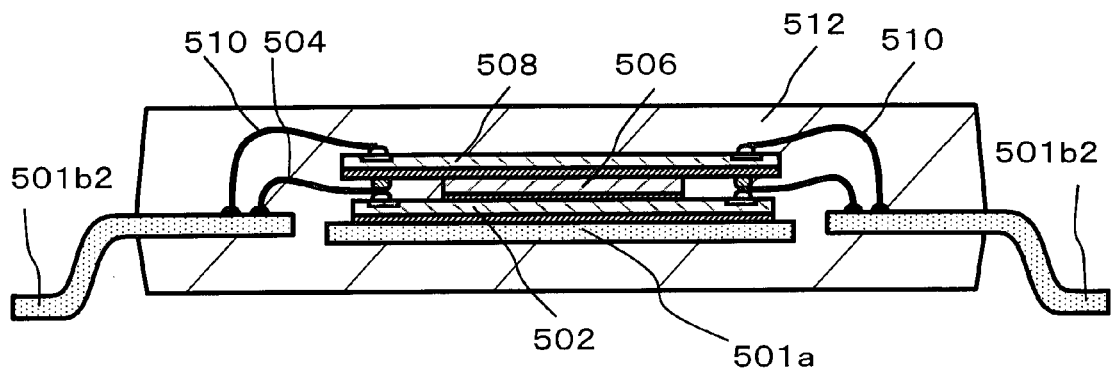

After performing soldering plating processing as to the outer lead portion 501b2, disconnecting/separating and bending processes of the lead frame structure 501 are performed, thus forming an individual semiconductor device 500 (see FIG. 31B).

The present invention can be applied to the TSOP type semiconductor device according to the present fifth embodiment, and also can be applied to a so-called SOJ (Small Out-line J-leaded Package) type semiconductor device which has a J-type external connection terminal, or a so-called QFP (Quad Flat Package) type semiconductor device wherein the external connections terminals are disposed in four directions.

The present invention is not to be limited to the configurations shown with the above-described embodiments, and various modifications may be made without departing from the scope and spirit of the present invention.

What is claimed is:
1. A semiconductor device comprising:
a supporting base whereupon a first electrode terminal and a first conductive pattern are placed;
an intermediate member mounted on the supporting base;
a semiconductor element, a portion thereof being supported with the intermediate member, and placed over the supporting base, the semiconductor element having an extension part from an end of the intermediate member, the extension part having a second electrode terminal and a second conductive pattern on one surface and having an adhesive layer on the other surface; and
a convex-shaped member made from a metal bump and placed on the first conductive pattern;
wherein the adhesive layer and the supporting base face each other, the convex-shaped member is between the first conductive pattern and the adhesive layer, a gap being defined between the convex-shaped member and the adhesive layer, and the first electrode terminal and the second electrode terminal are connected with a bonding wire.

2. The semiconductor device according to claim 1, wherein the intermediate member is another semiconductor element or a spacer member.

3. The semiconductor device according to claim 1, wherein the convex-shaped member is a metal bump and is formed with a ball bonding method.

4. The semiconductor device according to claim 2, wherein the convex-shaped member is a metal bump and is formed with a ball bonding method.

5. A semiconductor device comprising:
a supporting base whereupon a first electrode terminal and a first conductive pattern are placed;
a first semiconductor element mounted on the supporting base;
a second semiconductor element, a portion thereof being supported with the first semiconductor element, and placed over the supporting base, the second semiconductor element having an extension part from an end of the first semiconductor element, the extension part having a second electrode terminal and a second conductive pattern on one surface and having an adhesive layer on the other surface; and
a convex-shaped member made from a metal bump and placed on the first conductive pattern;
wherein the adhesive layer and the supporting base face each other, the convex-shaped member is between the first conductive pattern and the adhesive layer, a gap being defined between the convex-shaped member and the adhesive layer, and the first electrode terminal and the second electrode terminal are connected with a bonding wire.

6. The semiconductor device according to claim 5, wherein the convex-shaped member is a metal bump and is formed with a ball bonding method.

7. The semiconductor device according to claim 5, wherein the second semiconductor element extends from the first semiconductor element to the supporting base in cantilever form.

* * * * *